(12) United States Patent
Zhu et al.

(10) Patent No.: US 6,495,412 B1
(45) Date of Patent: Dec. 17, 2002

(54) SEMICONDUCTOR DEVICE HAVING A FERROELECTRIC CAPACITOR AND A FABRICATION PROCESS THEREOF

(75) Inventors: Sha Zhu, Kawasaki (JP); Hideyuki Noshiro, Kawasaki (JP); Kazuaki Takai, Kawasaki (JP); Hideaki Yamauchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/393,687

(22) Filed: Sep. 10, 1999

(30) Foreign Application Priority Data

Sep. 11, 1998 (JP) .......................... 10-258794
Sep. 18, 1998 (JP) .......................... 10-265139

(51) Int. Cl.[7] .......................... H01L 21/8242
(52) U.S. Cl. .................. 438/240; 438/239; 438/250; 438/393; 438/396; 438/253
(58) Field of Search .................. 438/3, 240; 257/295, 257/310, 239, 250, 253, 393, 396

(56) References Cited

U.S. PATENT DOCUMENTS

| 5,693,553 A | * 12/1997 | Kashihara et al. | 438/396 |
|---|---|---|---|
| 6,204,111 B1 | * 3/2001 | Uemoto et al. | 438/239 |
| 6,204,203 B1 | * 3/2001 | Narwankar et al. | 438/785 |
| 6,346,424 B1 | * 2/2002 | Schindler et al. | 438/3 |

FOREIGN PATENT DOCUMENTS

| JP | 04295013 B2 * | 10/1992 | H01B/3/00 |
|---|---|---|---|
| JP | 5-343345 | 12/1993 | |
| JP | 5-343642 | 12/1993 | |
| JP | 6-13565 | 1/1994 | |
| JP | 6-21391 | 1/1994 | |
| JP | 7-14986 | 1/1995 | |
| JP | 7-263570 | 10/1995 | |
| JP | 8-55967 | 2/1996 | |
| JP | 8-274270 | 10/1996 | |
| JP | 8-279599 | 10/1996 | |
| JP | 9-82909 | 3/1997 | |
| JP | 9-102591 | 4/1997 | |
| JP | 9-116115 | 5/1997 | |
| JP | 10-242404 | 9/1998 | |
| JP | 11-54713 | 2/1999 | |
| JP | 11-54721 | 2/1999 | |
| JP | 11-145412 | 5/1999 | |
| WO | WO 98/14993 | 4/1998 | |

OTHER PUBLICATIONS

Muralt, P., et al., J. Appl. Phys., Texture Control of $PbTiO_3$ and $Pb(Zr, Ti)O_3$ Thin Films With $TiO_2$ Seeding, vol. 83, No. 7, pp. 3835–3842, 1998.

Nakamura, T., et al., Jpn. J. Appl. Phys., Electrical Properties of Pb (Zr, Ti)$O_3$ Thin Film Capacitors on Pt and Ir Electrodes vol. 34 (1995), pp. 5184–5187.

Hase, T., et al., *Integrated Ferroelectrics*, 1995, Difference in Microstructure Between PZT Thin Films on Pt/TI and Those on Pt, vol. 8, pp. 89–98, OPA Amsterdam B.V.

U.S. Patent Application Serial No. 09/258,266 filed Feb. 26, 1999, by Ashida, et al., for Semiconductor Device and Method of Manufacturing the Same.

* cited by examiner

*Primary Examiner*—Stephen D. Meier
*Assistant Examiner*—Toniae M. Thomas
(74) *Attorney, Agent, or Firm*—Armstrong, Westerman & Hattori, LLP

(57) ABSTRACT

A semiconductor device having a ferroelectric capacitor is formed by the steps of forming a lower electrode on a substrate, applying a rapid thermal annealing process to the lower electrode, depositing, after the step of rapid thermal annealing process, a ferroelectric film on the lower electrode, crystallizing the ferroelectric film by applying a thermal annealing process to the ferroelectric film, and forming an upper electrode on the ferroelectric insulation film.

4 Claims, 44 Drawing Sheets

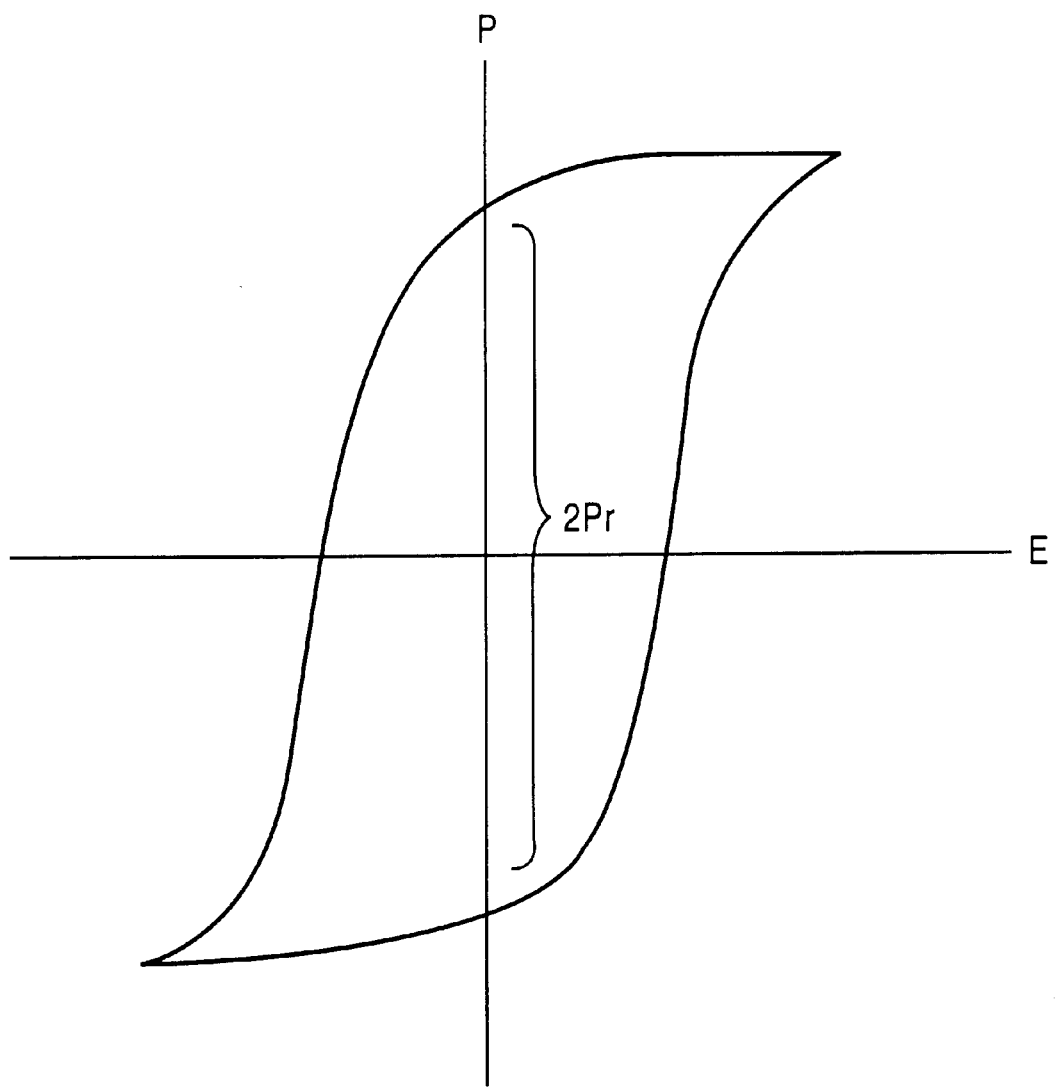

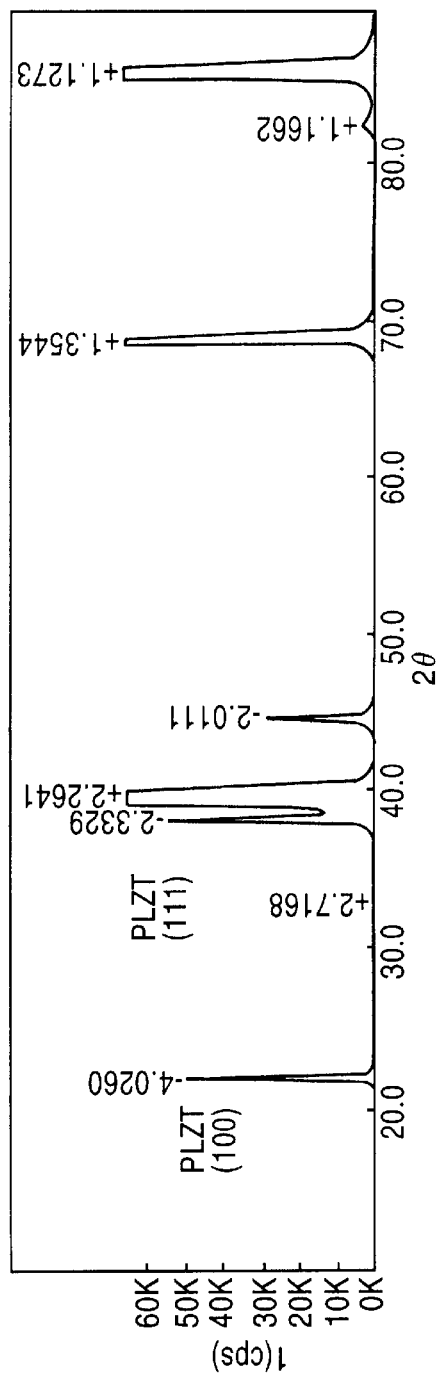
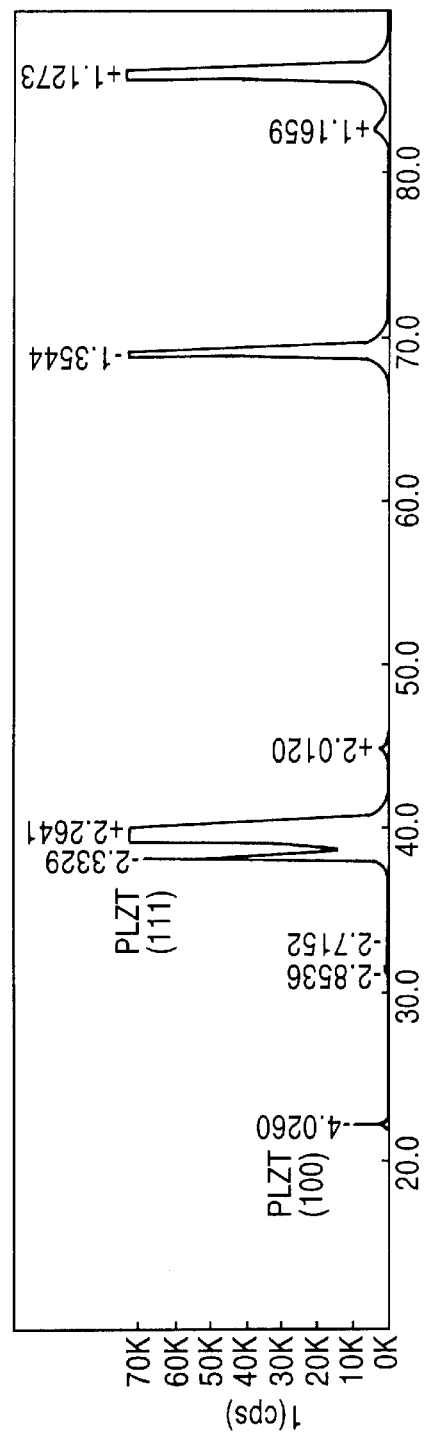
FIG.4A
FIG.4B

PZT
Pt

PZT
Pt

SEMICONDUCTOR DEVICE HAVING A FERROELECTRIC CAPACITOR AND A FABRICATION PROCESS THEREOF

BACKGROUND OF THE INVENTION

The present invention generally relates to semiconductor devices and more particularly to a semiconductor memory device that uses a ferroelectric film.

Semiconductor devices such as DRAMs and SRAMs are used extensively in various information processing apparatuses including computers as a high-speed main memory device. These conventional semiconductor devices, however, are volatile in nature and the information stored therein is lost when the electric power is turned off. Thus, it has been practiced in conventional computers and computer systems to use a magnetic disk device as a large capacity, auxiliary storage device for storing programs and data.

However, magnetic disk devices are bulky and fragile, and are inherently vulnerable to mechanical shocks. Further, magnetic disk devices generally have drawbacks of large electrical power consumption and low access speed.

In view of the problems noted above, there is an increasing tendency in computers and computer systems of using flash-memory devices for the non-volatile auxiliary storage device. A flash-memory device is a device having a construction similar to a MOS transistor and stores information in a floating gate in the form of electrical charges. It should be noted that flash-memory devices have a construction suitable for monolithic integration on a semiconductor chip in the form of an LSI. Thus, there are attempts to construct a large-capacity storage device comparable to a magnetic disk device by using a flash-memory.

In a flash-memory device, writing of information is achieved by tunneling of hot electrons through a tunneling insulation film into the floating gate electrode. Further, erasing of the information is achieved also by causing the electrons in the floating gate to tunnel to a source region or to a channel region through the tunneling insulation film. Thus, a flash-memory device has an inherent drawback in that it takes a substantial time for writing or erasing information. Further, a flash-memory device generally shows the problem of deterioration of the tunneling insulation film after a repeated writing and erasing operations. When the tunneling insulation film is deteriorated, the reading or erasing operation becomes unstable and unreliable. An EEPROM, having a similar construction to a flash-memory, has a similar problem.

In view of the various drawbacks of the foregoing conventional non-volatile semiconductor devices, there is a proposal of a ferroelectric semiconductor memory device designated hereinafter as FeRAM for the auxiliary memory device and further for the high-speed main memory device of a computer. A ferroelectric semiconductor memory device stores information in a ferroelectric capacitor insulation film in the form of spontaneous polarization.

A ferroelectric semiconductor memory device typically includes a memory cell transistor and a memory cell capacitor similarly to a DRAM, wherein the memory cell capacitor uses a ferroelectric material such as PZT (Pb(Zr,Ti)O$_3$) or PLZT ((Pb,La)(Zr,Ti)O$_3$) for the capacitor insulation film. Thus, the ferroelectric semiconductor memory device is suitable for monolithic integration to form an LSI.

As the ferroelectric semiconductor memory device carries out the writing of information by controlling the spontaneous polarization of the ferroelectric capacitor insulation film, the writing is achieved with a high speed, faster by a factor of 1000 or more than in the case of a flash-memory. As noted before, the writing of information is achieved in a flash-memory by injecting hot electrons into the floating gate through the tunneling insulation film. As the control of the polarization is achieved by applying a voltage, the power consumption is also reduced below about $\frac{1}{10}$ as compared with the case of a flash-memory. Further, the ferroelectric semiconductor memory device, lacking the tunneling insulation film, provides an increased lifetime of one hundred thousand times as large as the lifetime of a flash-memory device.

Currently, FeRAMs are fabricated according to the relatively easy design rule of about 1 μm. On the other hand, investigation is being made for increasing the tightness of the design rule so as to enable integration of the FeRAMs with other high-speed submicron devices such as CMOS logic devices on a common semiconductor chip.

FIG. 1 shows the construction of a conventional FeRAM 10.

Referring to FIG. 1, the FeRAM 10 includes a memory cell transistor constructed on a p-type Si substrate 11, on which an active region is defined by a field oxide film 12. On the Si substrate 11, there is provided a gate electrode 13 in correspondence to the foregoing active region, wherein the gate electrode 13 constitutes the word line of the FeRAM. Further, a gate oxide film not illustrated is interposed between the Si substrate 11 and the gate electrode 13, and diffusion regions 11A and 11B of the n$^+$-type are formed in the substrate 11 at both lateral sides of the gate electrode 13 as the source region and the drain region of the memory cell transistor. Thereby, a channel region is formed in the substrate 11 between the diffusion region 11A and the diffusion region 11B.

It should be noted that the gate electrode 13 is covered by a CVD oxide film 14 provided so as to cover the surface of the Si substrate 11 in correspondence to the active region, wherein the CVD oxide film 14 is covered by a planarizing interlayer insulation film 15. The interlayer insulation film 15 is formed with a contact hole 15A exposing the diffusion region 11B, and the contact hole 15A is filled by a conductive plug 16 of polysilicon or WSi.

Further, there is provided an adhesion layer 17 having a Ti/TiN structure on the interlayer insulation film 15 so as to cover the exposed part of the plug 16, and a lower electrode 18 of Pt is formed on the foregoing adhesion layer 17. The lower electrode 18 is covered by a ferroelectric capacitor insulation film 19 of PZT or PLZT, and an upper electrode of Pt is formed on the ferroelectric capacitor insulation film 19.

It should be noted that the lower electrode 18, ferroelectric capacitor insulation film 19 and the upper electrode 20 form together a ferroelectric capacitor defined by a side wall, wherein the side wall is covered by a CVD oxide film 21, and the ferroelectric capacitor as a whole is covered by another interlayer insulation film 22.

The interlayer insulation film 22 is formed with a contact hole 22A exposing the diffusion region 11A, and there is provided a bit line pattern 23 of Al or an Al-alloy on the interlayer insulation film 22 so as to make an electrical contact with the diffusion region 11A at the contact hole 22A.

FIG. 2 shows the hysteresis appearing in the polarization of a PLZT film constituting the foregoing ferroelectric capacitor insulation film 19.

Referring to FIG. 2, it will be noted that the PLZT film 19 experiences an inversion of polarization when a predetermined write voltage is applied between the lower electrode 18 and the upper electrode 20 such that a predetermined electric field is applied to the PLZT film 19. In other words, desired information is written into the PLZT film 19 in the form of binary data by applying the write voltage across the upper electrode 20 and the lower electrode 18. Further, the reading of the information thus written into the PLZT film 19 is achieved by detecting the conduction or no-conduction of the memory cell transistor, wherein such a detection is made by activating the foregoing word line, and hence the gate electrode 13, and further by detecting the voltage appearing at the bit line electrode 23.

Larger the value of the spontaneous polarization represented in FIG. 2 by 2Pr, the more the reliability of the retention of information in the PLZT film 19. Further, the magnitude of the electric field needed to cause a writing of information decreases with increasing value of 2Pr. In other words, increase of the spontaneous polarization 2Pr contributes to the decrease of the drive voltage of the FeRAM 10. Thus, there is a demand for increasing the value of the spontaneous polarization 2Pr in the FeRAM 10 of FIG. 1.

It should be noted that the semiconductor memory device of FIG. 1 can be used also for a DRAM. In this case, due to the very large relative dielectric constant of the ferroelectric capacitor insulation film 19, a sufficient capacitance is secured without using a complicated shape and process for forming the memory cell capacitor.

Meanwhile, it is known that the PZT or PLZT film constituting the ferroelectric capacitor insulation film 19 of FIG. 1 shows a columnar microstructure and that the value of the spontaneous polarization 2Pr is maximized when the crystal grains therein are oriented in the <111> direction.

Thus, there have been various attempts to align the crystal grains in the ferroelectric capacitor insulation film 19 in the <111> direction. For example, it is proposed to introduce Ar atoms into the lower electrode 18 by an ion implantation process so as to change the state of the lower electrode 18 into amorphous state (Japanese Laid-Open Patent Publication 5-543345). According to this prior art process, the lower electrode 18 then is subjected to a rapid thermal annealing (RTA) process. Alternatively, there is proposed to anneal the lower electrode 18 in a furnace before depositing the ferroelectric film 19 thereon (Nakamura, T., et al., Jpn. J. Appl. Phys. vol.34, pp.5184–5187). Further, there is an attempt to deposit the lower electrode 18 at a high temperature so as to enable the orientation of the crystal grains in the ferroelectric capacitor insulation film 19.

Unfortunately, the foregoing approach to convert the lower electrode 18 once into amorphous phase and then to cause a crystallization by an RTA process is ineffective for achieving a satisfactory degree of crystallization in the lower electrode 18, and no desirable crystal orientation is obtained in the ferroelectric capacitor insulation film 19. Further, when a high-temperature thermal annealing process is applied to the lower electrode 18 in a furnace, there is a tendency that the hillock phenomenon is induced in the lower electrode 18, wherein such a hillock caused in the lower electrode 18 decreases the yield of the semiconductor device.

In the formation of the ferroelectric capacitor as noted above, it is very important to crystallize the ferroelectric capacitor insulation film 19 by conducting a crystallization process. Further, it is also very important to control the process of forming the upper electrode 20. Without such a crystallization process, no desirable property is obtained for the ferroelectric capacitor.

Conventionally, such a ferroelectric capacitor is formed first by forming the adhesion layer 17 of the Ti/TiN structure and then the lower electrode 18 of Pt by a sputtering process conducted on the interlayer insulation film 15 in a reducing or inert atmosphere. Next, the ferroelectric capacitor insulation film 19 of PZT is formed on the lower electrode 18 by a sputtering process. By forming the lower electrode 18 in a reducing atmosphere or inert atmosphere, the problem of oxidation of the lower electrode 18 and associated problem of increase of the resistance are successfully avoided.

Next, the ferroelectric capacitor insulation film 19 is subjected to a thermal annealing process in an oxidizing atmosphere at a temperature of typically 700–800° C., and the ferroelectric capacitor insulation film 19 thus formed undergoes a crystallization. Thereby, it has been practiced to conduct the crystallization process in an oxidizing atmosphere so that the formation of oxygen defects in the ferroelectric capacitor insulation film 19, caused as a result of diffusion of oxygen atoms from the ferroelectric capacitor insulation film 19 to the lower electrode 18, is successfully compensated for. As a result of the crystallization, the ferroelectric capacitor insulation film 19 shows a preferable hysteresis as represented in FIG. 2, with a spontaneous polarization 2Pr.

After the formation of the ferroelectric capacitor insulation film 19, the upper electrode 20 is formed on the film 19 by a deposition of Pt. Thereby, the deposition of the upper electrode 20 has been conducted in an inert atmosphere such as Ar so as to avoid the oxidation of Pt constituting the upper electrode 20.

On the other hand, in such a process of forming the upper electrode 20 on the ferroelectric capacitor insulation film 19 in an inert atmosphere, it is inevitable that the oxygen atoms in the ferroelectric capacitor insulation film 19 are extracted to some extent by the upper electrode 20, resulting in the formation of oxygen deficiency in the ferroelectric capacitor insulation film 19. It should be noted that the existence of the oxygen deficiency in the ferroelectric capacitor insulation film 19 tends to induce a diffusion of Pt from the upper electrode 20 into the ferroelectric capacitor insulation film 19, and there is caused a mutual diffusion of Pt and oxygen between the ferroelectric capacitor insulation film 19 and the upper electrode 20. When such a mutual diffusion is caused, the ferroelectric capacitor insulation film 19 shows a deterioration in the fatigue characteristic and the retention characteristic.

SUMMARY OF THE INVENTION

Accordingly, it is a general object of the present invention to provide a novel and useful semiconductor device having a ferroelectric or high-dielectric capacitor wherein the foregoing problems are eliminated.

Another and more specific object of the present invention is to provide a ferroelectric capacitor and a semiconductor device having such a ferroelectric capacitor wherein the grain orientation in a ferroelectric capacitor insulation film forming the ferroelectric capacitor is controlled for maximum relative dielectric constant.

Another and more specific object of the present invention is to provide a ferroelectric capacitor and a semiconductor device having such a ferroelectric capacitor wherein the degradation of performance of the capacitor associated with the formation of the capacitor electrode is successfully avoided.

Another object of the present invention is to provide a high-dielectric capacitor and a semiconductor device having such a high-dielectric capacitor wherein the degradation of performance of the capacitor associated with the formation of the capacitor electrode is successfully avoided.

Another object of the present invention is to provide a fabrication process of a semiconductor device having a ferroelectric capacitor, comprising the steps of:

forming a lower electrode on a substrate;

applying a rapid thermal annealing process to said lower electrode;

depositing, after said step of rapid thermal annealing process, a ferroelectric film on said lower electrode;

crystallizing said ferroelectric film by applying a thermal annealing process to said ferroelectric film; and forming an upper electrode on said ferroelectric insulation film.

Another object of the present invention is to provide a fabrication process of a ferroelectric capacitor, comprising the steps of:

forming a lower electrode on a substrate;

applying a rapid thermal annealing process to said lower electrode;

depositing, after said step of rapid thermal annealing process, a ferroelectric film on said lower electrode;

crystallizing said ferroelectric film by applying a thermal annealing process to said ferroelectric film; and forming an upper electrode on said ferroelectric insulation film.

Another object of the present invention is to provide a ferroelectric capacitor, comprising:

a substrate;

a lower electrode formed on said substrate;

a ferroelectric film formed on said lower electrode; and an upper electrode formed on said ferroelectric film, said ferroelectric film comprising crystal grains aligned substantially in a <111>direction.

According to the present invention, Ti migrates from an adhesion layer formed underneath said lower electrode to the surface thereof in the form of $TiO_x$ as a result of the rapid thermal annealing process applied to the lower electrode. Thereby, $TiO_x$ thus migrated functions as nuclei of crystal growth and the ferroelectric crystals of the ferroelectric film, which may either of PZT, PLZT, BST or SBT, deposited on the lower electrode grows generally in the <111> direction. Because of the <111> orientation of the ferroelectric film, the spontaneous polarization is of the ferroelectric film is maximized. By conducting the thermal annealing process of the lower electrode only for a short time in the form of RTA, the oxidation of the lower electrode is avoided successfully. Further, the formation of unwanted hillock is avoided successfully.

Another object of the present invention is to provide a fabrication process of a semiconductor device having a capacitor, comprising the steps of:

forming a lower electrode;

depositing a dielectric film having a perovskite structure on said lower electrode;

crystallizing said dielectric film by applying a thermal annealing process to said dielectric film in an oxidizing atmosphere; and forming an upper electrode, after said step of crystallizing, on said dielectric film, said step of forming said upper electrode being conducted in an oxidizing atmosphere.

Another object of the present invention is to provide a semiconductor device, comprising:

a substrate;

a memory cell transistor formed on said substrate;

a memory cell capacitor in electrical contact with a diffusion region of said memory cell transistor, said memory cell transistor comprising:

a lower electrode in electrical contact with said diffusion region;

a capacitor dielectric film having a perovskite structure formed on said lower electrode; and an upper electrode of Pt formed on said capacitor dielectric film, said upper electrode having a sputter etching rate substantially lower than a sputter etching rate of said upper electrode in the case said upper electrode is formed in a substantially inert atmosphere.

Another object of the present invention is to provide a fabrication process of a capacitor, comprising the steps of:

forming a lower electrode;

depositing a dielectric film having a perovskite structure on said lower electrode;

crystallizing said dielectric film by applying a thermal annealing process in an oxidizing atmosphere; and forming, after said step of crystallizing, an upper electrode on said dielectric film, wherein said step of forming said upper electrode is conducted in an oxidizing atmosphere.

According to the present invention, the upper electrode experiences a densification as a result of the step of forming the upper electrode in the oxidizing atmosphere. Thereby, the problem of oxygen diffusion from the dielectric film into the upper electrode is successfully avoided. The capacitor of the present invention shows a substantial improvement in terms of fatigue, retention, imprint and resistance against exfoliation.

Another object of the present invention is to provide a fabrication process of a semiconductor device having a capacitor, comprising the steps of:

forming a lower electrode;

depositing a dielectric film having a perovskite structure on said lower electrode;

crystallizing said dielectric film by applying a thermal annealing process in an inert atmosphere;

applying, after said step of crystallizing, a thermal annealing process to said dielectric film in an oxidizing atmosphere; and forming, after said step of thermal annealing process in said oxidizing atmosphere, an upper electrode on said dielectric film.

Another object of the present invention is to provide a fabrication process of a capacitor, comprising the steps of:

forming a lower electrode;

depositing a dielectric film having a perovskite structure on said lower electrode;

crystallizing said dielectric film by applying a thermal annealing process in an inert atmosphere;

applying, after said step of crystallizing, a thermal annealing process to said dielectric film in an oxidizing atmosphere; and forming, after said step of thermal annealing process in said oxidizing atmosphere, an upper electrode on said dielectric film.

Another object of the present invention is to provide a fabrication process of a semiconductor device having a capacitor, comprising the steps of:

forming a lower electrode;

depositing a high-dielectric film on said lower electrode;

crystallizing said high-dielectric film by applying thereto a thermal annealing process in an inert atmosphere;

applying, after said step of crystallizing, a thermal annealing process to said high-dielectric film in an oxidizing atmosphere; and forming, after said step of applying said thermal annealing process in said oxidizing atmosphere, an upper electrode on said dielectric film, wherein said thermal annealing process in said oxidizing atmosphere is conducted at a temperature set so that no substantial oxidation occurs in said lower electrode.

According to the present invention, the lower electrode experiences densification without substantial oxidation, by conducting the crystallization process in the inert atmosphere. As a result, the problem of mutual diffusion of the elements at the interface between the lower electrode and the dielectric or high-dielectric film is successfully minimized, and the capacitor leakage current, caused by the defects in the dielectric film acting as a carrier, is substantially reduced. As the crystallization process of the dielectric or high-dielectric film is conducted in the inert atmosphere separately from the oxidizing process for compensating for the oxygen deficiency of the dielectric or high-dielectric film, it becomes possible to increase the crystallization temperature and the relative dielectric constant of the dielectric or high-dielectric film is successfully maximized. Further, by conducting the thermal annealing process in the oxidizing atmosphere at the temperature in which no substantial oxidation is caused in the lower electrode, the problem of defect formation in the lower electrode is eliminated and the capacitor leakage current is reduced further.

Another object of the present invention is to provide a fabrication process of a capacitor, comprising the steps of:

forming a lower electrode;

depositing a dielectric film having a perovskite structure on said lower electrode;

raising the temperature of said dielectric film to a thermal annealing temperature while holding said dielectric film in an inert atmosphere;

changing, after said thermal annealing temperature is reached, the atmosphere of said dielectric film from said inert atmosphere to an oxidizing atmosphere while holding said dielectric film at said thermal annealing temperature;

annealing, after said step of changing the atmosphere, said dielectric film in said oxidizing atmosphere while holding said dielectric film at said thermal annealing temperature; and forming, after said annealing step in said oxidizing atmosphere, an upper electrode on said dielectric film.

According to the present invention, the lower electrode undergoes densification as a result of the rapid temperature rise to the thermal annealing temperature in the inert atmosphere. As a result of the densification, the lower electrode experiences minimum oxidation when the thermal annealing process is conducted in the oxidizing atmosphere. The dielectric film thus processed have the crystal grains aligned in the <111> direction.

Other objects and further features of the present invention will become apparent from the following detailed description when read in conjunction with the attached drawings.

BRIEF DESCRIPTION OF THE DRAWINGS

FIG. 2 is a diagram showing the polarization of a ferroelectric material;

FIGS. 4A and 4B are diagrams showing the X-ray diffraction chart of the ferroelectric film formed according to the process of the first embodiment in comparison with the X-ray diffraction chart of the ferroelectric film formed according to a conventional process;

DETAILED DESCRIPTION OF THE PREFERRED EMBODIMENTS

Figure 1:
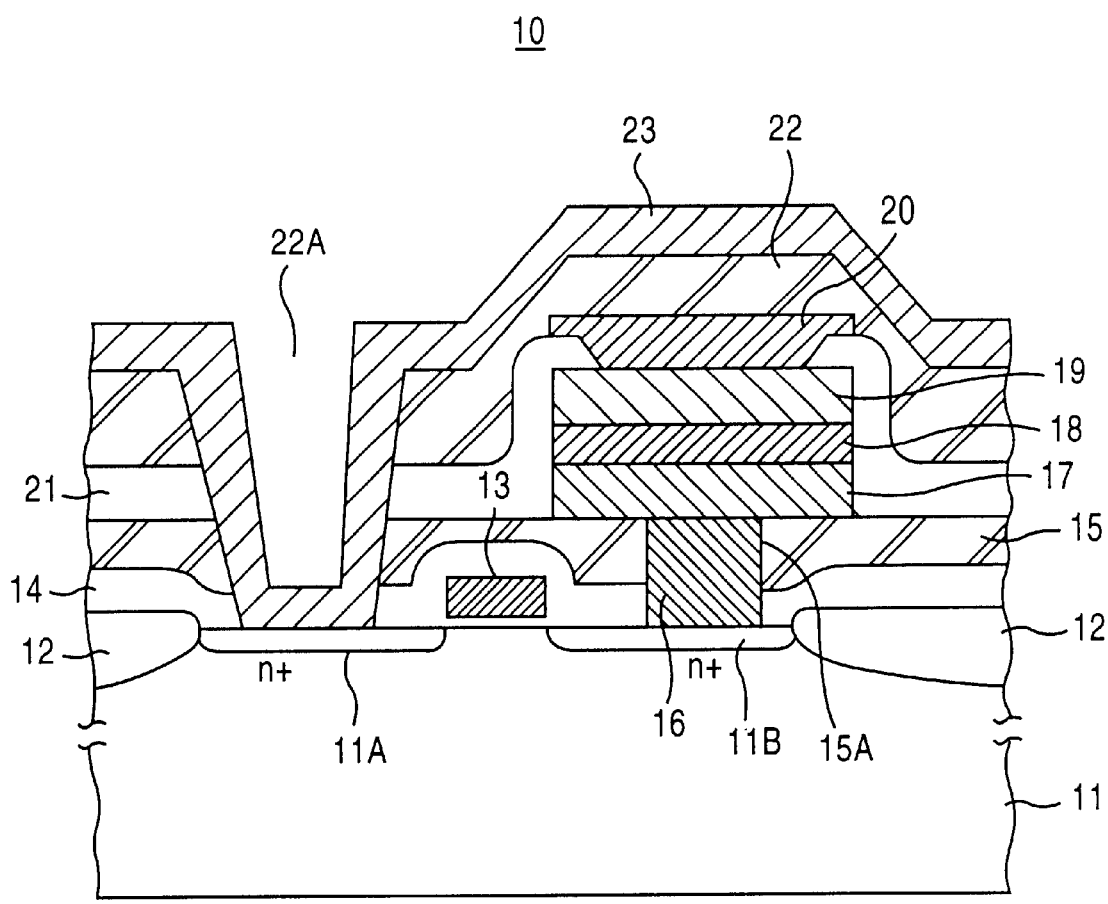
FIG. 1 is a diagram showing the construction of a conventional semiconductor memory device having a ferroelectric capacitor.
Figure 3A:
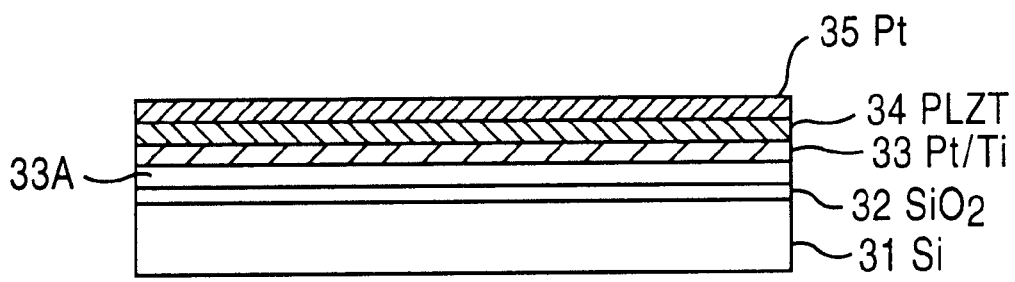
FIGS. 3A and 3B are diagrams showing the fabrication process of a ferroelectric capacitor according to a first embodiment of the present invention.
Figure 3B:
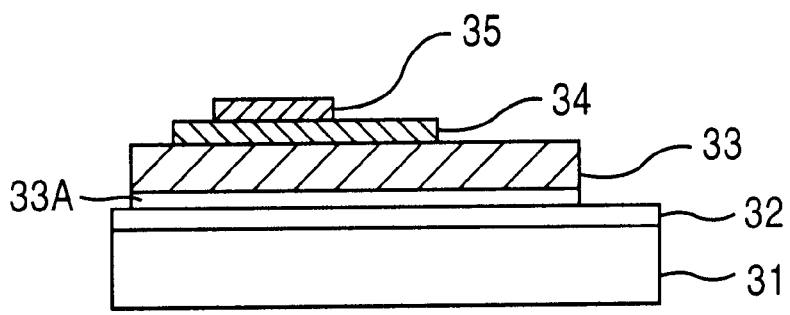

FIGS. 3A and 3B are diagrams showing the fabrication process of a ferroelectric capacitor 30 according to a first embodiment of the present invention.

Referring to FIG. 3A, a $SiO_2$ film 32 is formed on a Si substrate 31 by a thermal oxidation process with a thickness of 200 nm, for example, and a lower electrode 33 of Pt is formed on the $SiO_2$ film 32 by a D.C. sputtering process conducted at a room temperature, with an adhesion layer 33A of Ti interposed between the $SiO_2$ film 32 and the lower electrode 33.

More specifically, the Ti adhesion layer 33A is formed in an Ar atmosphere under the pressure of 10 mTorr with a thickness of about 20 nm as represented in TABLE I below. Further, the lower electrode 33 is formed under the same condition with a thickness of about 100 nm. The deposition of the Ti film 33A and the lower electrode 33 is conducted by setting the D.C. plasma power to 1 kW, wherein the deposition of the Ti film 33A is conducted for the duration of 10 seconds while the deposition of the lower electrode 33 is conducted for the duration of 20 seconds.

TABLE I

|    | Ar pressure (mTorr) | DC power (kW) | duration (second) | thickness (nm) |
|----|---------------------|---------------|-------------------|----------------|
| Ti | 10                  | 1.0           | 10                | 20             |
| Pt | 10                  | 1.0           | 20                | 100            |

After the formation of the lower electrode 33, a PLZT film 34 is deposited thereon by an R.F. sputtering process conducted at the room temperature under the pressure of 10 mTorr with a thickness of typically about 240 nm as represented in TABLE II below.

Referring to TABLE II, it will be noted that the R.F. sputtering is conducted by setting the R.F. plasma power to 1.5 kW and continued for the duration of about 10 minutes.

TABLE II

| Ar pressure (mTorr) | RF power (kW) | duration (minute) | thickness (nm) |
|---------------------|---------------|-------------------|----------------|
| 10                  | 1.5           | 10                | 300            |

Next, the structure thus obtained is subjected to a thermal annealing process conducted in an oxidizing atmosphere at about 750° C., and the PLZT film 34 undergoes a crystallization. Simultaneously to the crystallization, oxygen is supplied to the PLZT film 34 as a result of the thermal annealing process, and the oxygen deficiency in the PLZT film 34 is compensated for.

Further, an upper electrode 35 of Pt is formed on the PLZT film 34 by a D.C. sputtering conducted at the room temperature as represented in TABLE III with a thickness of about 100 nm. As represented in TABLE III, the formation of the upper electrode 35 is achieved in an Ar plasma by setting the D.C. plasma power to about 0.3 kW. In the example of TABLE III, the Ar partial pressure is set to 5 mTorr and the sputtering is continued for about 200 seconds.

TABLE III

|    | Ar pressure (mTorr) | RF power (kW) | duration (second) | thickness (nm) |
|----|---------------------|---------------|-------------------|----------------|
| Pt | 5                   | 0.3           | 200               | 100            |

Next, in the step of FIG. 3B, the upper electrode 35 and the PLZT film 34 are subjected to a plasma etching process under the condition represented in TABLE IV, and the desired ferroelectric capacitor 30 is obtained.

TABLE IV

|                    | Ar pressure (mTorr) | power (kW) | duration (minute) |
|--------------------|---------------------|------------|-------------------|
| Pt                 | 0.2                 | 1          | 3                 |
| (Pb,La)(Zr,Ti)$O_3$ | 0.2                 | 1          | 5                 |

In the present embodiment, it should be noted that the lower electrode 33 is subjected to a rapid thermal annealing (RTA) process in the step of FIG. 3A after the formation of the lower electrode 33 but before the deposition of the PLZT film 34, wherein the RTA process is conducted in an inert atmosphere such of Ar, He, Ne, Kr, Xe or $N_2$ for only a limited duration.

FIGS. 4A and 4B show the X-ray patterns of the PLZT film 34 thus formed on the lower electrode 33, wherein FIG. 4A shows the case in which the RTA process of the lower electrode 33 is omitted, while FIG. 4B shows the case in which the RTA process is applied to the lower electrode 33. The deposition of the PLZT film 34 itself was conducted identically in both cases of FIG. 4A and FIG. 4B. Further, it should be noted that the X-ray diffraction patterns of FIGS. 4A and 4B are for the PLZT film 34 after the thermal annealing process in the oxidizing atmosphere is applied thereto.

Referring to FIG. 4A, the PLZT film 34, formed according to the process in which the RTA process of the lower electrode 33 is omitted, shows the diffraction peak of the PLZT (111) surface with a peak height generally equal to the diffraction peak height of the PLZT (100) surface, indicating that majority of the PLZT crystals in the PLZT film 34 are aligned in the <100> direction. In contrast, the diffraction pattern of FIG. 4B, in which the PLZT film is deposited on the lower electrode 33 is subjected to the RTA process, indicates that the diffraction peak height of the PLZT (111) surface is much larger than the diffraction peak height of the (100) surface, indicating that the majority of the PLZT crystals in the PLZT film 34 are aligned in the <111> direction.

The foregoing results of FIGS. 4A and 4B indicate that the grain orientation of the PLZT crystals in the PLZT film 34 is aligned in the <111> direction when the PLZT film 34 is formed on the lower electrode 33 subjected to the RTA process in an inert atmosphere.

TABLE V below shows the value of the spontaneous polarization 2Pr (see FIG. 2 for definition) of the PLZT film 34 achieved by the present embodiment in comparison with the value of 2Pr of the PLZT film formed on the lower electrode 33 without applying the RTA process to the lower electrode 33.

TABLE V

|                   | 2Pr ($\mu C/cm^2$) | leakage current (A/$cm^2$)        | 90%-saturation | fatigue  |
|-------------------|--------------------|-----------------------------------|----------------|----------|
| conventional      | 20.3               | (−2.0 V)1.5E−2/9.9E−5(+5.0 V)     | 4.1            | 6.1E+06  |
| present invention | 31.2               | (−5.0 V)9.9E−8/1.7E−7(+5.0 V)     | 4.2            | 6.2E+06  |

In TABLE V, it should be noted that the designation "conventional" represents the case in which the RTA process to the lower electrode 33 is omitted and "present invention" represents the case in which the RTA process is applied.

Referring to TABLE V, it can be seen that the value of 2Pr increases from the conventional value of 20.3 $\mu C/cm^2$ to 31.2 $\mu C/cm^2$ by applying the RTA process to the lower electrode 33. Further, TABLE V indicates that the leakage current of the conventional ferroelectric capacitor, taking the value of 1.5×10$^{-2}$ A/$cm^2$ when a voltage of −2.0V is applied across the lower electrode 33 and the upper electrode 35 and further the value of 9.9×10$^{-5}$ A/$cm^2$ when a voltage of +5.0V is applied, is reduced to the value of 9.9×10$^{-8}$/$cm^2$ when a voltage of −5.0 V is applied across the lower electrode 33 and the upper electrode 35, and further to the value of 1.1×10$^{-7}$ A/$cm^2$ when a voltage of +5.0 V is applied across the lower electrode 33 and the upper electrode 35.

Further TABLE V indicates the saturation voltage corresponding to the 90% saturation value of 2Pr and the value of fatigue. From the result of TABLE V, no substantial difference was observed between the ferroelectric capacitor of the present embodiment and the conventional ferroelectric capacitor.

In the present embodiment, it is believed that the thermal annealing process applied to the lower electrode 33 induces a migration of Ti atoms from the underlying adhesion layer 33A to the top surface of the lower electrode 33 and the Ti atoms thus migrated form $TiO_x$ on the top surface of the lower electrode 33, wherein $TiO_x$ thus formed acts as the nuclei for the growth of the PLZT crystal grains in the <111> direction. About the <111> growth of PLZT crystals from the $TiO_x$ nuclei, reference should be made to Muralt, P., et al., J. Appl. Phys. vol.83, No.7, pp.3835–3841.

In the present embodiment, the lower and upper electrodes 33 and 35 are by no means limited to Pt but other conductive materials such as Ir, $IrO_2$, Ru, $RuO_2$, or a composite film thereof may also be used. Further, the ferroelectric film 34 is not limited to PZT or PLZT but other dielectric materials having the perovskite structure such as $BaTiO_3$ (BTO), $SrTiO_3$ (STO), $LiNbO_3$ (LNO), or a solid solution thereof may also be used.

[Second Embodiment]

FIGS. 5A–5I are diagrams showing the fabrication process of an FeRAM according to a second embodiment of the present invention.

Figure 5A:
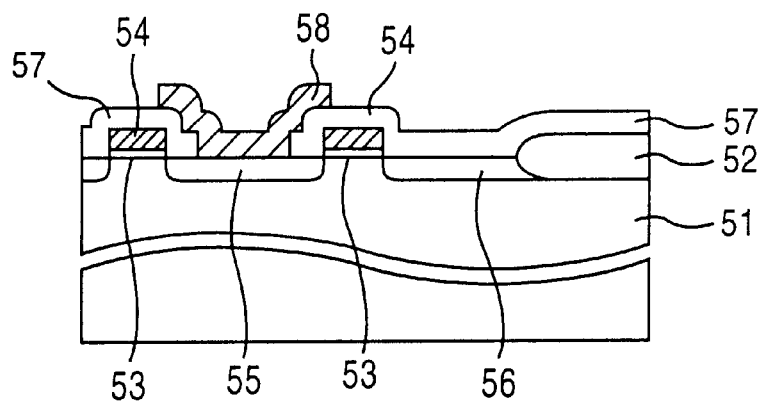
FIGS. 5A–5I are diagrams showing the fabrication process of a non-volatile semiconductor memory device according to a second embodiment of the present invention.

Referring to FIG. 5A, a memory cell region is defined on a p-type substrate 51 by a field oxide film 52, and a gate insulation film 53 is formed on the Si substrate 51 such that the gate insulation film 53 covers the memory cell region. Further, a gate electrode 54 is formed on the gate insulation film 53 similarly to a conventional MOS transistor. The gate electrode 54 thus formed forms a part of the word line crossing the memory cell region. Further, n-type diffusion regions 55 and 56 are formed in the substrate 51 at both lateral sides of the gate electrode 54 while using the gate electrode 54 as a self-alignment mask.

After the formation of the memory cell transistor as noted above, a $SiO_2$ film 57 is formed on the substrate 51 so as to cover the gate electrode 54, and a contact hole is formed in the $SiO_2$ film 57 so as to expose the diffusion region 55.

After formation of the contact hole, a WSi film is deposited on the $SiO_2$ film 57 including the contact hole, and the WSi film thus deposited makes an electrical contact with the diffusion region 55 at the contact hole. By patterning the WSi film, a bit line electrode 58 is formed as represented in FIG. 5A.

Figure 5B:
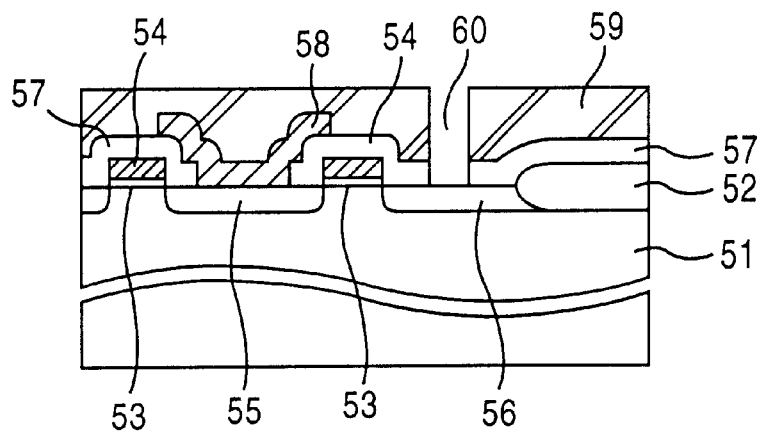

Next, in the step of FIG. 5B, an interlayer insulation film 59 typically of $SiO_2$ is deposited on the structure of FIG. 5A, and, after planarization using a CMP (chemical mechanical polishing) process, a deep contact hole 60 is formed in the interlayer insulation film 59 so as to expose the diffusion region 56.

Figure 5C:
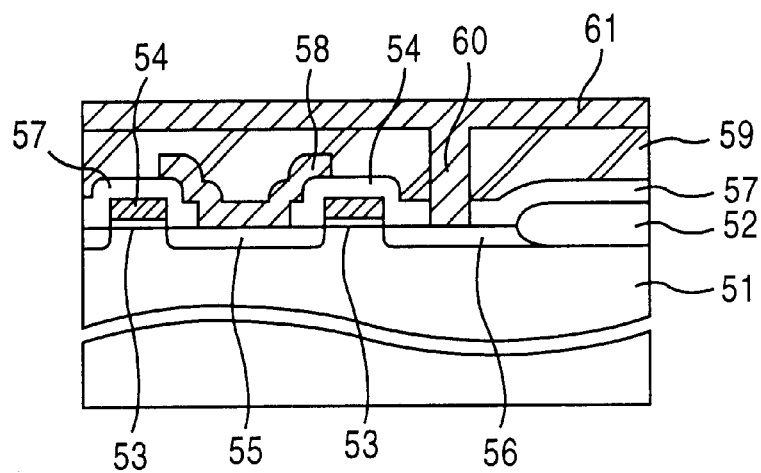

Next, in the step of FIG. 5C, a polysilicon film 61 doped by P to the $n^+$-type is deposited on the structure of FIG. 5B by a CVD process, such that the polysilicon film 61 fills the contact hole 60. Further, the polysilicon film 61 thus deposited is etched back in the step of FIG. 5D by a dry etching process, until the top surface of the interlayer insulation film 59 is exposed. As a result of the step of FIG. 5D, the contact hole 60 is filled by a polysilicon plug 62.

Figure 5D:
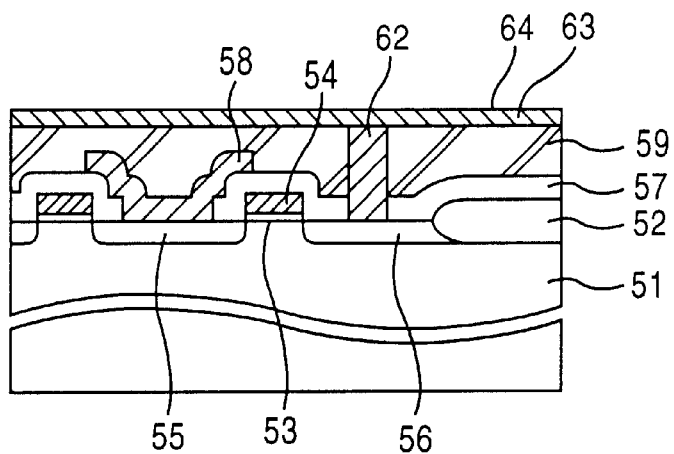

In the step of FIG. 5D, a Ti film (not shown) is deposited further on the interlayer insulation film 59 such that the Ti film covers the polysilicon plug 62, and a conductive film 63 of Pt, Ir, Ru, $IrO_2$ or $RuO_2$, is deposited on the Ti film by a sputtering process, wherein the sputtering process may be conducted according to the condition represented in TABLE I.

In the step of FIG. 6D, it should be noted that the conductive film 63 thus deposited is further subjected to a rapid thermal annealing process in an Ar atmosphere at the temperature of about 650° C. for 1–60 seconds. As a result of the RTA process thus applied to the conductive film 63, the Ti atoms cause a migration from the underlying Ti adhesion layer to the top surface of the conductor film 63, and there are formed $TiO_x$ nuclei on the top surface of the conductive film 63.

Figure 5E:
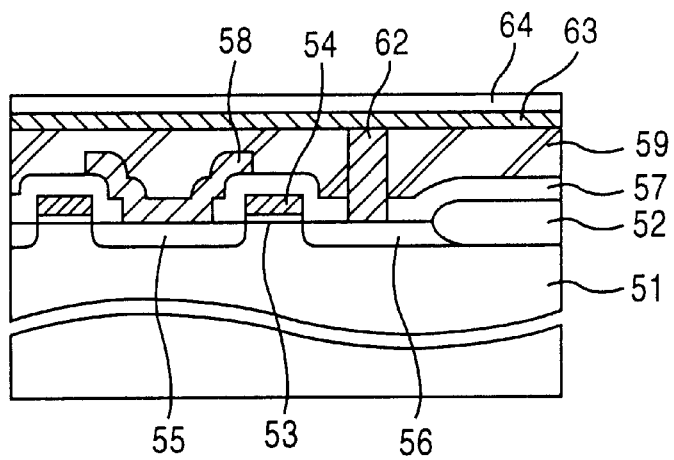

Next, in the step of FIG. 5E, a ferroelectric film 64 of PZT or PLZT is formed on the conductive film 63 by a sputtering process conducted under a condition slightly different from the condition of the foregoing TABLE II. In the present embodiment, the Ar partial pressure may be set to 15 mTorr and the R.F. power may be set to 1.75 kW during the deposition of the PLZT film 64. The duration of the deposition may be set to about 3.5 minutes. The ferroelectric film 64 thus deposited is then crystallized by conducting a rapid thermal annealing process in an oxidizing atmosphere at about 750° C. As a result of the thermal annealing process conducted in the oxidizing atmosphere, the oxygen deficiency which is tend to be caused in the ferroelectric film 64 is successfully compensated for.

Figure 5F:
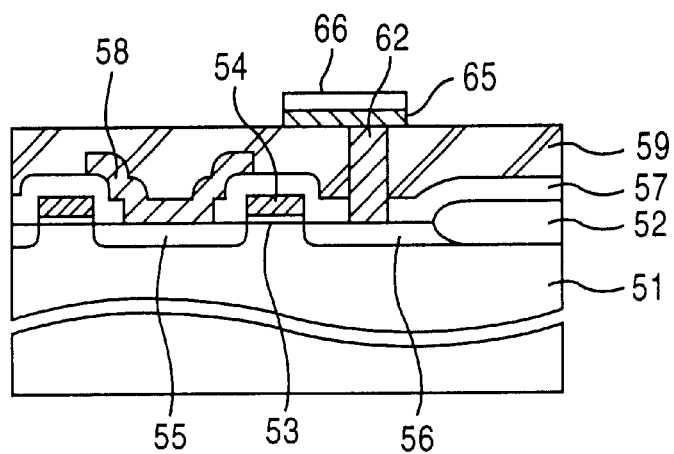

Further, in the step of FIG. 5F, the PZT film 64 and the underlying conductor film 63 are patterned by a plasma etching process conducted according to the condition of the foregoing TABLE IV, and a lower electrode pattern 65 and a capacitor insulation film 66 are formed.

Figure 5G:
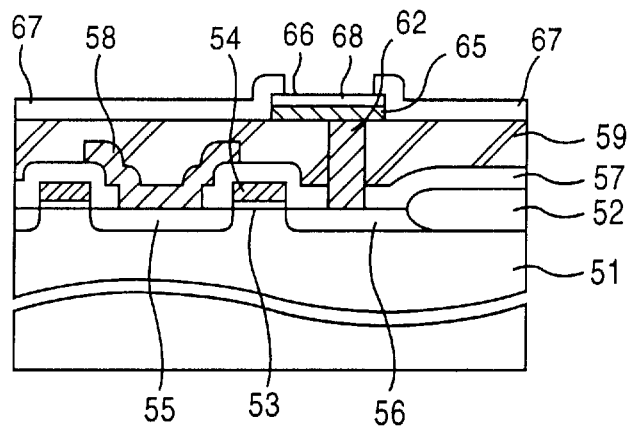
Figure 5H:
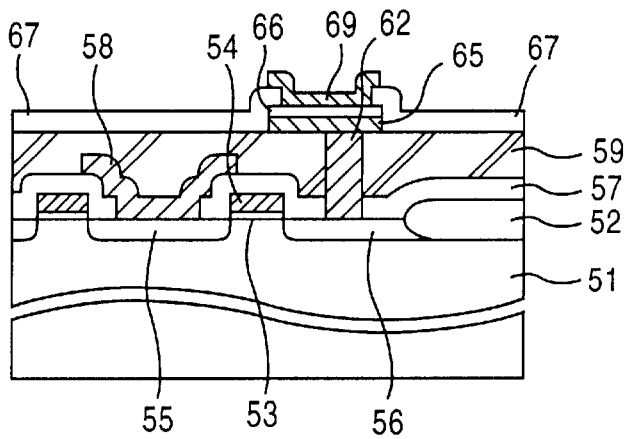
Figure 5I:
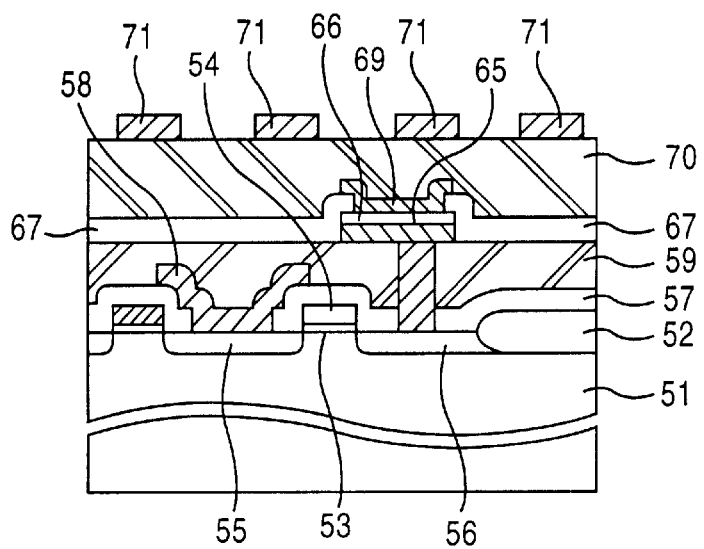

Next, in the step of FIG. 5G, an $SiO_2$ film 67 is deposited on the structure of FIG. 5F by a CVD process such that the $SiO_2$ film 67 covers the capacitor insulation film 66, and a contact hole 68 is formed in the $SiO_2$ film 67 such that the contact hole 68 exposes the capacitor insulation film 66. Further, in the step of FIG. 5H, a Pt pattern 69 is formed on the $SiO_2$ film 67 such that the Pt pattern 69 covers the exposed capacitor insulation film 66, and an interlayer insulation film 70 is formed on the $SiO_2$ film 67 in the step of FIG. 5I so as to cover the upper electrode 69. Further, an interconnection pattern 71 is formed on the interlayer insulation film 70.

Figure 6:
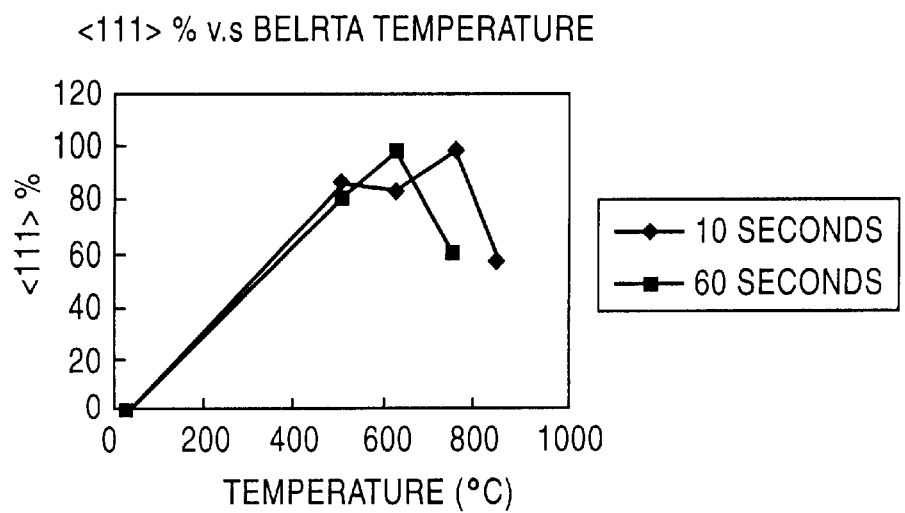
FIG. 6 is a diagram showing the relationship between the crystal orientation and thermal annealing temperature of the ferroelectric film obtained in the second embodiment.

FIG. 6 shows the relationship between the annealing temperature of the RTA process of FIG. 5D conducted in the Ar atmosphere and the orientation of the PLZT crystals in the PLZT film 64, wherein the horizontal axis represents the annealing temperature and the vertical axis represents the proportion of the PLZT crystals aligned in the <111> direction evaluated from the X-ray diffraction pattern.

Referring to FIG. 6, it will be noted that majority of the PLZT crystals of the PLZT film 64 are aligned in the <111> direction by conducting the foregoing thermal annealing process in the temperature range of about 400° C. to about 900° C. for 10–60 seconds. Further, FIG. 6 indicates that the desired <111> orientation of the PLZT crystals is achieved even in such a case in which the duration of the thermal annealing process is reduced to about 10 seconds.

Figure 7:
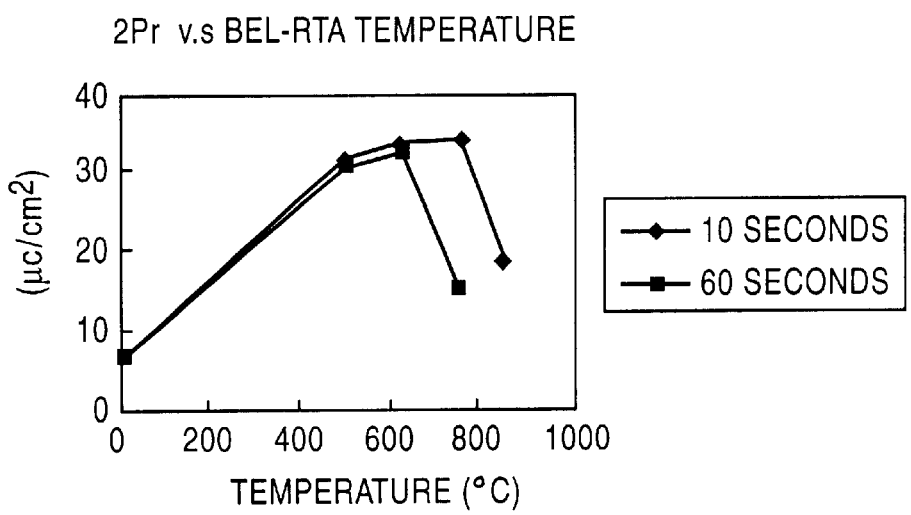
FIG. 7 is a diagram showing the relationship between the spontaneous polarization and thermal annealing temperature of the ferroelectric film obtained in the second embodiment.
Figure 8A:
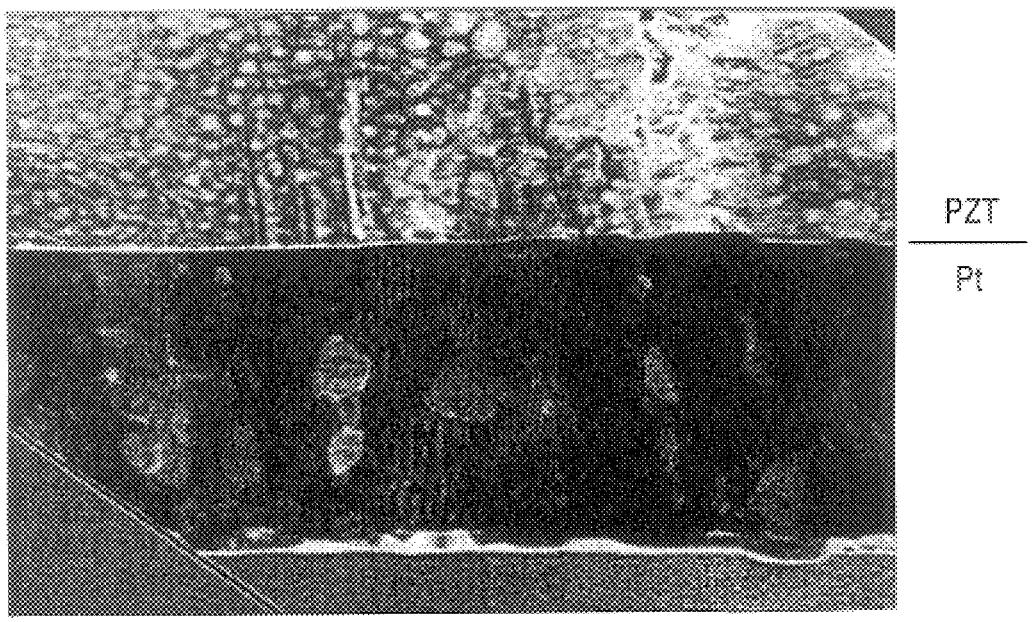
FIGS. 8A and 8B are diagrams showing the texture of the lower electrode and the ferroelectric film thereon respectively for the case in which no rapid thermal annealing process is applied to the lower electrode and in which such a rapid annealing process is applied.
Figure 8B:
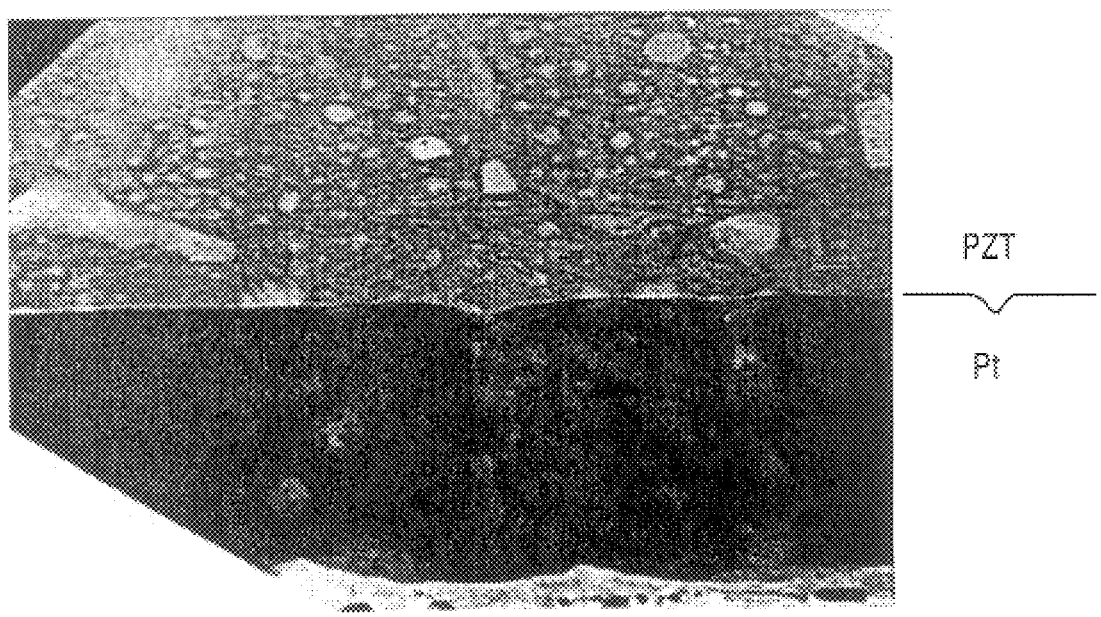

FIG. 7 shows the relationship between the temperature of the rapid thermal annealing process and the electrical property of the PLZT crystals constituting the PLZT film 65, wherein the horizontal axis represents the thermal annealing temperature while the vertical axis represents the width 2Pr of the hysteresis loop of the PLZT film 64.

Referring to FIG. 7, it will be noted that the relationship between the value of 2Pr and the thermal annealing temperature is similar to that of FIG. 6 and the value of the spontaneous polarization 2Pr of the PLZT film 34 is maximized as a result of the thermal annealing process conducted in the temperature range of 400800° C.

TABLE VI shows the electrical property of the ferroelectric capacitor thus obtained in comparison with the electrical property of the ferroelectric capacitor in which the RTA process of the lower electrode 63 is omitted.

TABLE VI

|  | 2Pr ($\mu C/cm^2$) | leakage current ($A/cm^2$) | saturation |
|---|---|---|---|
| conventional | 6.5 | (−5.0 V)8.6E−5/6.9E−5(+5.0 V) | 8.1 |
| present invention | 33.6 | (−5.0 V)1.1E−6/6.0E−6(+5.0 V) | 4.9 |

It should be noted that the RTA process was conducted for the ferroelectric capacitor of TABLE VI at the temperature of 650° C. for ten seconds.

As can be seen in TABLE VI, there is a distinct increase in the spontaneous polarization 2Pr. Further, it can be seen that the drive voltage for causing the 90% saturation of polarization is reduced substantially, indicating the possibility of low power driving of the ferroelectric capacitor. It is believed that the foregoing preferable feature of the present invention reflects the <111> alignment of the crystal grains in the ferroelectric film 64.

FIGS. 10A and 10B show the TEM photograph of the lower electrode 33 and the ferroelectric film 34 of the ferroelectric capacitor of FIG. 3B explained before, wherein FIG. 10A shows the case in which the RTA process to the lower electrode 33 is omitted, while FIG. 10B shows the case in which the RTA process of the lower electrode 33 is conducted.

Referring to FIG. 10A, it can be seen that the lower electrode 33 free from the RTA process has a flat top surface, while the lower electrode 33 of FIG. 10B shows a distinct depression defined by a curved boundary. It is believed that the foregoing depression is formed as a result of recrystallization of the lower electrode by the RTA process.

More in detail, it is believed that such a depression in the lower electrode 33 is formed as a result of concentration stress to the grain boundary in the lower electrode 33. When the RTA process is applied to the lower electrode 33, the Ti atoms cause a migration from the underlying adhesion layer to the top surface of the electrode 33 to form the $TiO_x$ compound as explained before, wherein the migration of the Ti atoms occurs predominantly along such grain boundaries and there occurs a segregation of the Ti atoms to the grain boundary in the lower electrode 33. Due to the growth of the PLZT crystals starting from such grain boundaries of the lower electrode 33, the lower electrode 33 experiences a concentration of stress in such grain boundaries.

[Third Embodiment]

Figure 9A:
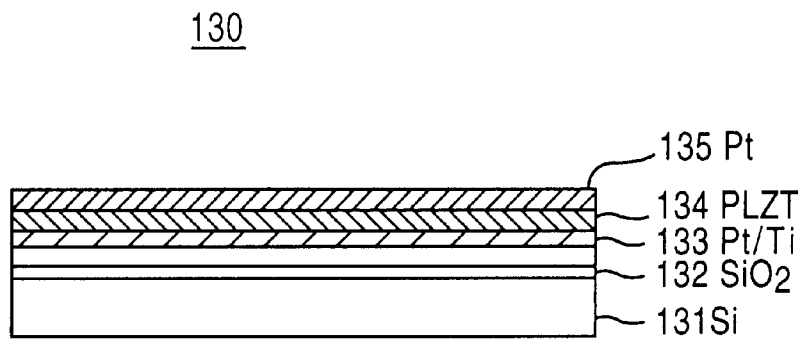
FIGS. 9A and 9B are diagrams showing the fabrication process of a ferroelectric capacitor according to third and fourth embodiments of the present invention.
Figure 9B:
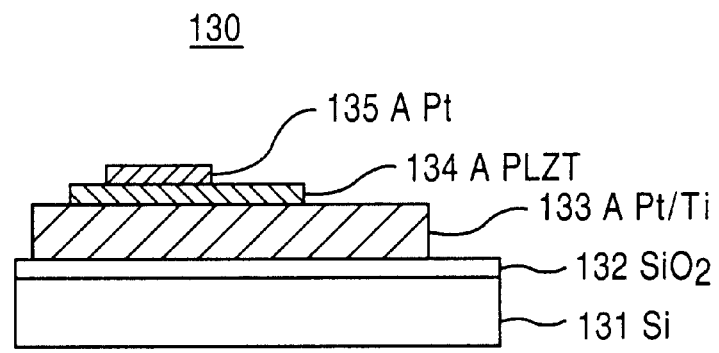

FIGS. 9A and 9B show the fabrication process of a ferroelectric capacitor 130 according to a third embodiment of the present invention.

Referring to FIG. 9A, a $SiO_2$ film 132 is formed on a Si substrate 131 with a thickness of about 200 nm by a thermal oxidation process, and a lower electrode 133 is formed on the $SiO_2$ film 132 by stacking a Ti film and a Pt film consecutively under a condition of TABLE VII.

TABLE VII

| | Ar pressure (mTorr) | DC power (kW) | duration (second) | thickness (nm) |
|---|---|---|---|---|
| Ti | 10 | 1.0 | 10 | 20 |
| Pt | 10 | 1.0 | 20 | 100 |

Next, a PLZT film 134 is formed on the lower electrode 133 by a sputtering process according to the condition represented in TABLE VIII below.

TABLE VIII

| Ar pressure (mTorr) | RF power (kW) | duration (minute) | thickness (nm) |
|---|---|---|---|
| 10 | 1.5 | 10 | 300 |

Further, the PLZT film 134 thus formed is subjected to a rapid thermal annealing (RTA) process first in an inert atmosphere for crystallization and then in an oxidizing atmosphere respectively at the temperature of 650° C. and 750° C. as represented in TABLE 10. As will be described later, the first RTA process conducted in the inert atmosphere not only causes a crystallization in the PLZT film 134 but also a densification in the lower Pt electrode 133, and the mutual diffusion of oxygen and Pt at the interface between the lower Pt electrode 133 and the PLZT film 134 thereon is effectively eliminated. Further, the crystal grains in the PLZT film 134 are aligned in the desirable <111> direction as a result of the crystallization conducted in the inert atmosphere. Further, the oxygen deficiency caused in the PLZT film 134 is effectively compensated for as a result of the thermal annealing process conducted in the oxidizing atmosphere.

After the formation of the PLZT film 134 noted above, an upper electrode 135 of Pt is formed on the PLZT film 134 by a sputtering process conducted in an atmosphere containing oxygen under the condition in TABLE IX below.

TABLE IX

| | Ar pressure (mTorr) | RF power (kW) | duration (second) | thickness (nm) |
|---|---|---|---|---|
| Pt | 5 | 0.3 | 200 | 100 |

By conducting the sputtering of the upper electrode 135 represented in TABLE IX under the atmosphere containing oxygen, the upper electrode 135 undergoes densification and the extraction of oxygen atoms from the PLZT film 134 to the upper electrode 135 across the interface between the PLZT film 134 and the upper electrode 135 is suppressed effectively. As a result, the spontaneous polarization 2Pr of the PLZT film 134 is maximized.

Next, in the step of FIG. 9B, the upper electrode 135, the PLZT film 134 and the lower Pt electrode 133 are subjected to a patterning process by conducting a dry etching process under a condition represented in TABLE X below.

TABLE X

| | Ar pressure (mTorr) | power (kW) | duration (minute) |
|---|---|---|---|
| Pt | 0.2 | 1 | 3 |
| (Pb,La)(Zr,Ti)O$_3$ | 0.2 | 1 | 5 |

As a result of the foregoing patterning process, an upper electrode pattern 135 of Pt, a capacitor insulation film 134A and a lower electrode pattern 133A are formed as represented in FIG. 9B.

Table XI below represents the spontaneous polarization 2Pr and the leakage current of the ferroelectric capacitor 130 thus obtained in comparison with those of a ferroelectric capacitor formed according to a conventional process, wherein the conventional ferroelectric capacitor of TABLE XI has a construction similar to that of the capacitor of FIG. 9B except that the ferroelectric film 134 is crystallized by a rapid thermal annealing process (750° C., 60 seconds) conducted in an oxidizing atmosphere and that the upper electrode 135 is formed by a sputtering conducted in an Ar atmosphere.

TABLE XI

| | 2 Pr ($\mu C/cm^2$) | leakage current (−5 V/+5 V) (A/cm$^2$) |
|---|---|---|
| conventional | 17.4 | 3.4E-4/4.2E-4 |
| present invention* | 48.2 | 1.5E-7/4.2E-7 |
| present invention** | 51.1 | 1.1E-7/2.7E-7 |

*after crystallization of PLZT film 134
**after formation of upper electrode 135

Referring to TABLE XI, it can be seen that the value of 2Pr increases by a factor of two or more after the crystallization process of the PLZT film 134. The value or 2Pr increases further by forming the upper electrode 135 in an oxidizing atmosphere.

TABLE XI further indicates that the leakage current of the capacitor is reduced by a factor of 1/1000 as compared with the leakage current of the conventional capacitor.

Figure 11:
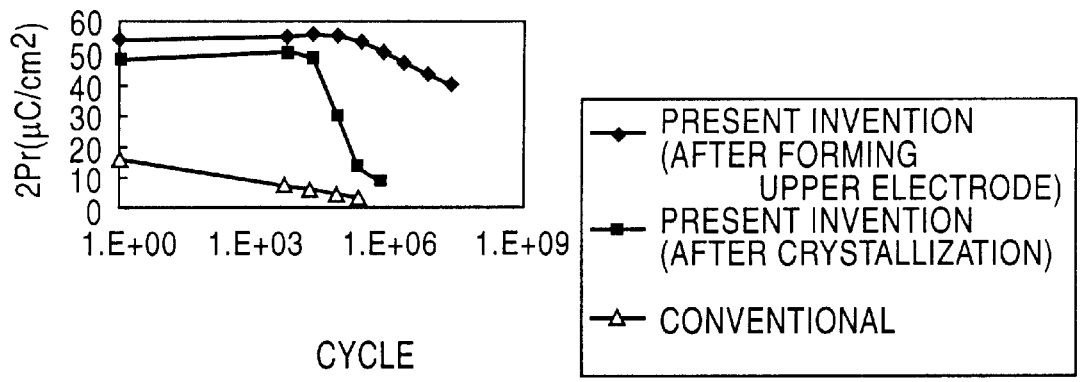
FIG. 11 is a diagram showing the electrical property of the ferroelectric capacitor of the third embodiment.

FIG. 11 shows the fatigue of the ferroelectric capacitor 130 thus obtained in comparison with the fatigue of a conventional ferroelectric capacitor, wherein the conventional ferroelectric capacitor represented in FIG. 11 is formed by crystallizing the PLZT film 134 in an oxidizing atmosphere and by forming the upper electrode 135 by a sputtering conducted in an Ar atmosphere.

Figure 10:
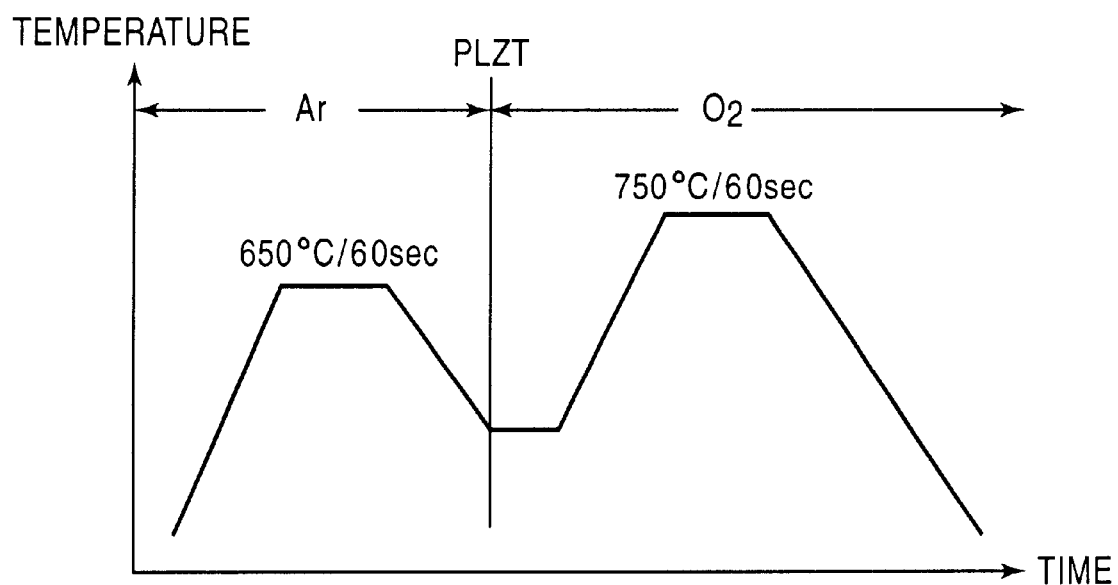
FIG. 10 is a diagram showing a temperature control program used for crystallizing the ferroelectric capacitor of the third embodiment.

Referring to FIG. 11, it will be noted that the value of the spontaneous polarization 2Pr starts to decrease generally linearly with the onset of the voltage cycle in the case of the conventional ferroelectric capacitor, while in the case the ferroelectric film 134 is applied with the two-step RTA process represented in FIG. 10, the degradation of 2Pr does not occur until the voltage cycle reaches about 10000 times. Further, when the upper electrode 135 is provided on the ferroelectric film 134 in the oxidizing atmosphere as in the ferroelectric capacitor 130 of the present embodiment, the ferroelectric capacitor 130 maintains a satisfactory spontaneous polarization 2Pr even when the voltage cycle has exceeded one million times.

Figure 12:
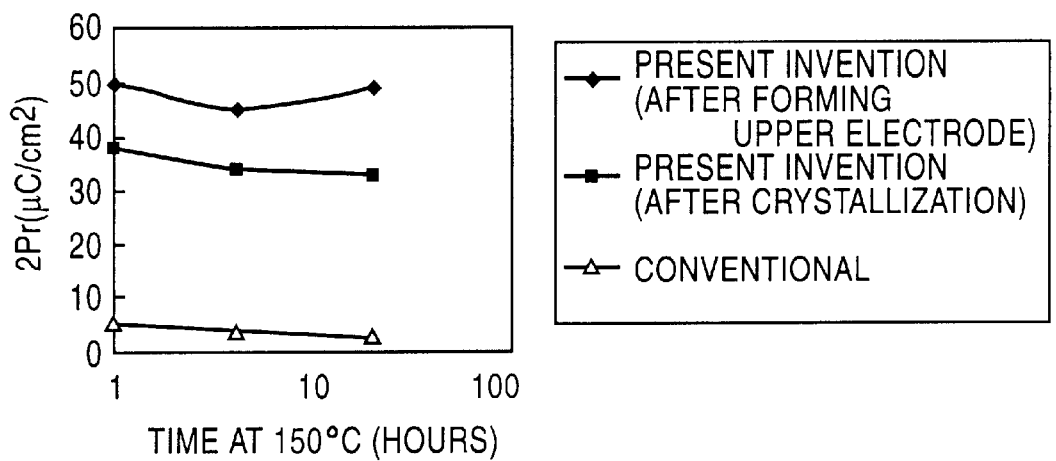
FIG. 12 is another diagram showing the electrical property of the ferroelectric capacitor of the third embodiment.

FIG. 12 shows the retention of the ferroelectric capacitor 130 according to the present embodiment in comparison with the conventional ferroelectric capacitor explained above with reference to FIG. 11.

Referring to FIG. 12, the conventional ferroelectric capacitor shows a generally linear decrease of the spontaneous polarization 2Pr as soon as a thermal annealing process at 150° C. is started, while in the case of the ferroelectric capacitor in which the ferroelectric film 134 is subjected to the two-step RTA process of FIG. 10, there occurs little decrease in the value of the spontaneous polarization 2Pr. It will be noted that a value of about 40 $\mu C/cm^2$ is still maintained after 10 hours. Further, in the case of the ferroelectric capacitor 130 in which the upper electrode 135 is formed in the oxidizing atmosphere, it can be seen that the value of 2Pr increases further and that there occurs no substantial decrease in the value of 2Pr by the thermal annealing process at 150° C.

Figure 13:
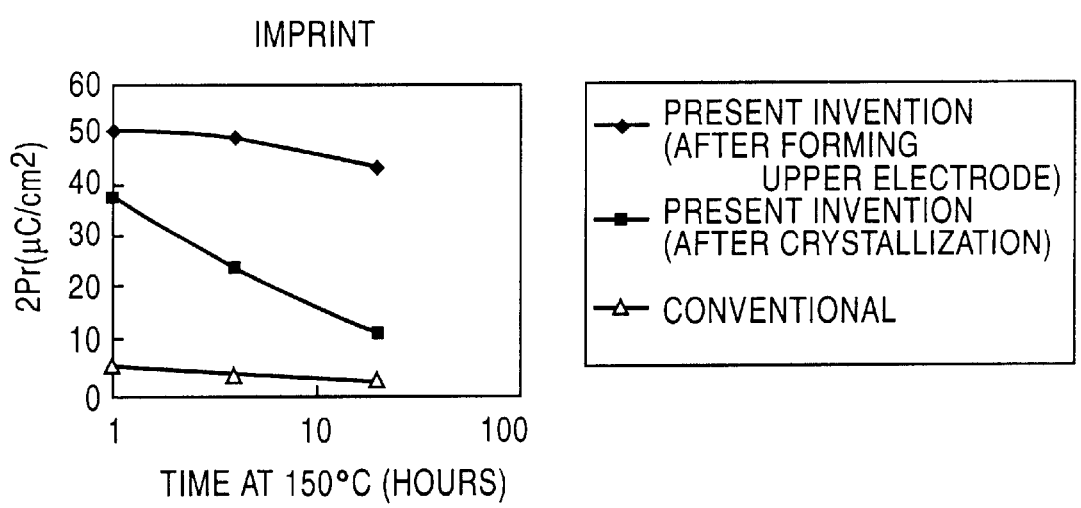
FIG. 13 is a further diagram showing the electrical property of the ferroelectric capacitor of the third embodiment.

FIG. 13 shows the imprint characteristic of the ferroelectric capacitor 130 in comparison with the conventional ferroelectric capacitor explained above with reference to FIG. 11.

Referring to FIG. 13, it can be seen that the value of 2Pr observed for the conventional capacitor is very small and shows a generally linear decrease as soon as a thermal annealing process at 150° C is started.

In the case the ferroelectric film 134 is subjected to the two-step RTA process represented in FIG. 10, on the other hand, it can be seen that the value of 2Pr starts to decrease from the initial value of 40 with time as soon as the thermal annealing process is started. On the other hand, once the upper electrode 135 is formed on the ferroelectric film 134 in the oxidizing atmosphere as noted above, the value of about 50 $\mu C/cm^2$ is maintained for 2Pr and this value does not decrease substantially with time.

Figure 14A:
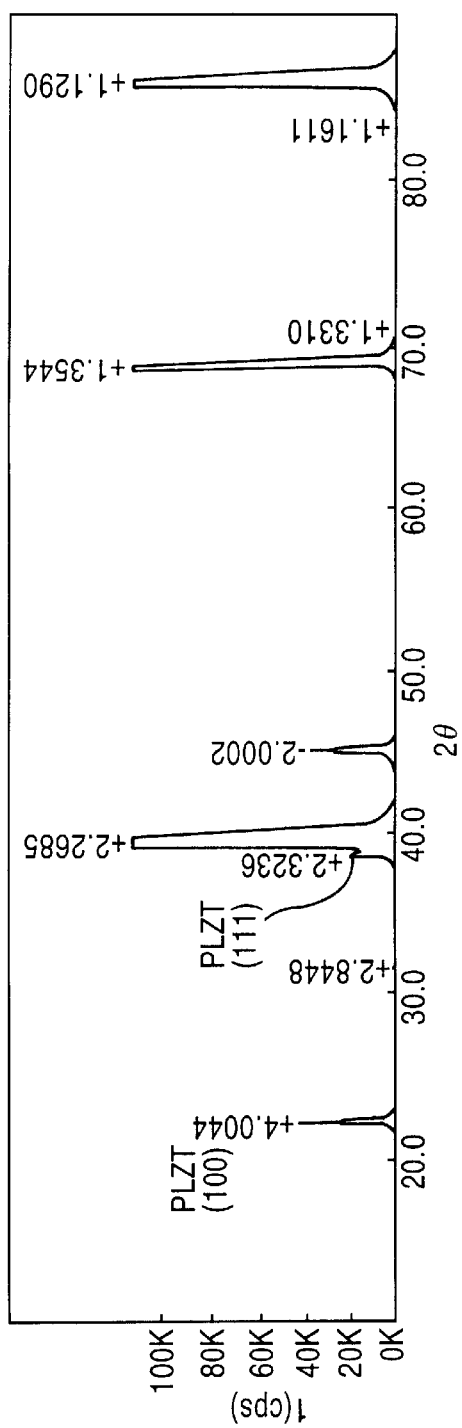
FIGS. 14A and 14B are diagrams showing the X-ray diffraction chart of the ferroelectric capacitor insulation film obtained in the third embodiment of the present invention in comparison with the X-ray diffraction chart of the ferroelectric capacitor insulation film obtained by a conventional process.
Figure 14B:
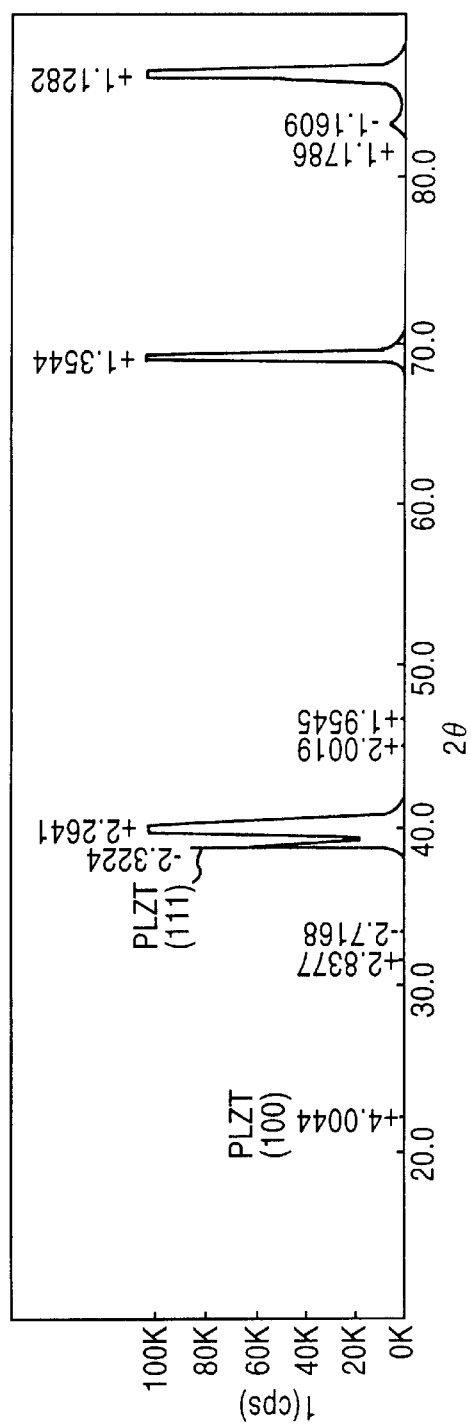

FIGS. 14A and 14B show the X-ray diffraction pattern of the PLZT film 134 after the two-step annealing process of FIG. 10 in comparison with the X-ray diffraction pattern of the PLZT film annealed in an oxidizing atmosphere, wherein FIG. 14A shows the case in which the PLZT film is annealed in the oxidizing atmosphere, while FIG. 14B shows the case in which the PLZT film is subjected to the two-step annealing process of FIG. 10.

Referring to FIG. 14A, the PLZT film 134 subjected to the oxidizing annealing process represents the existence of a distinct diffraction peak of the (100) surface of the PLZT crystal, while in the case of the PLZT film 134 subjected to the two-step annealing process, the (100) diffraction of the PLZT crystal is substantially disappeared as represented in FIG. 14B. Associated therewith, the diffraction peak of the (111) surface, which is very low in the diffraction pattern of FIG. 14A, has a substantial height in the diffraction pattern of FIG. 14B, indicating that the majority of the PLZT crystal grains are aligned in the <111> direction in the PLZT film 134 subjected to the two-step annealing process of FIG. 14B.

Figure 15:
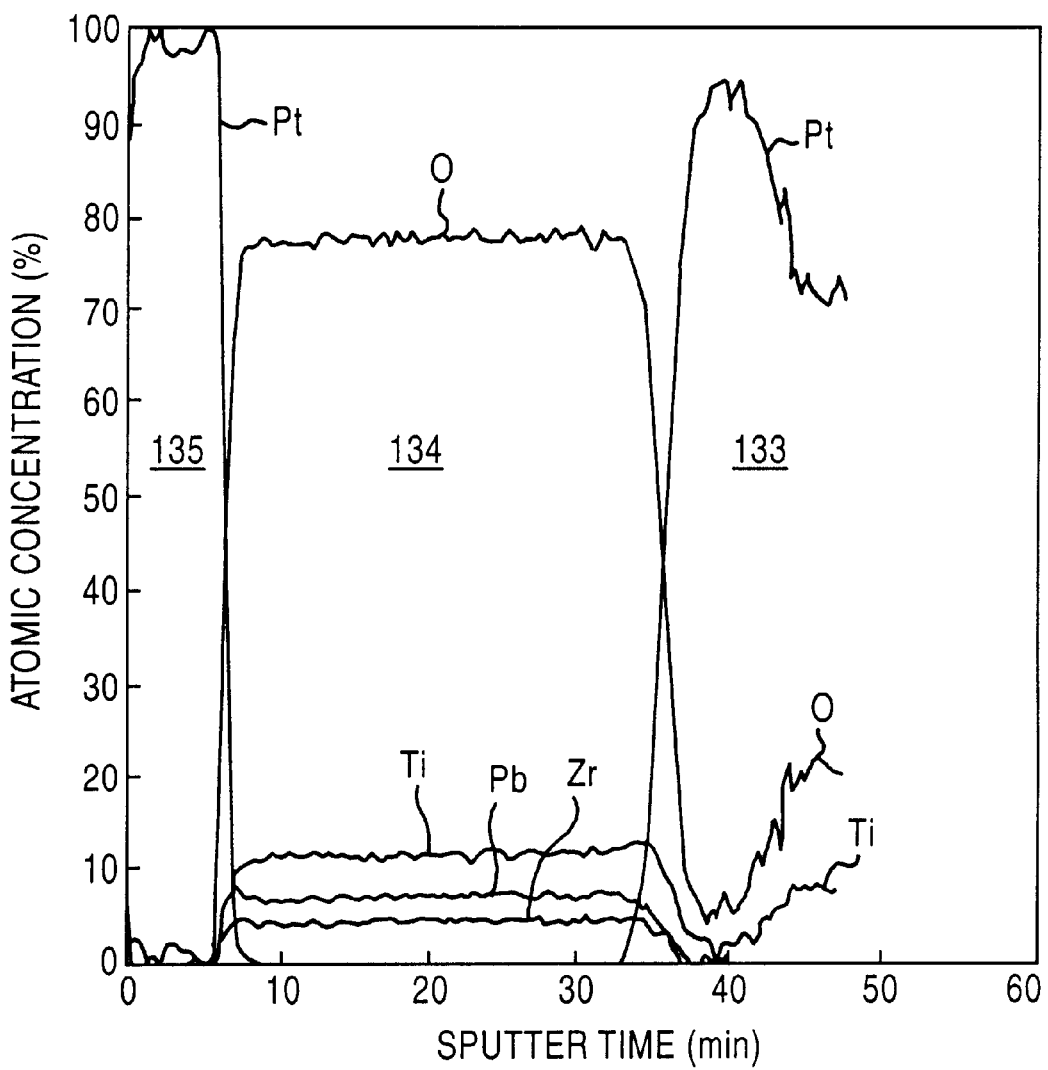
FIG. 15 is a diagram showing the distribution of elements observed in a ferroelectric capacitor formed according to a conventional process.
Figure 16:
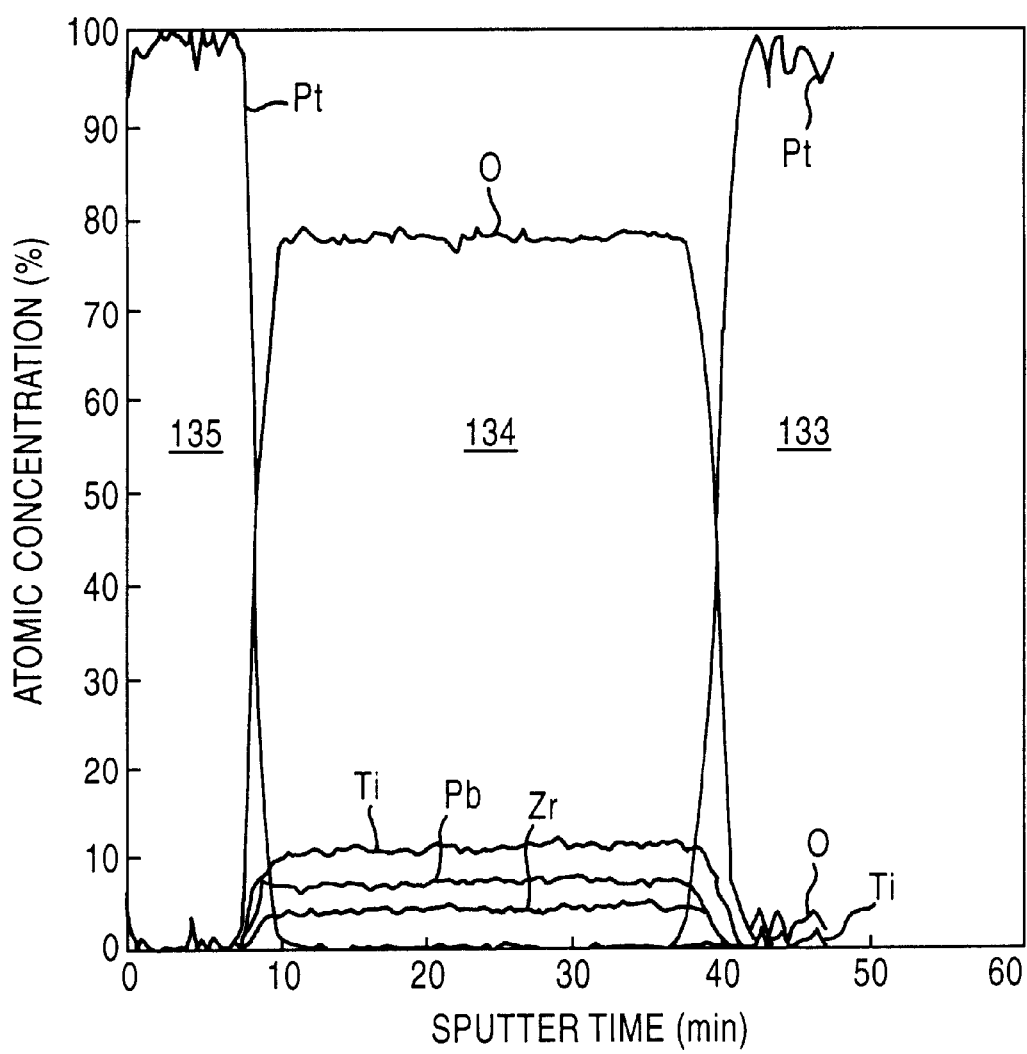
FIG. 16 is a diagram showing the distribution of the elements observed in the ferroelectric capacitor according to the third embodiment.

FIG. 15 shows the distribution of elements obtained by the Auger spectroscopy for the ferroelectric capacitor of FIG. 9B in which the PLZT film 134 is subjected to the oxidizing annealing process alone, while FIG. 16 shows the distribution of the elements obtained also by the Auger spectroscopy for the ferroelectric capacitor 130 in which the PLZT film 134 is subjected to the two-step annealing process of FIG. 10 and the upper electrode 135 is formed in the oxidizing atmosphere. In FIGS. 15 and 16, the vertical axis represents the relative concentration level of the elements such as Pt, Ti, Pb, Zr, and O (oxygen), while the horizontal axis represents the sputter time needed for exposing the part of the capacitor where the Auger analysis is made as a result of the sputter-etching process. Thus, the horizontal axis corresponds to the depth as measured from the top surface of the Pt electrode 135.

Referring to FIG. 15, it can be seen that a substantial amount of oxygen atoms penetrate into the lower electrode 133 and further that a substantial amount of Pt atoms penetrate into the PLZT film 134. In other words, there is an extensive mutual diffusion of Pt and oxygen at the interface between the lower electrode 133 and the PLZT film 134.

In the case of the elemental distribution profile of FIG. 16 in which the two-step annealing process of FIG. 10 is made to the PLZT film 134, on the other hand, it can be seen that the mutual diffusion of oxygen and Pt is effectively suppressed, indicating the densification of the lower electrode 134 as a result of the first phase annealing step of the two-step RTA process in which the thermal annealing process is conducted in the inert atmosphere.

Further, the elemental distribution profiles of FIGS. 15 and FIG. 16 also indicate that the time needed during the Auger spectrum analysis to expose the top surface of the PLZT film 134 by the sputter-etching the upper electrode 135 is substantially longer in the case of FIG. 16 than in the case of FIG. 15, indicating the densification of the upper Pt electrode 135 during the sputter-deposition process conducted in the oxidizing atmosphere.

Thus, the inventor of the present invention made an experiment to confirm the foregoing densification of the Pt upper electrode 135 as noted below.

Figure 17A:
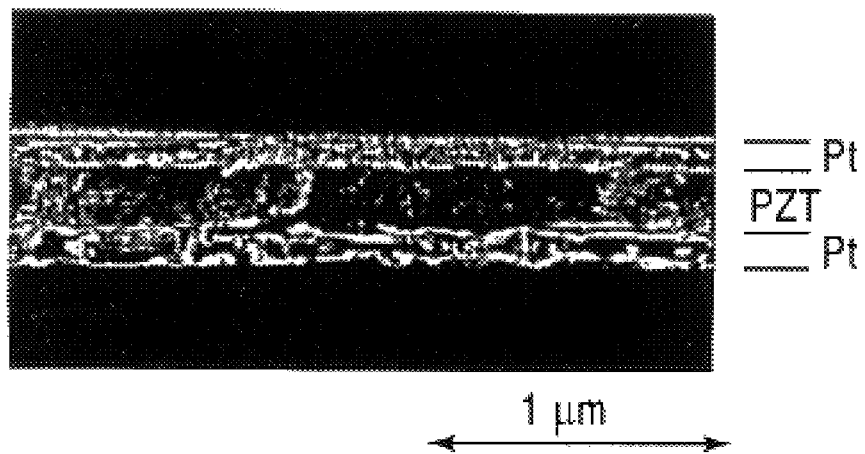
FIGS. 17A and 17B show a TEM cross-section of the ferroelectric capacitor of the third embodiment and corresponding elemental distribution therein.

FIG. 17A shows the cross-section of the ferroelectric capacitor 130 for the case in which the upper electrode 135 is formed by the sputtering process conducted in the oxidizing atmosphere with a thickness of 130 nm. Further, FIG. 17B shows the result of the Auger spectroscopy analysis conducted on the specimen of FIG. 17A.

Figure 17B:
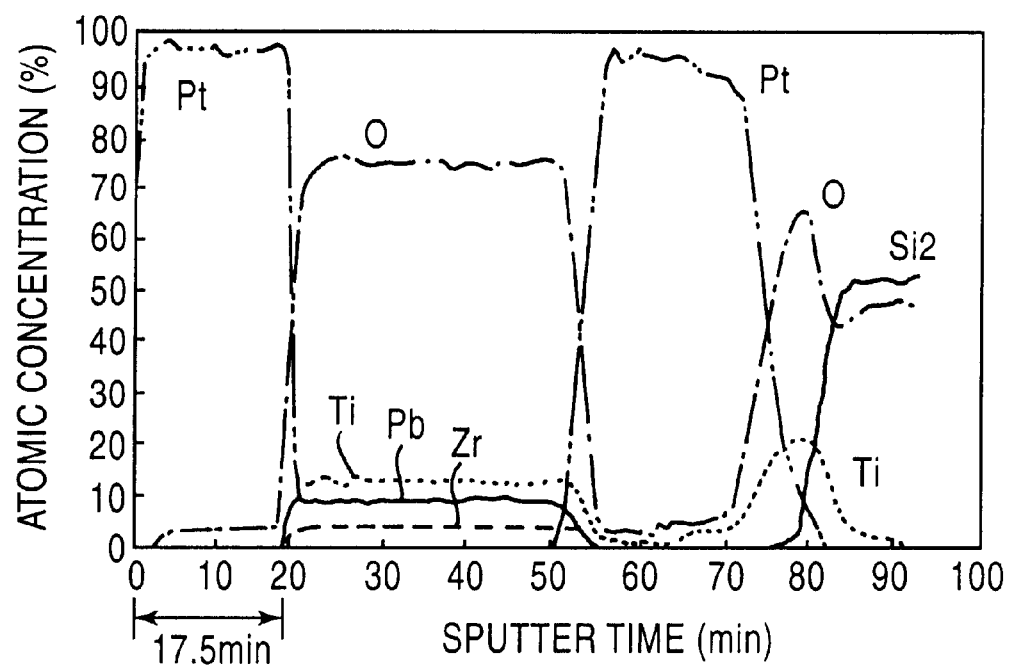

Referring to FIG. 17B, it can be seen that it takes a duration of 17.5 minutes in order to sputter-etch the upper electrode 135 of the thickness of 130 nm. In this case, a sputter-etching rate of 7.43 nm/min is achieved for the upper electrode 135.

Figure 18A:
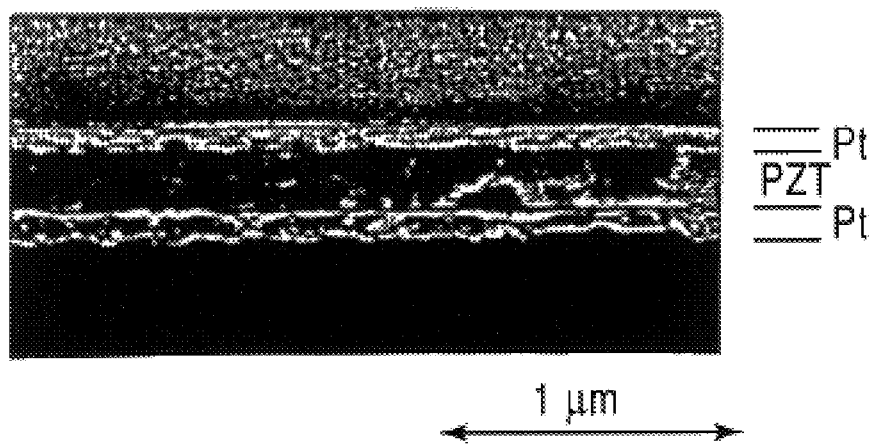
FIGS. 18A and 18B show a TEM cross-section of the ferroelectric capacitor formed according to the conventional process.

FIG. 18A, on the other hand, represents the cross-section of the ferroelectric capacitor having the structure of FIG. 9B in which the upper electrode 135 is formed by a sputtering process conducted in an Ar atmosphere with the thickness of 100 nm. Further, FIG. 18B shows the corresponding elemental distribution profile obtained by the Auger spectroscopy.

Figure 18B:
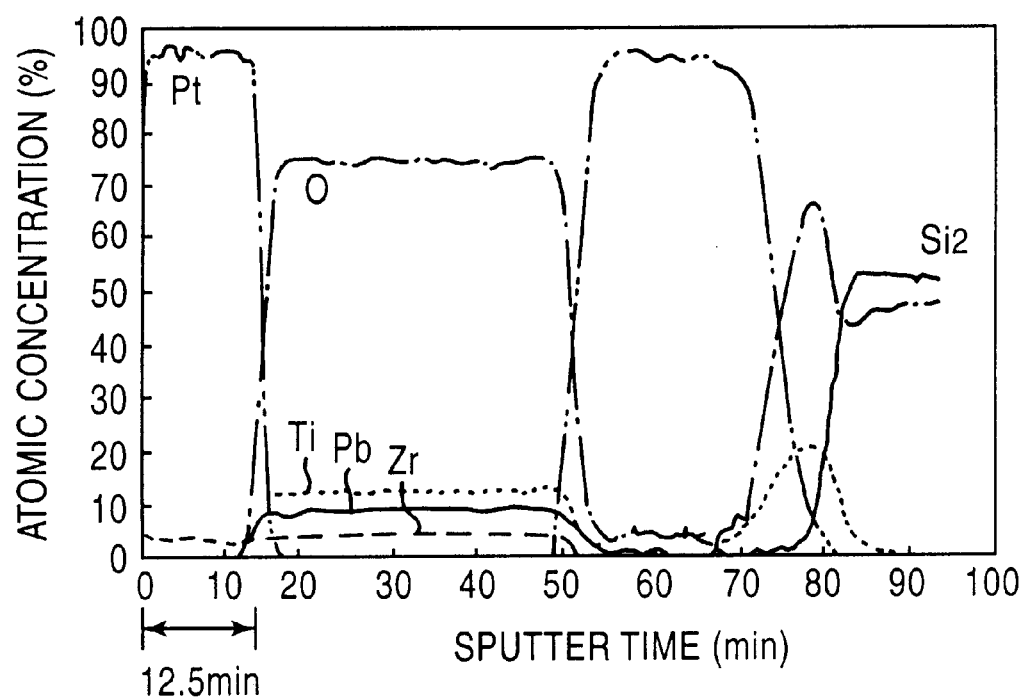

Referring to FIG. 18B, it will be noted that it takes 12.5 minutes for sputter-etching the Pt upper electrode 135 of 100 nm. In this case, the sputter-etch rate of the upper electrode 135 becomes 8.0 nm/min, wherein this sputter-etch rate is larger than the sputter-etch rage obtained from the result of FIG. 17B by about 10%. In other words, the result of FIG. 18B indicates that the Pt upper electrode 135 formed in the inert atmosphere is less dense as compared with the Pt upper electrode 135 of FIG. 17B formed in the oxidizing atmosphere, confirming the result explained with reference to FIGS. 15 and 16.

In the present embodiment, it should be noted that the ferroelectric film 134 is by no means limited to PZT or PLZT but may be formed of BST, SBT, or STO. In the case of using BST or STO, the ferroelectric film 134 in fact becomes a high-dielectric film due to the low Curie temperature of these materials.

Further, it should be noted that the oxidizing atmosphere in the second annealing step of FIG. 10 is by no means limited to the oxygen atmosphere but may be an ozone ($O_3$) atmosphere, NO atmosphere, $N_2O$ atmosphere or $NO_2$ atmosphere. The temperature of the thermal annealing process of FIG. 10 may be 400–900° C. for any of the first step for crystallization and the second step for oxygen compensation.

Further, the upper and lower electrodes 133 and 135 may also be formed of Ir or Ru, or conductive oxide such as $IrO_2$ or $RuO_2$.

[Fourth Embodiment]

Next, the fabrication process of a ferroelectric capacitor according to a fourth embodiment will be described.

In the present embodiment, too, the stacked structure of FIG. 9A is formed on the $SiO_2$ film 132 covering the Si substrate 131, followed by the patterning process of the upper electrode 135, the ferroelectric film 134 and the lower electrode 133 to form the structure of FIG. 9B.

In the present embodiment, on the other hand, the sputtering process for forming the PLZT film 134 is conducted under the condition represented in TABLE XII below, and the PLZT film 134 thus deposited is subsequently crystallized in an oxidizing atmosphere at 750° C. for 60 seconds. In other words, the present embodiment does not use the two-step RTA process of FIG. 10.

TABLE XII

|    | Ar pressure (mTorr) | RF power (kW) | duration (minute) | thickness (nm) |
|----|---------------------|---------------|-------------------|----------------|
| Pt | 10                  | 1.0           | 7                 | 240            |

Table XIII below represents the spontaneous polarization 2Pr, leakage current, 90%-saturation voltage and the state of exfoliation of the upper electrode pattern 135 for the ferroelectric capacitor thus formed, in comparison with a conventional ferroelectric film in which the upper electrode 135 is formed in an inert atmosphere. It should be noted that the 90%-saturation voltage in TABLE XIII is the voltage similar to the voltage shown in TABLE V and represents the voltage needed for causing a 90%-saturation in the polarization of the ferroelectric film 134.

TABLE XIII

|                   | 2Pr ($\mu C/cm^2$) | leakage current ($A/cm^2$)       | 90%-saturation | exfoliation |
|-------------------|--------------------|----------------------------------|----------------|-------------|
| conventional      | 29.7               | (−5.0 V)3.4E−6/1.5E−4(+5.0 V)    | 3.5            | yes         |
| present invention | 31.2               | (−5.0 V)2.2E−6/1.7E−6(+5.0 V)    | 3.5            | no          |

Referring to TABLE XIII, it can be seen that, although there is no substantial difference in the value of 2Pr and the 90%-saturation voltage, the leakage current is reduced by a factor of 100 particularly in the case a positive voltage of +5V is applied to the capacitor. Further, the capacitor of the present embodiment did not show exfoliation in the upper electrode pattern 135A even after the dry etching process conducted under the condition of TABLE X in contrast to the conventional ferroelectric capacitor.

[Fifth Embodiment]

FIGS. 19A–19I are diagrams showing the fabrication process of an FeRAM according to a fifth embodiment of the present invention.

Figure 19A:
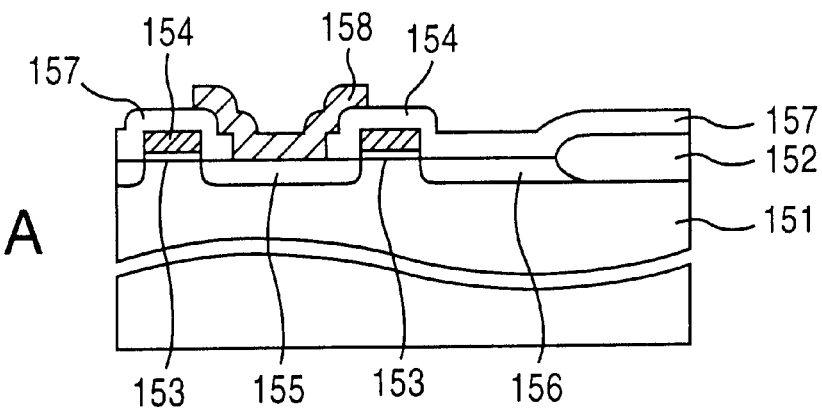
FIGS. 19A–19I are diagrams showing the fabrication process of a semiconductor device having a ferroelectric capacitor according to a fifth embodiment of the present invention.

Referring to FIG. 19A, a memory cell region is defined on a p-type substrate 151 by a field oxide film 152, and a gate insulation film 153 is formed on the Si substrate 151 such that the gate insulation film 153 covers the memory cell region. Further, a gate electrode 154 is formed on the gate insulation film 153 similarly to a conventional MOS transistor. The gate electrode 154 thus formed forms a part of the word line crossing the memory cell region. Further, n-type diffusion regions 155 and 156 are formed in the substrate 151 at both lateral sides of the gate electrode 154 while using the gate electrode 154 as a self-alignment mask.

After the formation of the memory cell transistor as noted above, a $SiO_2$ film 157 is formed on the substrate 151 so as to cover the gate electrode 154, and a contact hole is formed in the $SiO_2$ film 157 so as to expose the diffusion region 155.

After formation of the contact hole, a WSi film is deposited on the $SiO_2$ film 157 including the contact hole, and the WSi film thus deposited makes an electrical contact with the diffusion region 155 at the contact hole. By patterning the WSi film, a bit line electrode 158 is formed as represented in FIG. 19A.

Figure 19B:
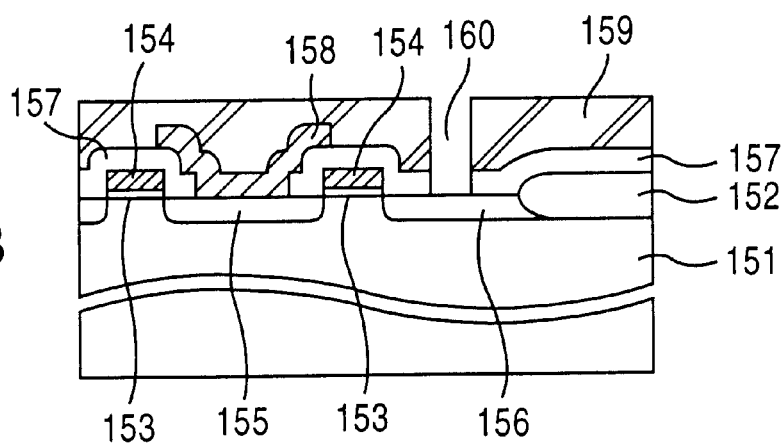

Next, in the step of FIG. 19B, an interlayer insulation film 159 typically of $SiO_2$ is deposited on the structure of FIG. 19A, and, after planarization using a CMP (chemical mechanical polishing) process, a deep contact hole 160 is formed in the interlayer insulation film 159 so as to expose the diffusion region 156.

Figure 19C:
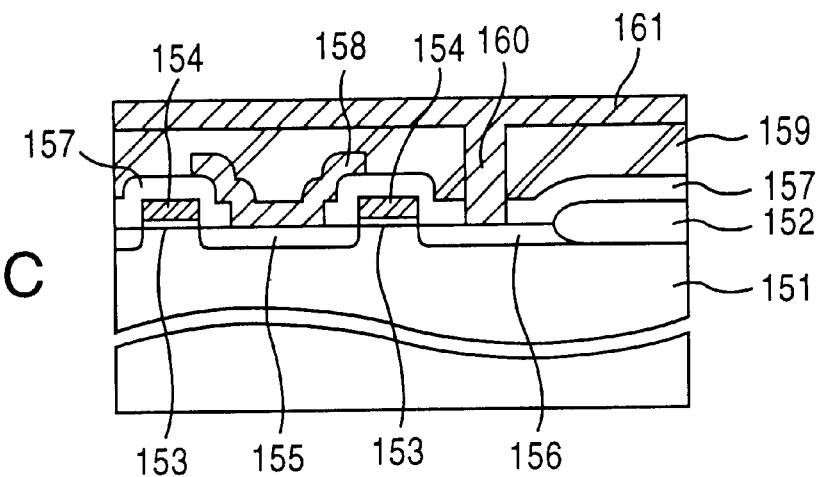

Next, in the step of FIG. 19C, a polysilicon film 161 doped by P to the $n^+$-type is deposited on the structure of FIG. 19B by a CVD process, such that the polysilicon film 161 fills the contact hole 160. Further, the polysilicon film 161 thus deposited is etched back in the step of FIG. 19D by a dry etching process, until the top surface of the interlayer insulation film 159 is exposed. As a result of the step of FIG. 19D, the contact hole 160 is filled by a polysilicon plug 162.

Figure 19D:
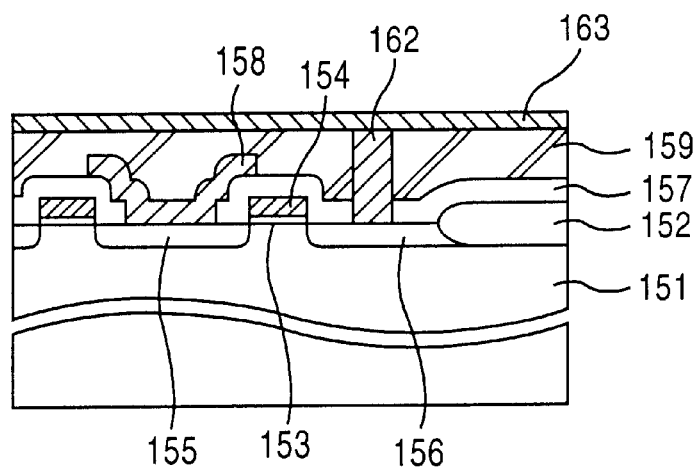

In the step of FIG. 19D, a Ti film (not shown) is deposited further on the interlayer insulation film 159 such that the Ti film covers the polysilicon plug 162, and a conductive film 163 of Pt, Ir, Ru, $IrO_2$ or $RuO_2$, is deposited on the Ti film by a sputtering process, wherein the sputtering process may be conducted according to the condition represented in TABLE VI.

Figure 19E:
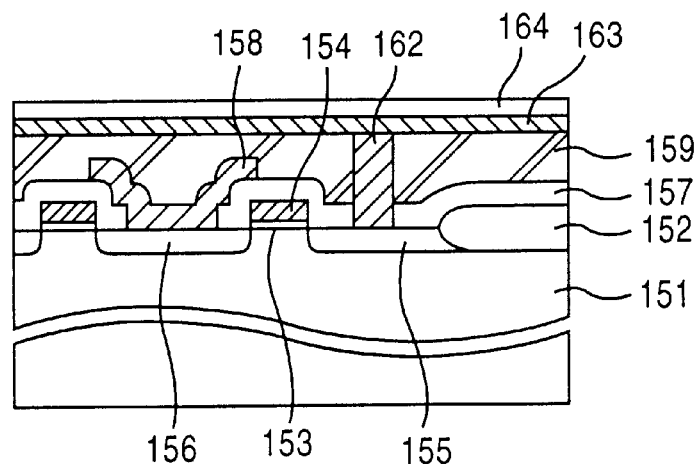

Next, in the step of FIG. 19E, a ferroelectric film 164 of PZT or PLZT is formed on the conductive film 163 by a sputtering process conducted under a condition slightly different from the condition of the foregoing TABLE XIII. Further, the PLZT film 164 is crystallized by applying the two-step RTA process represented in FIG. 10, wherein the crystallization in the inert atmosphere may be made at the temperature of 750° C. Further, as a result of the second RTA step conducted in the oxidizing atmosphere, the oxygen deficiency in the PLZT film 164 is effectively eliminated.

Figure 19F:
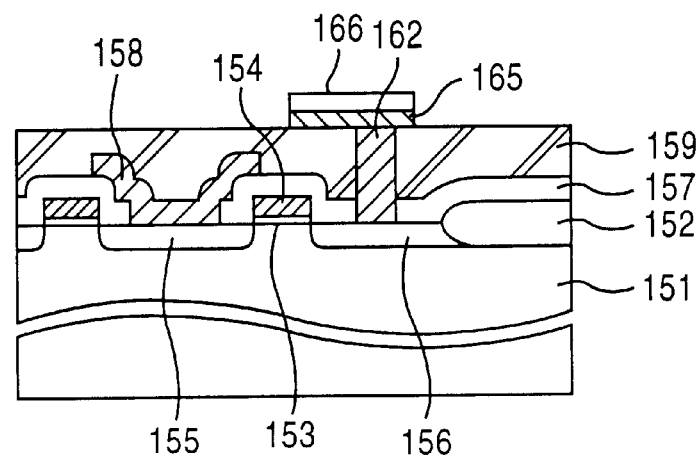

Next, in the step of FIG. 19F, the PZT film 164 and the underlying conductor film 163 are patterned by a plasma etching process conducted according to the condition of the foregoing TABLE XI, and a lower electrode pattern 165 and a capacitor insulation film 166 are formed.

Figure 19G:
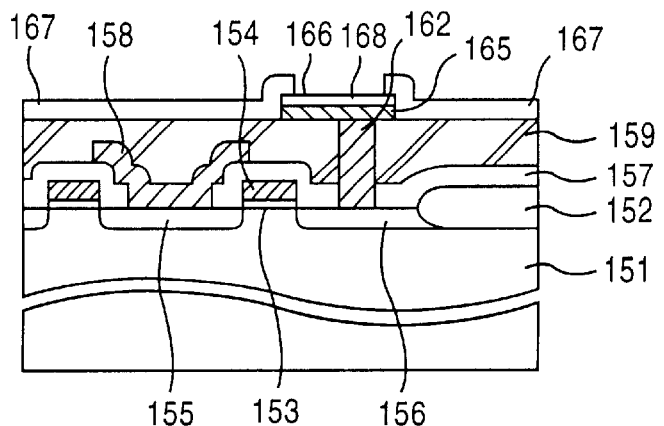
Figure 19H:
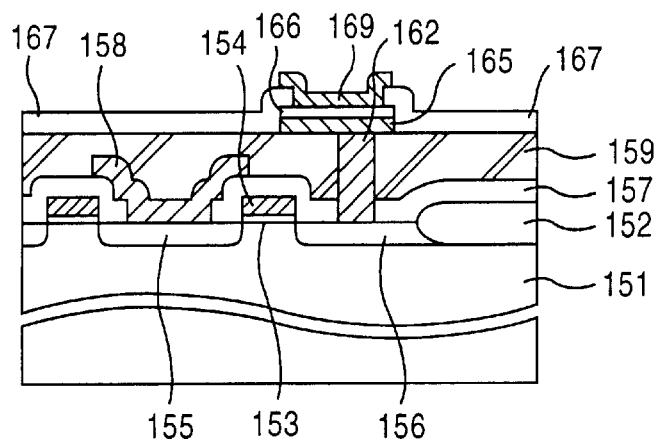

Next, in the step of FIG. 19G, an $SiO_2$ film 167 is deposited on the structure of FIG. 19F by a CVD process such that the $SiO_2$ film 167 covers the capacitor insulation film 166, and a contact hole 168 is formed in the $SiO_2$ film 167 such that the contact hole 168 exposes the capacitor insulation film 166. Further, in the step of FIG. 19H, a Pt pattern 169 is formed on the $SiO_2$ film 167 such that the Pt pattern 169 covers the exposed capacitor insulation film 166, wherein the Pt pattern is formed by a sputtering process conducted in an oxidizing atmosphere under the condition explained with reference to TABLE IX.

Figure 19I:
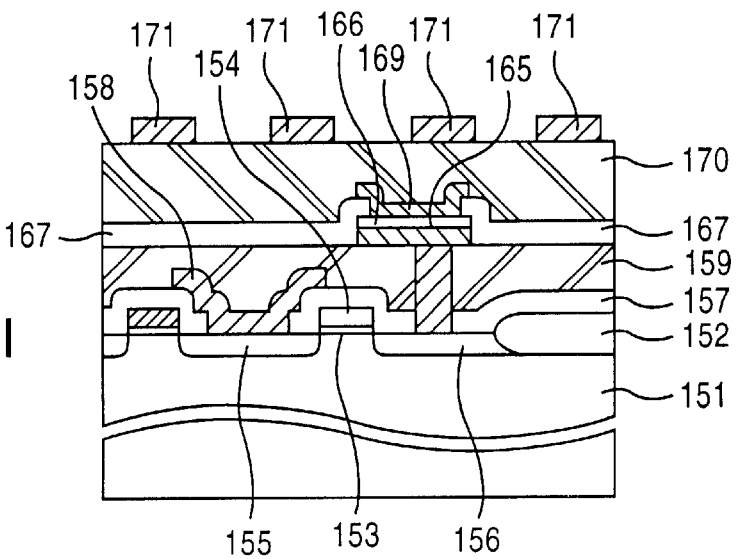

Further, an interlayer insulation film 170 is formed on the $SiO_2$ film 167 in the step of FIG. 19I so as to cover the upper electrode 169, and an interconnection pattern 171 is formed on the interlayer insulation film 170.

According to the FeRAM of the present embodiment, the upper electrode pattern 169, formed in the oxidizing atmosphere, has a densified texture and the mutual diffusion of oxygen and Pt at the interface between the capacitor insulation film 166 and the upper electrode pattern 169 is effectively suppressed. As a result, the spontaneous polarization 2Pr of the capacitor insulation film 166 is maximized. Further, as a result of the use of the two-step RTA process of FIG. 10 for crystallizing the capacitor insulation film 166, the lower electrode pattern 165 also undergoes densification, and the mutual diffusion of oxygen and Pt at the interface between he capacitor insulation film 166 and lower electrode pattern 165 is also minimized. Further, as a result of the foregoing two-step RTA process, the crystal grains in the ferroelectric capacitor insulation film 166 are aligned generally in the <111> direction and the capacitor insulation film 166 shows a large spontaneous polarization preferable to an FeRAM.

In the present embodiment, it should be noted that a DRAM is obtained when BST, SBT or STO is used for the capacitor insulation film 169.

[Sixth Embodiment]

Figure 20:
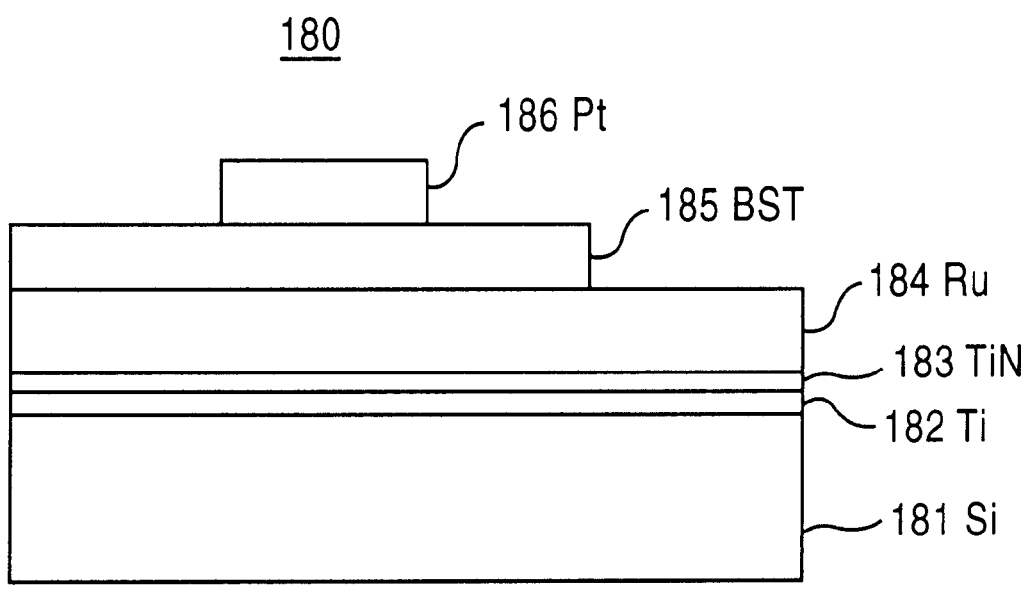
FIG. 20 is a diagram showing the construction of a high-dielectric capacitor according to sixth and seventh embodiments of the present invention.
Figure 21:
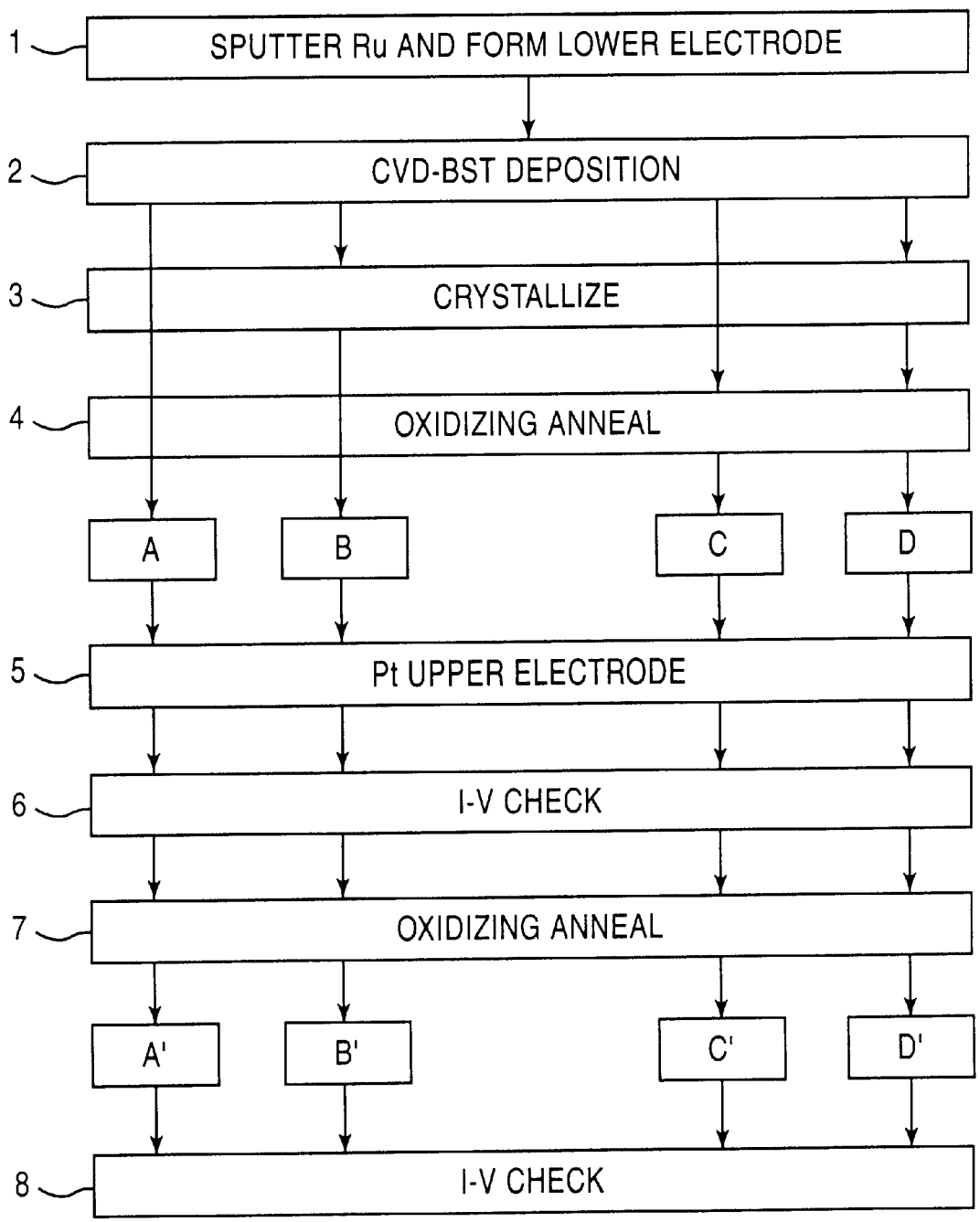
FIG. 21 is a diagram showing the fabrication process of the high-dielectric capacitor of FIG. 20.

FIG. 20 shows the construction of a high-dielectric capacitor 180 according to a sixth embodiment of the present invention while FIG. 21 shows the fabrication process of the high-dielectric capacitor 180.

Referring to FIG. 20, the high-dielectric capacitor 180 is formed on a Si substrate 181 covered by an adhesion layer 182 of Ti and a diffusion barrier layer 183 of TiN, and includes a lower electrode 184 of Ru, a BST film 185 formed on the lower electrode 184, and an upper electrode 186 of Pt formed on the BST film 185.

The Si substrate 181 may be a Si wafer having a (100) surface from which the native oxide film is removed by a 5% HF solution, and the Ti and TiN films 182 and 183 are formed by a DC magnetron sputtering process conducted at a substrate temperature of 350° C. with respective thicknesses of 30 nm and 50 nm.

On the TiN diffusion barrier layer 183, the lower electrode 184 of Ru is formed in the step 1 of FIG. 21 by a D.C. magnetron sputtering process under a condition similar to the one used for forming the Ti layer 182 and the TiN layer 183 with a thickness of about 500 nm, and the BST film 185 is formed in the following step 2 of FIG. 21, wherein the BST film is formed with a thickness of about 60 nm by a CVD process that uses tetraisopropoxy titanium (Ti[i-$OC_3H_7]_4$), bistetramethylheptandionato strontium-tetraen adduct ($Sr[THD]_2$-tetraen) and bistetramethylheptandionato barium-tetraen adduct ($Ba[THD]_2$-tetraen adduct) for the source materials together with an Ar carrier gas. The CVD process may be conducted under a pressure of 5 Torr while setting the substrate temperature to 450° C. and the oxygen partial pressure to 2.5 Torr. In the foregoing condition, the BST film 185 is deposited with a deposition rate of about 1 nm/min.

After the step 2, the BST film 185 thus deposited is subjected to a crystallization process in the following step 3 together with the underlying Ru electrode 184, wherein the crystallization in the step 3 is conducted in an Ar atmosphere for 10 minutes under a pressure of 5 Torr while setting the substrate temperature to 550° C.

After the step 3, the BST film 185 is subjected to a thermal annealing process conducted in the air in the step 4 of FIG. 21, wherein the BST film 185 is exposed to the temperature of 400° C for 10 minutes. As a result of the thermal annealing process in the step 4, the oxygen deficiency formed in the BST film 185 is compensated.

After the step 4, a step 5 is conducted in which a Pt film is deposited on the BST film 185 by a D.C. magnetron sputtering process while using a mask with a thickness of 100 nm, to form the Pt upper electrode 186, wherein the BST film 185 is subjected to a wet etching process, to expose the Ru lower electrode 184. The wet etching process may be conducted in an aqueous solution of 5% HF. The high-dielectric capacitor 180 thus obtained is then subjected to a testing process in the step 6 for characterization of the electrical properties.

After the testing in the step 6, the high-dielectric capacitor 180 is annealed in the air in the step 7 at 400° C. for 10 minutes, and the test of the electrical properties is conducted again to the high-dielectric capacitor 180 thus processed.

Figure 22:
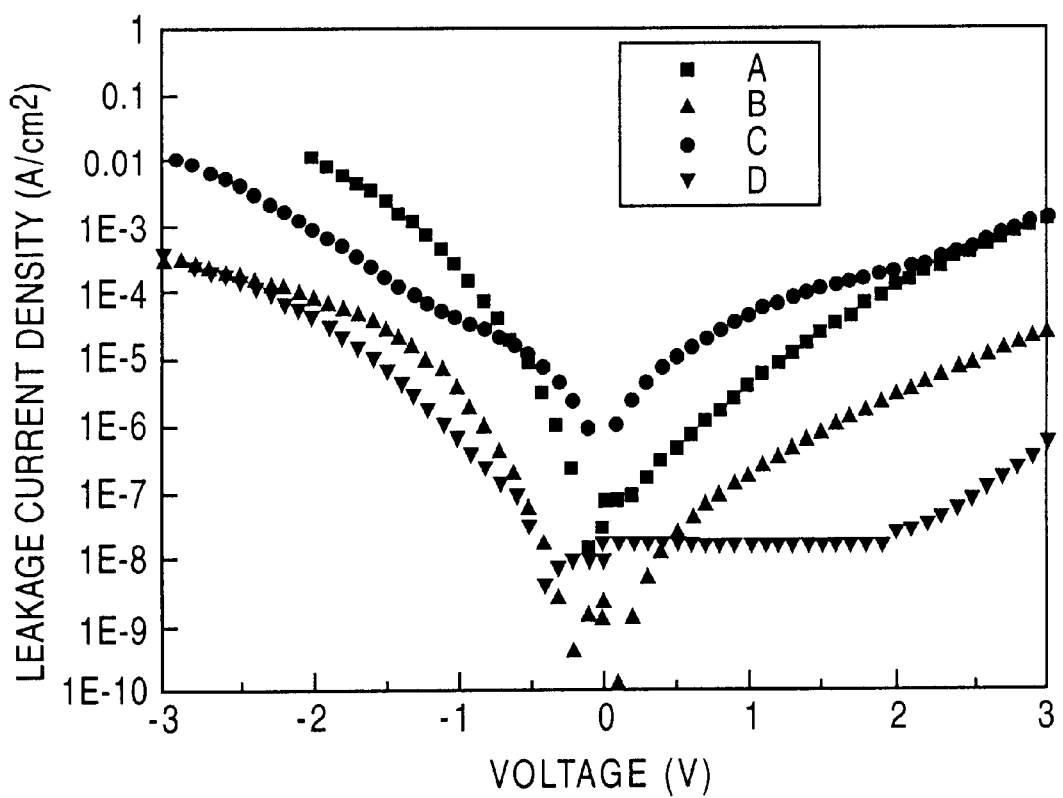
FIG. 22 is a diagram showing the leakage current of the high-dielectric capacitor of FIG. 20.

FIG. 22 shows the leakage current of the high-dielectric capacitor obtained in the step 6 of FIG. 21.

Referring to FIG. 22, it can be seen that there flows a substantial leakage current in the specimens A, B and C, in which the specimen A uses the as-formed BST film for the capacitor insulation film 185, the specimen B uses the BST film 185 in which only the crystallizing step 3 is applied, and the specimen C uses the BST film 185 in which only the oxidizing step 4 is applied. On the other hand, it will be noted from FIG. 22 that the leakage current is reduced substantially in the specimen D in which the BST film 185 is applied with both the crystallization process of the step 3 and the oxidizing process of the step 4.

Figure 23:
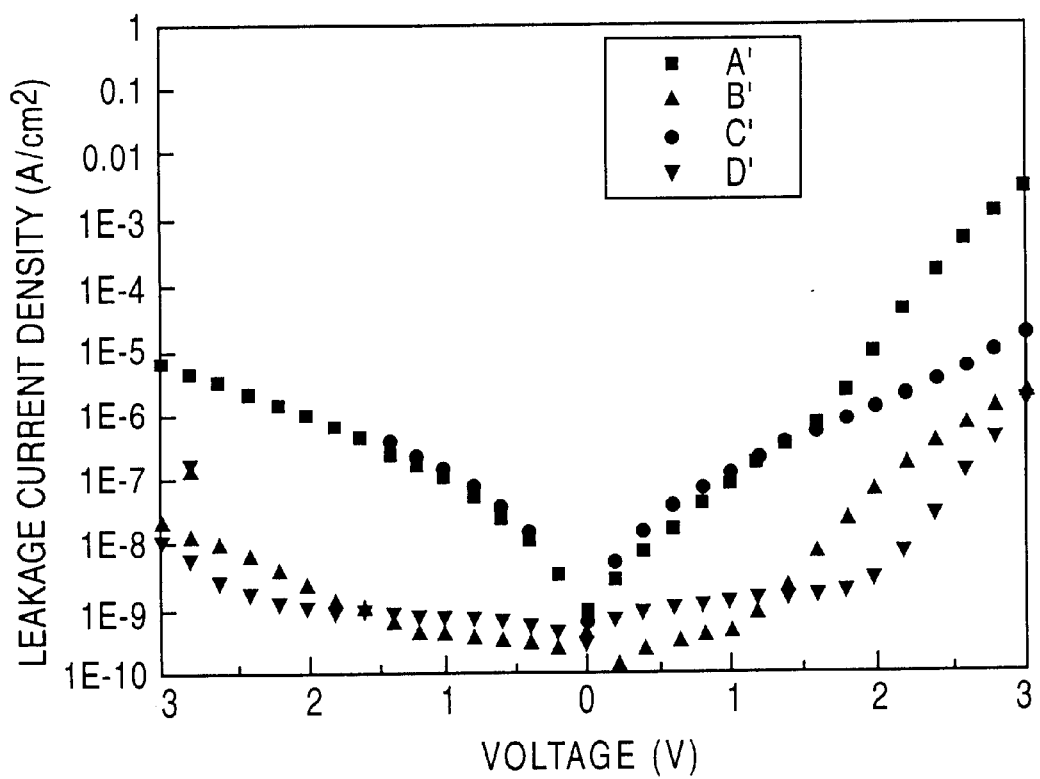
FIG. 23 is another diagram showing the leakage current of the high-dielectric capacitor of FIG. 20.

FIG. 23 shows the result of the test conducted to the specimens A'–D', wherein the specimens A'–D' correspond respectively to the specimens A–D except that the specimens A'–D' are subjected to the additional oxidation process in the step 7.

Referring to FIG. 23, it can be seen that the leakage current is reduced in each of the specimens A'–D' as a result of the additional oxidation step 7, wherein the decrease of the leakage current appears particularly distinct in the specimen D'.

Figure 24:
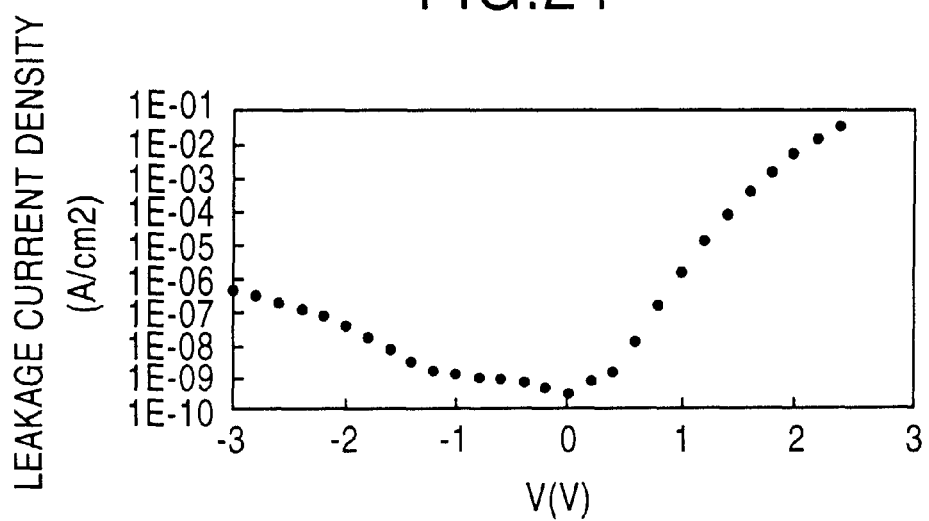
FIG. 24 is a further diagram showing the leakage current of the high-dielectric capacitor of FIG. 20.
Figure 25:
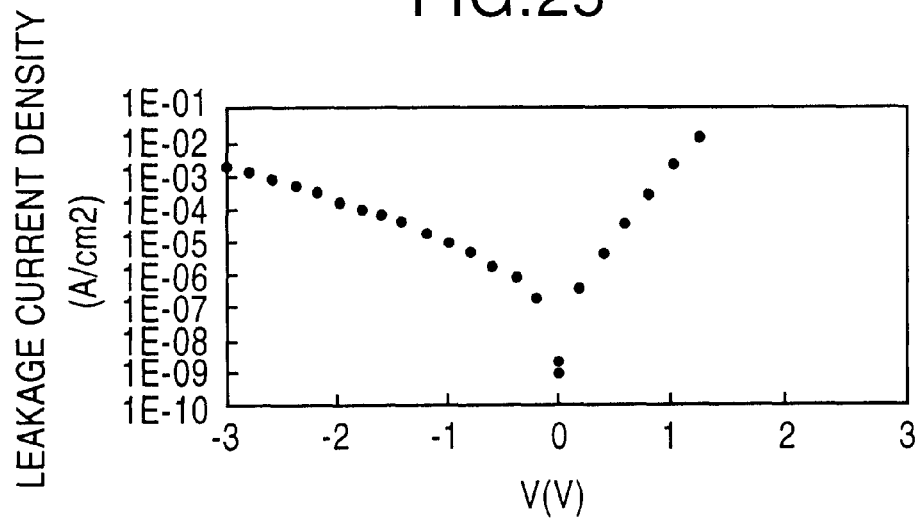
FIG. 25 is a further diagram showing the leakage current of the high-dielectric capacitor of FIG. 20.

Further, FIG. 24 shows the leakage current of the high-dielectric capacitor 180 of FIG. 20 corresponding to the specimen A of FIG. 21 but formed under a slightly different condition, while FIG. 25 shows the leakage current of the capacitor of FIG. 20 corresponding to the specimen B of FIG. 21 in which the BST film 185 is subjected to a rapid thermal annealing process in an $N_2$ atmosphere (RTN) at the temperature of 700° C. Further, FIG. 26 shows the leakage current of the capacitor of FIG. 20 corresponding to the specimen D of FIG. 21 in which the crystallizing thermal annealing process is applied to the BST film 185 in the $N_2$ atmosphere at various temperatures, followed by an oxidizing thermal annealing process conducted in an oxidizing atmosphere.

Figure 26:
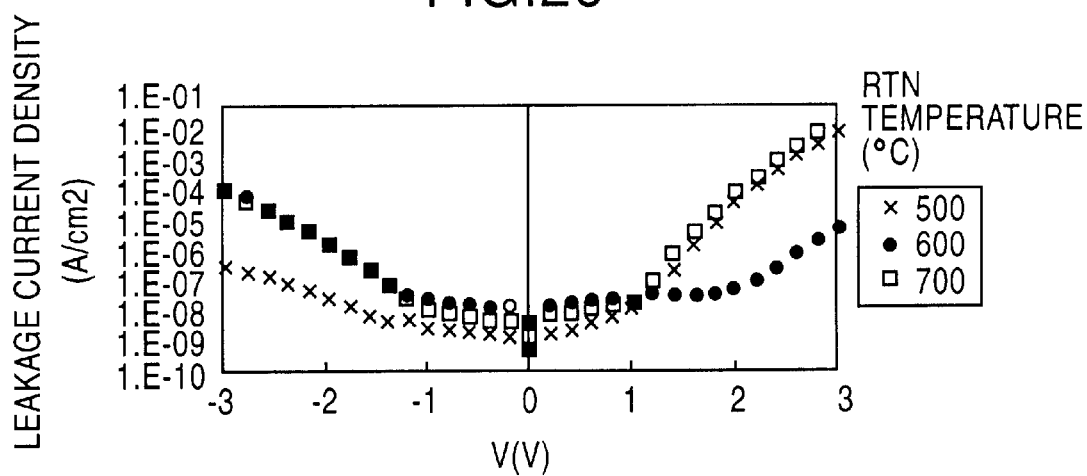
FIG. 26 is a further diagram showing the leakage current of the high-dielectric capacitor of FIG. 20.

As will be understood from FIGS. 24–26, the leakage current is suppressed to the level of $1×10^{-8}–1×10^{-9}$ A/cm² irrespective of the polarity of the voltage applied to the capacitor, as long as the magnitude of the voltage is held within about 1 V.

Figure 27:
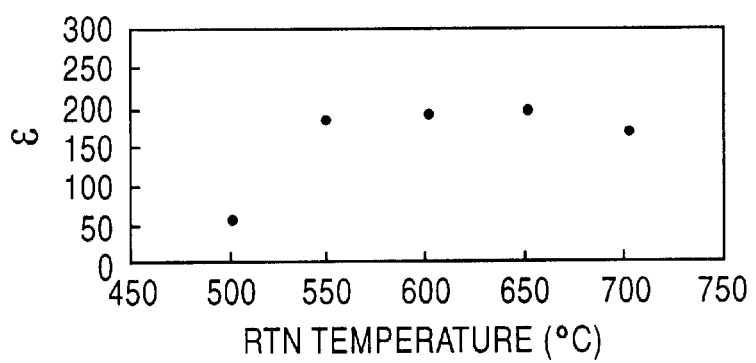
FIG. 27 is a further diagram showing the leakage current of the high-dielectric capacitor of FIG. 20.

Further, FIG. 27 represents the relationship between the relative dielectric constant of the capacitor insulation film 185 of the high-dielectric capacitor 180 and the temperature of the crystallizing thermal annealing step 3 of FIG. 21.

FIG. 27 indicates that the relative dielectric constant E of the capacitor insulation film is maximized when the temperature of the crystallizing thermal annealing process is in the range of about 550–650° C.

By using the high-dielectric capacitor of FIG. 20 in the FeRAM of FIG. 19I in place of the ferroelectric capacitor, it becomes possible to construct a DRAM having a memory cell capacitor of very large capacitance. The DRAM having such a high-dielectric capacitor is suitable for the next generation DRAMs having the storage capacity of 256 Mbit or 1 Gbit, as it is possible to secure a sufficient capacitance for the memory cell capacitor even when the semiconductor device is extremely miniaturized by a submicron process.

[Seventh Embodiment]

Next, the fabrication process of a high-dielectric capacitor according to a seventh embodiment of the present invention will be described with reference to FIG. 28.

Figure 28:
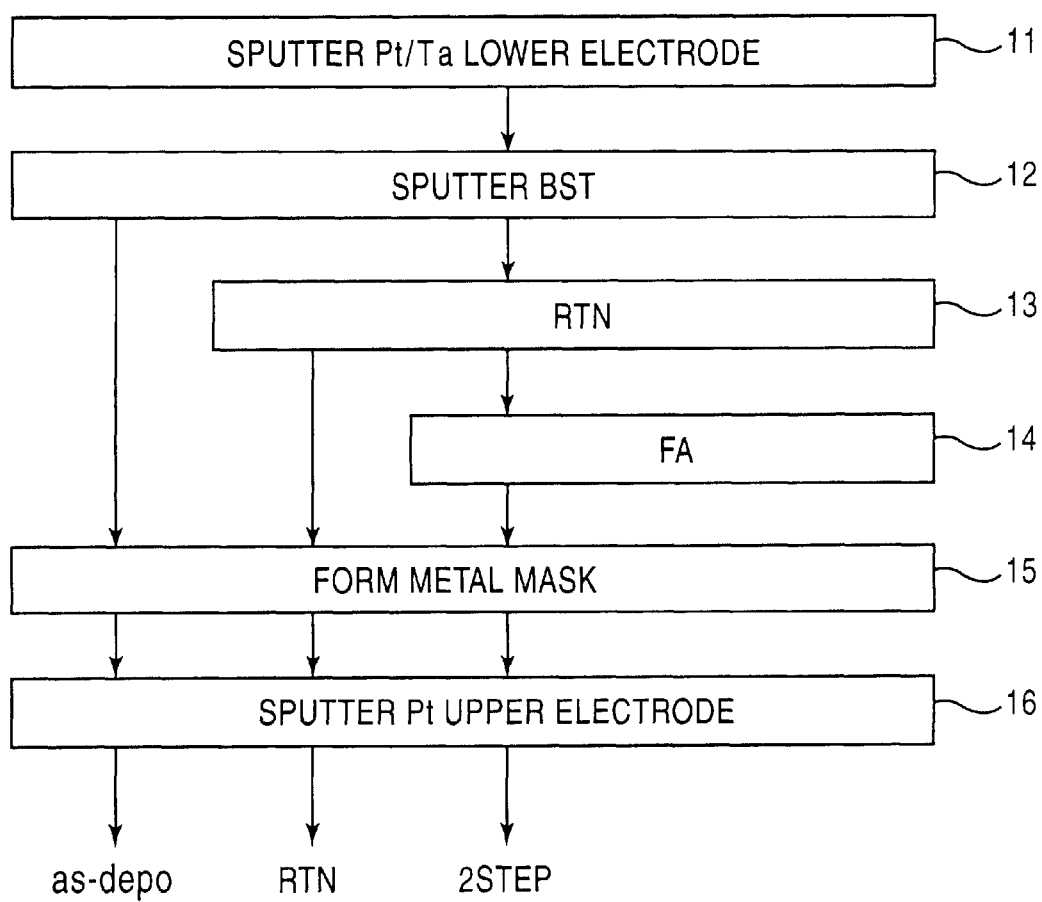
FIG. 28 is a diagram showing the fabrication process of a high-dielectric capacitor according to an eighth embodiment of the present invention.

The high-dielectric capacitor of the present invention has a construction similar to the high-dielectric capacitor of FIG. 20 except that the Ti adhesion layer 182 and the TiN diffusion barrier layer 183 are replaced by a single Ta film and that a Pt electrode is used in place of the Ru lower electrode 184 and is fabricated according to the process of FIG. 28 which is similar to the process of FIG. 21. Thus, in the description hereinafter, those parts of the high-dielectric capacitor corresponding to the parts described previously are designated by the same reference numerals and the description thereof will be omitted.

In the present embodiment, the process step 4 of FIG. 21, in other words the thermal annealing process in the oxidizing atmosphere is conducted under a condition such that the lower electrode 184 of Pt experiences little oxidation.

More specifically, the process of FIG. 28 starts with the step 11 in which a Ta film and a lower electrode of Pt, respectively represented by the numerals 182 and 184, are formed on the Si substrate 181 with a thickness of 30 nm by conducting a D.C. sputtering process at a substrate temperature of 500° C.

Next, in the step 12, the BST film 185 is formed on the lower Pt electrode 184 by an R.F. sputtering process conducted at a substrate temperature of 400° C. with a thickness of about 50 nm.

In the present embodiment, the structure thus obtained is subjected, in the next step 13, to a rapid thermal annealing process conducted in the $N_2$ atmosphere of ordinary pressure (RTN process), wherein the temperature is increased rapidly to 700° C. with a rate of 100° C./min and held for 60 seconds.

After the crystallization, the specimen thus processed in the step 13 is introduced into a diffusion furnace having a quartz tube in the step 14 and is subjected to a thermal annealing process at 400° C. for 30 minutes while exposing to the 100% oxygen atmosphere of the ordinary pressure. As a result of the oxidizing annealing process in the step 14, the oxygen deficiency formed in the BST film 185 is compensated. It should be noted that the foregoing temperature of oxidizing annealing of the step 14 is set so that there occurs no substantial oxidation in the lower electrode 184.

After the step 14 for the oxygen compensation, a step 15 is conducted in the present embodiment in which a metal mask having an aperture of 0.1 mm radius is formed on the BST film 185, and the upper electrode 186 of Pt is formed in the next step 16 so as to make a contact with the BST film 185 across the metal mask.

Figure 29:
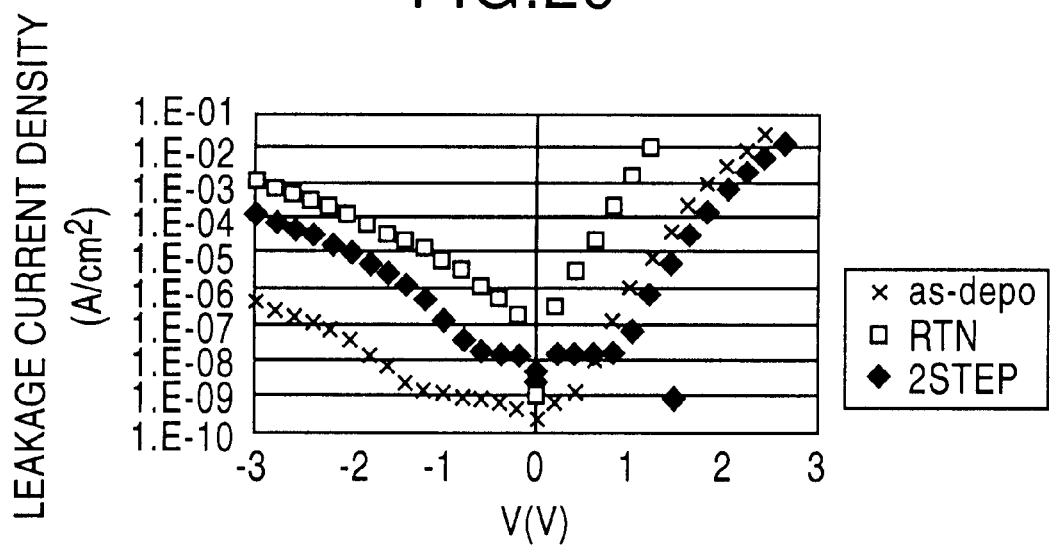
FIG. 29 is a diagram showing the leakage current of the high-dielectric capacitor of the eighth embodiment.

FIG. 29 shows the leakage current of the high-dielectric capacitor thus formed, wherein the leakage current designated by the solid diamonds and represented by "2step" corresponds to the specimen that has been formed by conducting all the steps 11–16 of FIG. 29, while the leakage current designated by the open squares and represented by "RTN" corresponds to the specimen in which the step 14 is skipped. Further, the leakage current designated by the cross marks and designated by "as-depo" corresponds to the specimen in which the steps 13 and 14 are skipped.

Referring to FIG. 29, the capacitor represented by the open squares (RTN) shows a substantially increased leakage current as compared with the capacitor represented by the cross-marks, while the leakage current is improved in the capacitor represented by the diamond marks as a result of the oxidizing thermal annealing process conducted for compensating for the oxygen deficiency.

Figure 30:
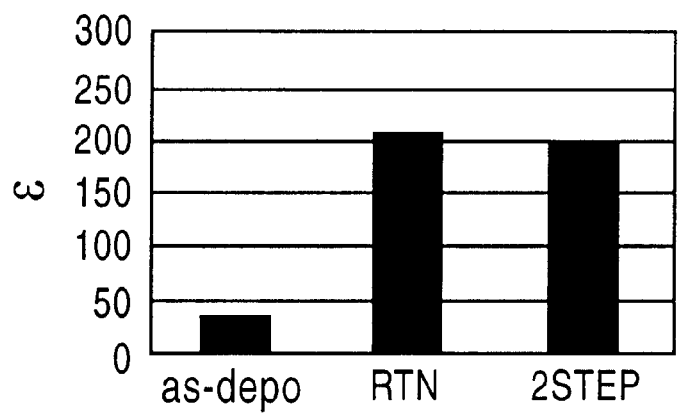
FIG. 30 is a diagram showing the relative dielectric constant of the high-dielectric capacitor of the eighth embodiment.

FIG. 30 shows the relative dielectric constant of the capacitors of FIG. 29.

As can be seen in FIG. 30, the relative dielectric constant of the "as-depo" capacitor, while providing an excellent leakage characteristic as represented in FIG. 29, has a very low relative dielectric constant, smaller than 50. This clearly indicates the poor degree of crystallization of the BST film 185 in the capacitor. In the case of the capacitor designated as "RTN" and "2step", on the other hand, it can be seen that the relative dielectric constant is increased substantially and a value of about 200 is achieved.

Figure 31:
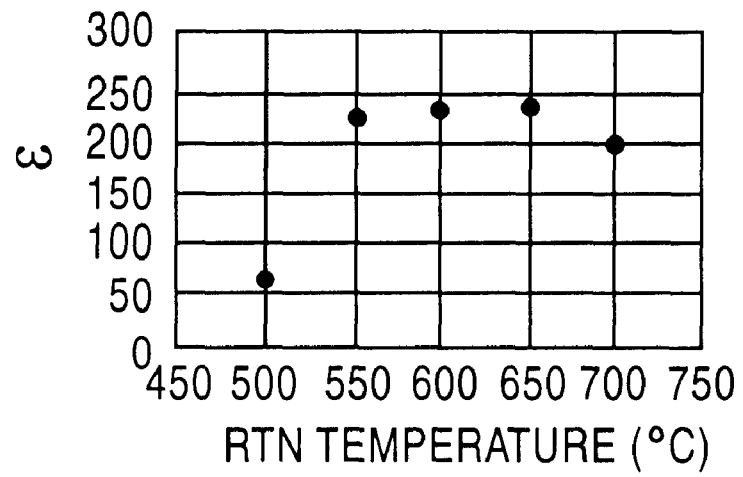
FIG. 31 is another diagram showing the relative dielectric constant of the high-dielectric capacitor of the eighth embodiment.

FIG. 31 shows the result of the measurement of the relative dielectric constant conducted on the capacitor represented as "2step" while changing the temperature of crystallization process of the step 13 variously.

Referring to FIG. 31, it can be seen that the value of the relative dielectric constant of the BST film 185 is only about 50 when the temperature of the crystallization process is at about 500° C. On the other hand, when the temperature is increased to about 550° C., it can be seen that the relative dielectric constant increases sharply and reach the value of about 200. On the other hand, when the temperature of crystallization is increased further beyond 650° C. and reach 700° C., it can be seen that the relative dielectric constant starts to decrease.

Figure 32:
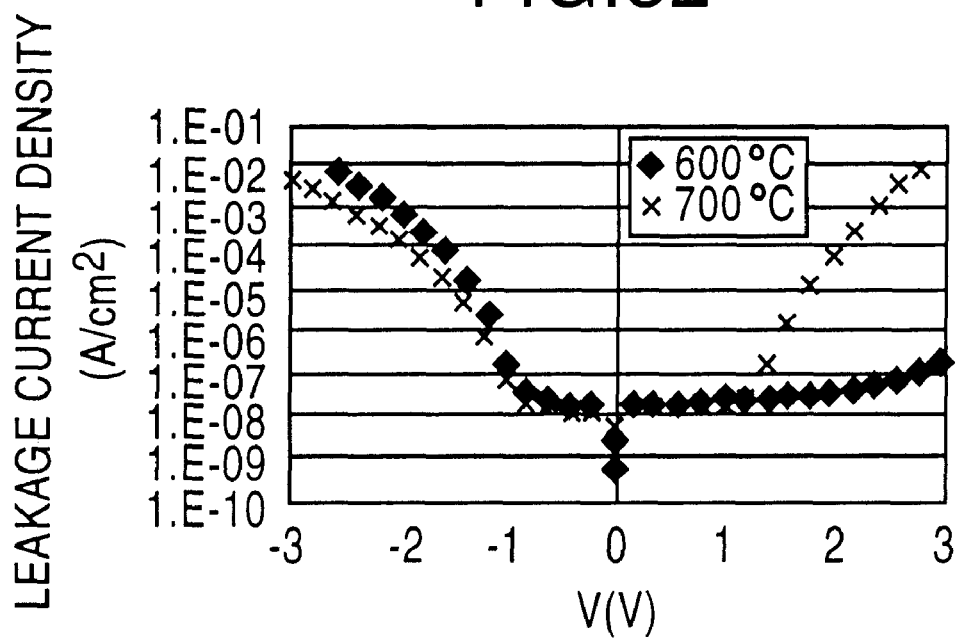
FIG. 32 is a diagram showing the leakage current of the high-dielectric capacitor of the eighth embodiment.

FIG. 32 compares the leakage current of the specimen of FIG. 31 for the case in which the temperature of crystallization is set to 600° C. and the case in which the temperature of crystallization is set to 700° C.

Referring to FIG. 32, it will be noted that the leakage current is reduced substantially when the crystallization of the BST film 185 is conducted at 600° C. as compared with the case in which the crystallization is conducted at 700° C. in the state a positive voltage exceeding 1 V is applied to the capacitor.

Summarizing above, it is preferable, in a high-dielectric capacitor in which the BST film 185 is formed on the Pt electrode 184, to conduct the crystallization process of the BST film 185 in the $N_2$ or inert atmosphere at the temperature higher than about 550° C. but lower than about 700° C., preferably lower than about 650° C. and to conduct the oxidizing annealing process of the BST film 185 at the temperature of about 400° C. in which no substantial oxidation occurs in the Pt electrode 184. By doing so, improvement of the relative dielectric constant and decrease of the leakage current are achieved simultaneously.

[Eighth Embodiment]

Next, the fabrication process of a high-dielectric capacitor according to an eighth embodiment of the present invention will be described with reference to FIG. 33.

The high-dielectric capacitor of the present embodiment has a structure substantially identical with the high-dielectric capacitor of FIG. 20 and the description thereof will be omitted.

In the present embodiment, the thermal annealing process corresponding to the step 4 of FIG. 21 and conducted in the oxidizing atmosphere for oxygen compensation is conducted under a condition chosen such that no substantial oxidation occurs in the Ru lower electrode 184.

Figure 33:
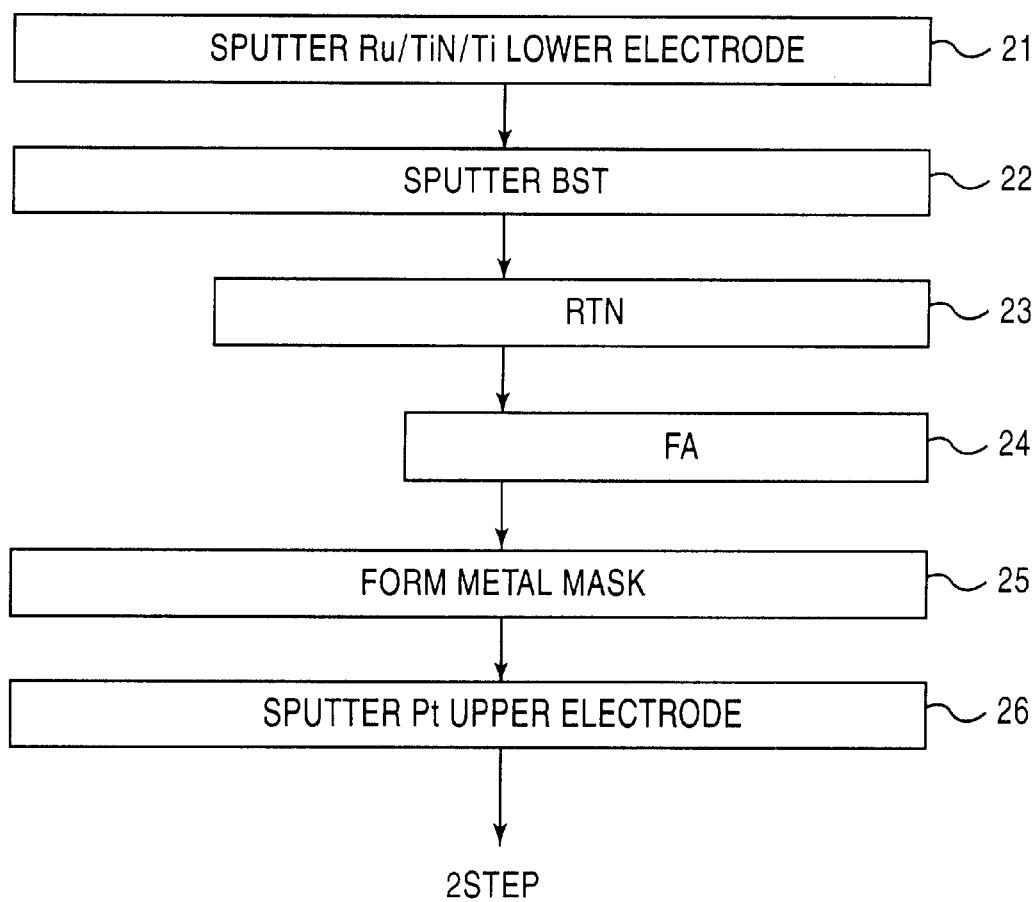
FIG. 33 is a diagram showing the fabrication process of a high-dielectric capacitor according to a ninth embodiment of the present invention.

More specifically, the fabrication process starts with the step 21 of FIG. 33 corresponding to the step 1 of FIG. 21 in which the Ti adhesion layer 182, the TiN diffusion barrier layer 183 and the lower electrode 184 of Ru are deposited consecutively on the Si substrate 181 by a D.C. sputtering process under a substrate temperature of 300° C., respectively with the thicknesses of 20 nm, 50 nm and 500 nm. Further, in the step 33 corresponding to the step 2 of FIG. 21, the BST film 185 is formed on the lower electrode 184 of Ru with a thickness of about 30 nm by conducting an R.F. sputtering process at a substrate temperature of 400° C.

Next, in the step 23 corresponding to the step 3 of FIG. 21, the structure thus obtained is subjected to a rapid thermal annealing process conducted in an inert atmosphere of ordinary pressure such as the $N_2$ atmosphere (RTN process), wherein the temperature is increased to about 600° C. with a rate of 100° C./min. By holding the temperature at 600° C. of 60 seconds, crystallization is induced in the BST film 185.

After the crystallization step 23, the specimen is introduced into a quartz tube of a diffusion furnace in the step 24 corresponding to the step 4 of FIG. 21 and exposed to the 100% oxygen atmosphere of ordinary pressure at 400° C. for 30 minutes. As a result of the thermal annealing process of the step 24, the oxygen deficiency inducted in the BST film 185 as a result of the previous process is effectively compensated. In the step 24, it should be noted that the temperature of thermal annealing is chosen such that there occurs no substantial oxidation in the Ru lower electrode 184.

After the step 23, a step 25 is conducted in which a metal mask having an aperture of 0.1 mm radius is provided on the BST film 185 and the upper electrode 186 of Pt is formed on the metal mask in electrical contact with the BST film 185 at the foregoing aperture.

Figure 34:
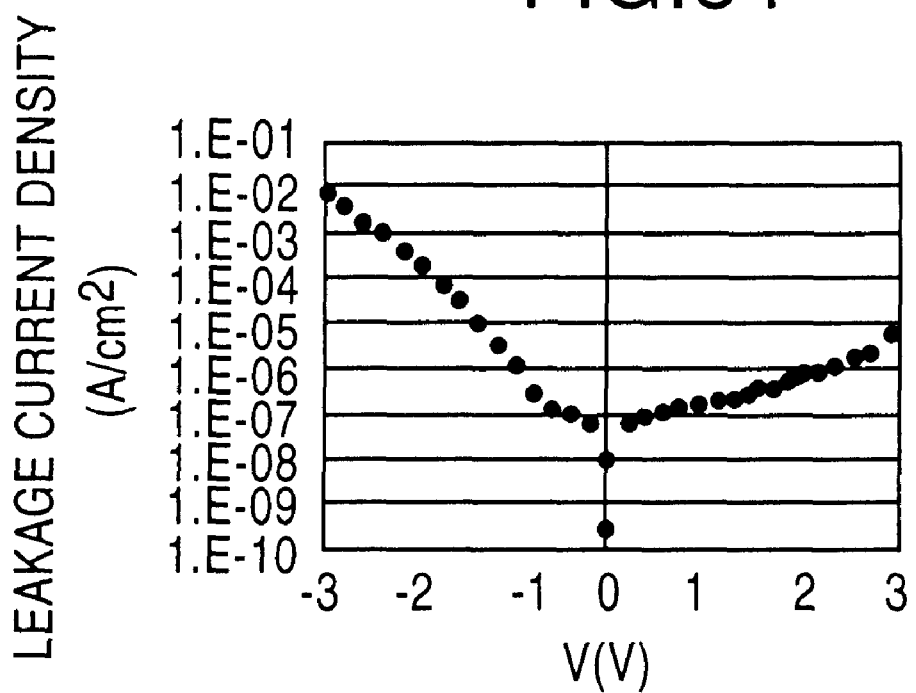
FIG. 34 is a diagram showing the leakage current of the high-dielectric capacitor of the ninth embodiment.

FIG. 34 shows the leakage current of the high-dielectric capacitor of the present embodiment.

Referring to FIG. 34, the high-dielectric capacitor of the present embodiment has an excellent leakage characteristic similar to that of the previous embodiment. In other words, no substantial increase of the leakage current is observed even when the lower electrode 184 is changed from Pt to Ru. Further, the BST film 185 of the present embodiment showed the relative dielectric constant of about 250.

In the case the foregoing crystallization process of the step 23 and the oxidizing step 24 of FIG. 33 are conducted in the form of a single annealing step in an oxidizing atmosphere at the temperature exceeding 400° C., on the other hand, it was observed that there occurs a substantial oxidation not only in the lower electrode 184 of Ru but also in the TiN layer 183 or the Ti layer 182 caused by the oxygen atoms diffused from the BST film 185. Associated therewith, there tends to occur a formation of irregular surface in these layers, and the TiN layer 183 may no longer function as the diffusion barrier. Further, there may be caused a short-circuit between the upper electrode 186 and the lower electrode 184. It should be noted that the oxidation of the TiN barrier layer 183 may cause the problem of poor conduction between the lower electrode 184 and the memory cell transistor.

In the present embodiment, the foregoing various problems are successfully avoided by conducting the crystallization process and the oxidizing process separately, and by choosing the temperature of the oxidizing process so that there occurs no substantial oxidation in the Ru lower electrode 184, TiN barrier layer 183 or the Ti layer 182.

In the present invention, it should further be noted that no substantial oxidation occurs during the crystallization step 23 as the crystallization step 23 is conducted in the inert atmosphere. This, on the other hand, means that the crystallization step 23 can be conducted in the present embodiment at any desirable temperature without risking the oxidation of the lower electrode, and the relative dielectric constant of the BST film 185 is successfully maximized.

Figure 35:
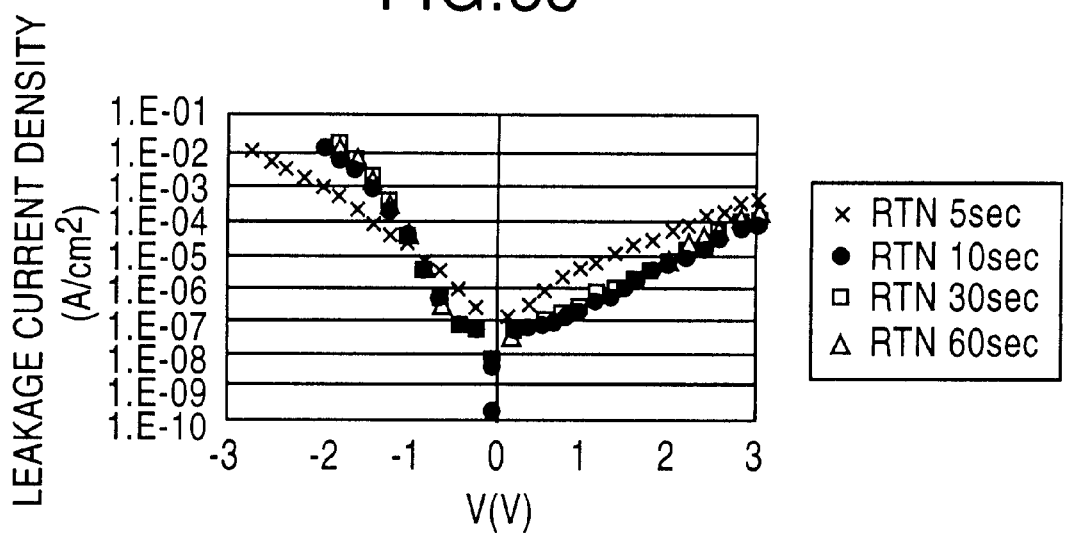
FIG. 35 is another diagram showing the leakage current of the high-dielectric capacitor of the ninth embodiment.
Figure 36:
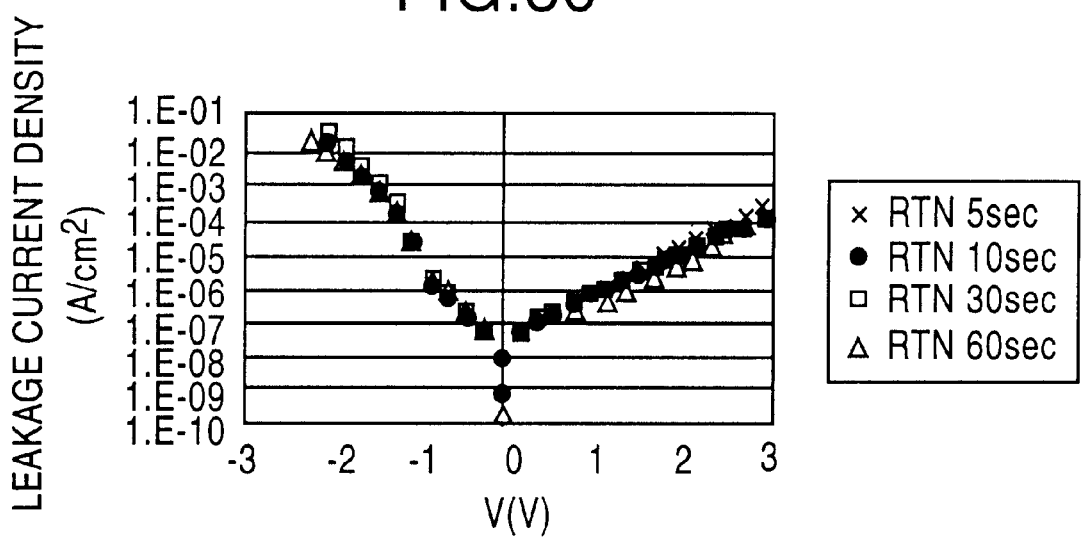
FIG. 36 is a further diagram showing the leakage current of the high-dielectric capacitor of the ninth embodiment.
Figure 37:
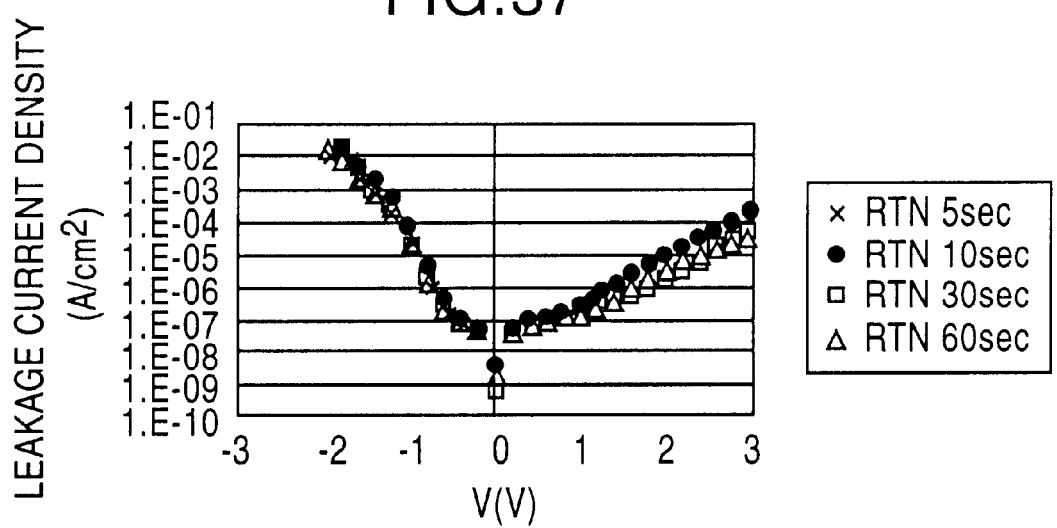
FIG. 37 is a further diagram showing the leakage current of the high-dielectric capacitor of the ninth embodiment.

FIGS. 35–37 show the leakage current of the high-dielectric capacitor of the present embodiment in which the duration of the crystallization step 23 is changed variously. In the experiment of FIGS. 37–37, the BST film 185 was formed to have the thickness of 30 nm. In FIG. 35, it should be noted that the duration of the oxidizing process of the step 24 is set to 10 minutes, while in FIG. 36, the duration of the oxidizing process of the step 24 is set to 20 minutes. Further, in FIG. 37, the duration of the step 24 is set to 30 minutes.

Referring to FIGS. 35–37, it can be seen that the leakage current characteristic is more or less similar irrespective of the duration of the step 23 or step 24 except for one case in which the duration of the step 23 is set to 5 seconds and the duration of the step 24 is set to 10 minutes as represented by x in FIG. 35. Particularly, the specimen that has gone through the crystallization process of 30 seconds and the oxidizing process of 30 minutes provides the best result.

While not illustrated, it should be noted that the leakage current tends to increase in the specimen in which the crystallization process of the step 23 is conducted for the duration of more than 90 seconds and in which the oxidizing process of the step 24 is conducted for the duration of 60 minutes.

Figure 38:
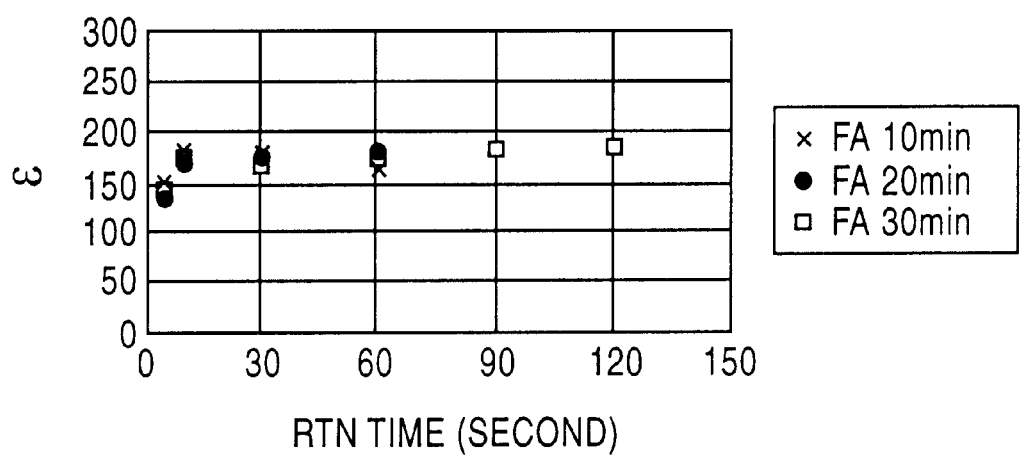
FIG. 38 is a diagram showing the relative dielectric constant of the high-dielectric capacitor of the ninth embodiment.

FIG. 38 shows the relative dielectric constant of the BST film 185 for the case in which the duration of the crystallization step 23 is changed variously.

Referring to FIG. 38, it can be seen that a generally uniform relative dielectric constant is achieved except for the specimen in which the duration of the crystallization process of the step 23 is set to 5 seconds. Further, it can be seen that the duration of the oxidizing process of the step 24 does not influence substantially on the dielectric constant substantially. It is believed that the crystallization of the BST film is not sufficient in the specimen in which the duration of the crystallization is set to 5 seconds.

[Ninth Embodiment]

Next, the fabrication process of a high-dielectric capacitor according to a ninth embodiment of the present invention will be described with reference to FIG. 39.

The high-dielectric capacitor of the present embodiment has a structure substantially identical with that of the high-dielectric capacitor of FIG. 20 and further description thereof will be omitted.

Figure 39:
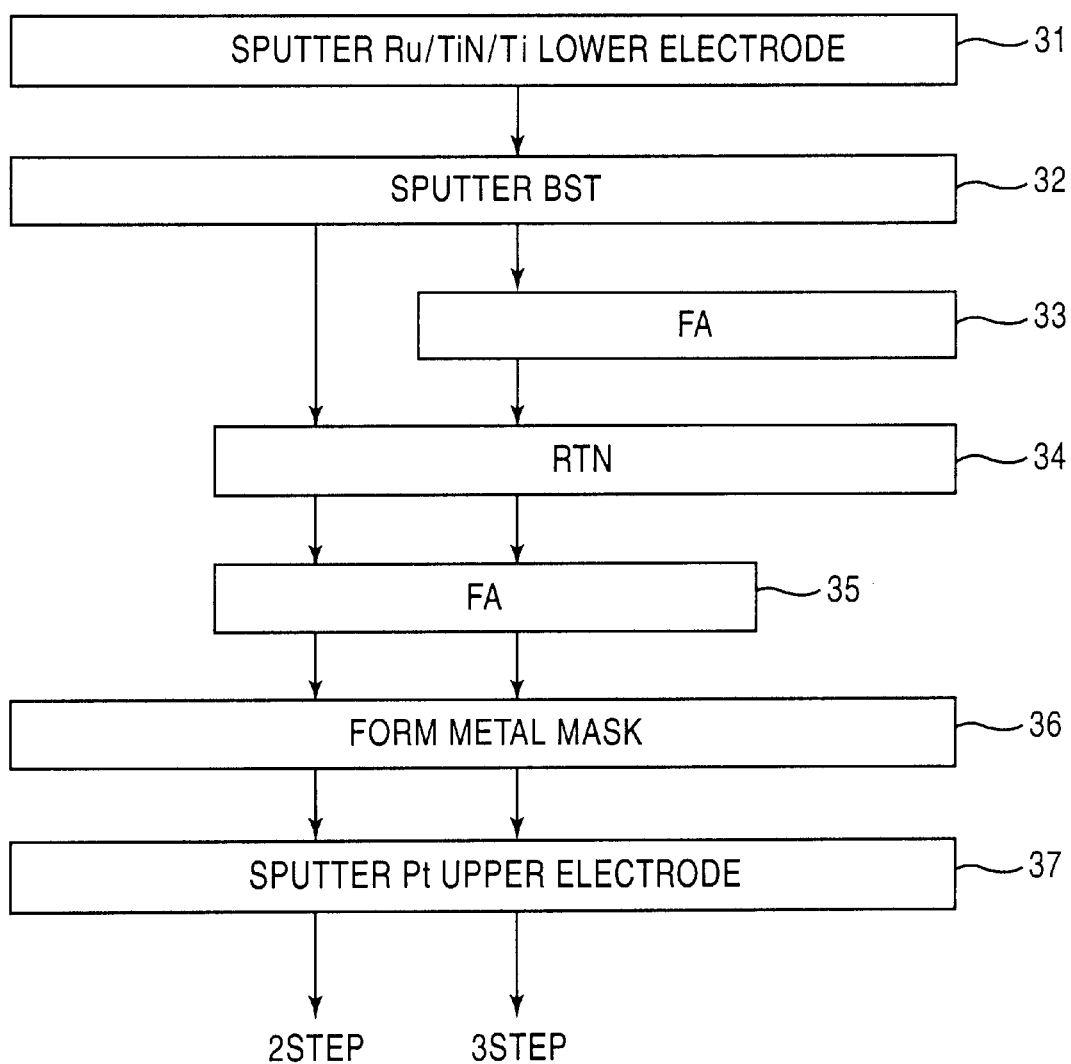
FIG. 39 is a diagram showing the fabrication process of a high-dielectric capacitor according to a tenth embodiment of the present invention.

Referring to FIG. 39, the fabrication process starts with the step 31 in which the Ti adhesion layer 182, the TiN diffusion barrier layer 183 and the lower electrode 184 of Ru are deposited consecutively on the Si substrate 181 by a D.C. sputtering process conducted at the substrate temperature of 300° C. with respective thicknesses of 20 nm, 50 nm and 500 nm. Further, in the step 32, the BST film 185 is formed on the Ru lower electrode 184 with a thickness of about 30 nm by a R.F. sputtering process conducted at the substrate temperature of 400° C.

Next, in the step 33, the structure thus obtained is introduced into a quartz tube of the diffusion furnace and is held at 400° C. in the 100%-oxygen atmosphere of the normal pressure for 30 minutes. By conducting the step 33, any oxygen deficiency caused in the BST film 185 as a result of the deposition process of the step 32 is compensated. During the step 33, the substrate temperature is chosen such that there occurs no substantial oxidation in the lower electrode 184 of Ru.

Next, in the step 34, the specimen that went through the step 33 is subjected to a rapid thermal annealing process conducted in an inert atmosphere such as $N_2$ atmosphere (RTN process) at about 600° C. by increasing the temperature with a rate of 100° C./min. By holding the temperature at 600° C. for 60 seconds, there is induced a crystallization in the BST film 185.

After the crystallization process, the specimen is returned to the quartz tube of the diffusion furnace in the step 35 and is subjected to the 100%-oxygen atmosphere at 400° C for 30 minutes. As a result of the step 35, the deficiency of oxygen induced in the BST film 185 is compensated. Thereby, it should be noted that the temperature of the oxidizing process of the step 35 is chosen such that there occurs no substantial oxidation in the lower electrode 184.

After the step 35, a metal mask having an aperture of 0.1 mm radius is provided on the BST film 185 in the step 36 of FIG. 39, and the upper electrode 186 of Pt is deposited on the metal mask in the step 37 so as to make a contact with the BST film 185 at the foregoing aperture.

Figure 40:
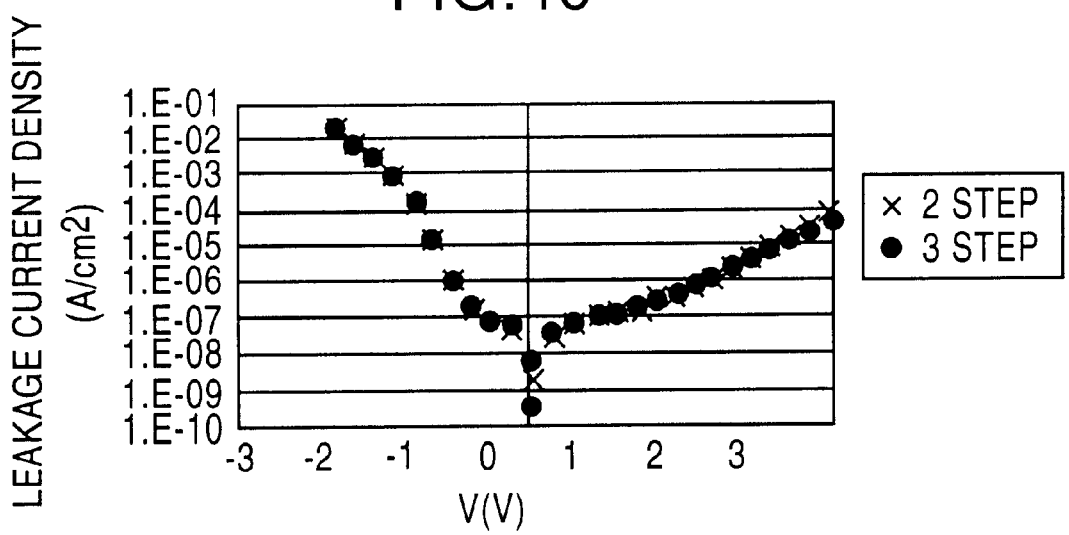
FIG. 40 is a diagram showing the leakage current of the high-dielectric capacitor of the tenth embodiment.

FIG. 40 shows the leakage current of the high-dielectric capacitor of the present embodiment fabricated according to the steps 31–37 of FIG. 39 (represented by solid circles and designated as "3step"), in comparison with the leakage current of the high-dielectric capacitor in which the step 33 is skipped (represented by the cross marks and designated as "step"). Thus, the capacitor represented in FIG. 40 as "2step" corresponds to the high-dielectric capacitor of the previous embodiment fabricated according to the process of FIG. 33.

Referring to FIG. 40, it will be noted that the high-dielectric capacitor of the "3step" of the present embodiment has the leakage current characteristic substantially identical with that of the high-dielectric capacitor of the "2step" in which the oxidizing step 33 prior to the crystallizing step 34 is skipped.

Figure 41:
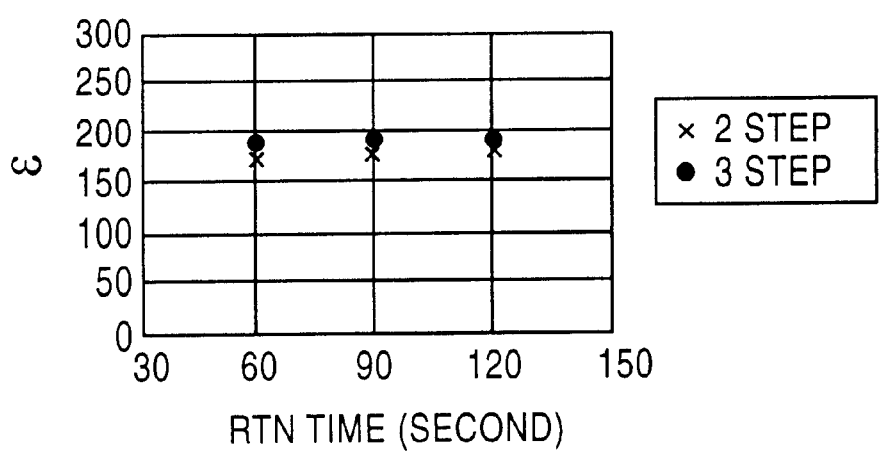
FIG. 41 is a diagram showing the relative dielectric constant of the high-dielectric capacitor of the tenth embodiment.

FIG. 41 shows the relative dielectric constant of the BST film 185 in the high-dielectric capacitor of the present embodiment ("3step") fabricated according to the steps 31–37 of FIG. 39 in comparison with the relative dielectric constant of the BST film 185 of the high-dielectric capacitor ("2step") in which the step 33 is skipped.

Referring to FIG. 41, it will be noted that the value of the relative dielectric constant of the BST film 185 has increased by 5–10% in the case of the present embodiment ("3step") as compared with the case of the previous embodiment ("2step").

The result of FIG. 41 indicates that the oxidizing process of the step 33 conducted in advance of the crystallization step 34 is, while not very effective for suppressing the leakage current, effective for increasing the relative dielectric constant.

[Tenth Embodiment]

Next, the fabrication process of the high-dielectric capacitor according to the tenth embodiment of the present invention will be described with reference to FIG. 42.

Figure 42:
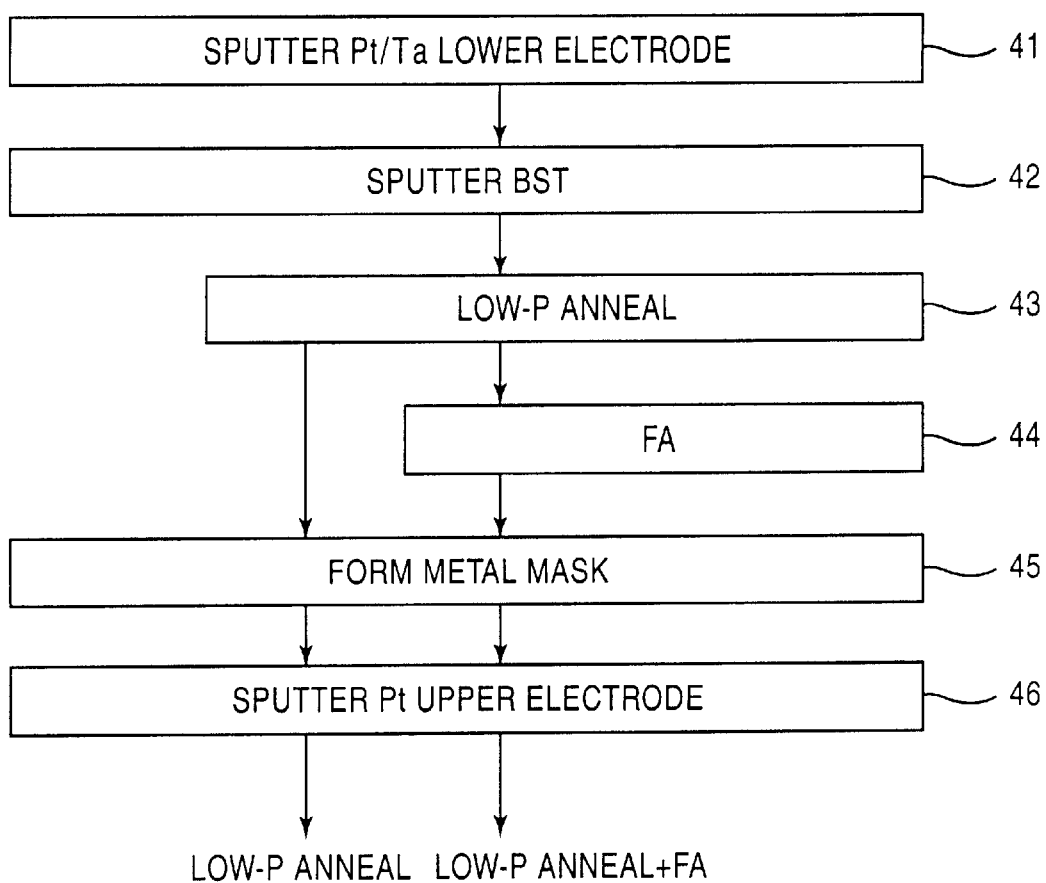
FIG. 42 is a diagram showing the fabrication process of a high-dielectric capacitor according to an eleventh embodiment of the present invention.

The high-dielectric capacitor of the present embodiment has a structure substantially identical with that of the high-dielectric capacitor of FIG. 20 and is fabricated according to the process of FIG. 42 which is similar to the process of FIG. 21.

Referring to FIG. 42, the fabrication process starts with the step 41 in which the Ti adhesion layer 182, the TiN diffusion barrier layer 183 and the lower electrode 184 of Ru are deposited consecutively on the Si substrate 181 by a sputtering process conducted at the substrate temperature of 300° C. with respective thicknesses of 20 nm, 50 nm and 500 nm.

Next, in the step 42, the BST film 185 is deposited on the lower electrode 184 of Ru by a RF sputtering process with a thickness of about 30 nm, wherein the sputtering process is conducted at the substrate temperature of 400° C.

Next, in the step 43, the BST film 185 deposited in the step 42 is subjected to a crystallization process in an $N_2$ atmosphere, wherein the crystallization is conducted under a reduced pressure of 0.5 Torr at 400° C. for 30 minutes.

After the crystallization process in the step 43, a step 44 is conducted in which the specimen that went through the step 43 is introduced into a quartz tube of a diffusion furnace, wherein the specimen is exposed to the 100%-oxygen atmosphere of ordinary pressure at 400° C. for 30 minutes. As a result of the oxidizing process of the step 44, the oxygen deficiency in the BST film 185 is effectively compensated. In the oxidizing process of the step 44, it should be noted that the temperature is chosen so that no substantial oxidation occurs in the lower electrode 184.

After the oxidizing process of the step 44, a metal mask having an aperture of 0.1 mm radius is provided on the BST film 185, and the Pt electrode 186 is formed on the metal mask so as to make a contact with the BST film 185 at the aperture.

Figure 43:
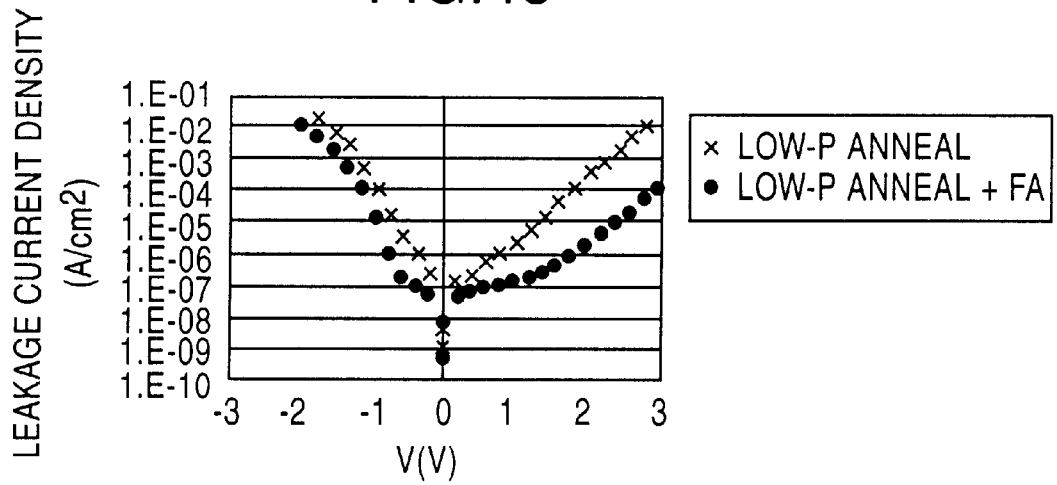
FIG. 43 is a diagram showing the leakage current of the high-dielectric capacitor of the eleventh embodiment.

FIG. 43 shows the leakage current observed for the high-dielectric capacitor of the present embodiment fabricated according to the steps 41–46 of FIG. 42 in comparison with the leakage current of the high-dielectric capacitor in which the step 44 of FIG. 42 is skipped, wherein FIG. 43 represents the leakage current of the present embodiment by the solid circles and the leakage current of the capacitor that skipped the step 44 by the cross marks.

Figure 44:
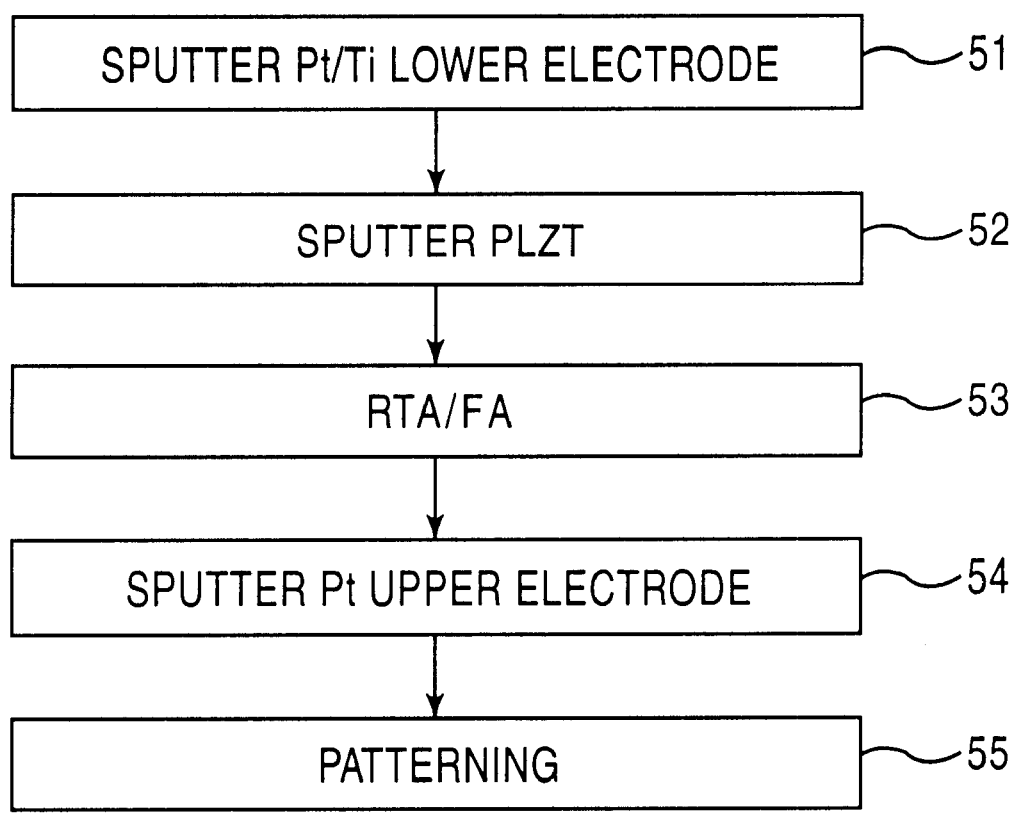
FIG. 44 is a diagram showing the fabrication process of a ferroelectric capacitor according to a twelfth embodiment of the present invention.

Referring to FIG. 43, it can be seen that the leakage current of the capacitor is suppressed effectively also in the case the BST film 185 is crystallized under the reduced pressure condition, by conducting the oxidizing step of FIG. 44 at the temperature chosen such that there occurs no substantial oxidation in the lower electrode 184 of Ru. Further, it was confirmed that a relative dielectric constant of about 200 is secured for the BST film 185 also in the case the step 44 is omitted.

In any of the foregoing embodiments of the high-dielectric capacitor, it should be noted that the lower electrode 184 is not limited to Pt or Ru but other metals such as Ir may also be used. Further, the lower electrode 184 may be formed of conductive oxides or nitrides such as $IrO_2$, $RuO_2$,m $SrRuO_3$ or WN. Similarly, the upper electrode 186 is not limited to Pt but may be selected from any of Ru, Ir, $IrO_2$, $RuO_2$, $SrRuO_3$, WN, or TiN. Further, the high-dielectric film 185 is not limited to BST but may be formed of $Ta_2O_3$, STO. Further, it is also possible to use PZT, PLZT or SBT.

[Eleventh Embodiment]

Next, the fabrication process of a ferroelectric capacitor according to an eleventh embodiment will be described with reference to FIG. 44.

The ferroelectric capacitor of the present embodiment has a structure substantially identical with the ferroelectric capacitor explained with reference to FIGS. 3A and 3B.

Referring to FIG. 44, the fabrication process starts with the step 51 in which the lower electrode 33 of the Pt/Ti structure is formed on the $SiO_2$ film 32 covering the Si substrate 31 under the condition of TABLE VI. Further, the PLZT film 34 is formed on the lower electrode 33 in the step 52 under the condition represented in TABLE 8.

Figure 45:
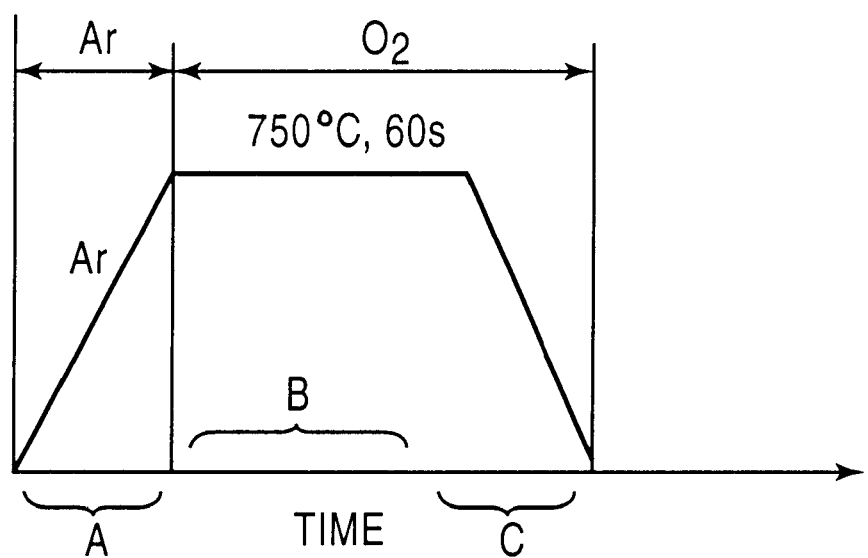
FIG. 45 is a diagram showing the temperature control program used in the twelfth embodiment.

Further, in the step 53, the PLZT film 34 is subjected to a thermal annealing process represented in FIG. 45.

More specifically, the thermal annealing process of FIG. 45 includes a first phase A for rapidly increasing the temperature of the PLZT film 34 in an Ar atmosphere to 750° C., a second phase B for switching the atmosphere to an oxidizing atmosphere while holding the temperature at 750° C. for 60 seconds. Further, in the third phase C, the temperature is lowered to the room temperature. In the phase A, the temperature may be raised with a rate of 100° C./min or more.

In the thermal annealing process of FIG. 45, it should be noted that the lower electrode 33 experiences substantially no oxidation in the first phase A, as the first phase A is conducted in the inert atmosphere. Further, because of the high temperature of 750° C., the upper electrode 33 undergoes recrystallization and associated densification of the texture. Thus, even when the atmosphere is switched to the oxidizing atmosphere, there occurs no substantial oxidation in the lower electrode 33.

Figure 46A:
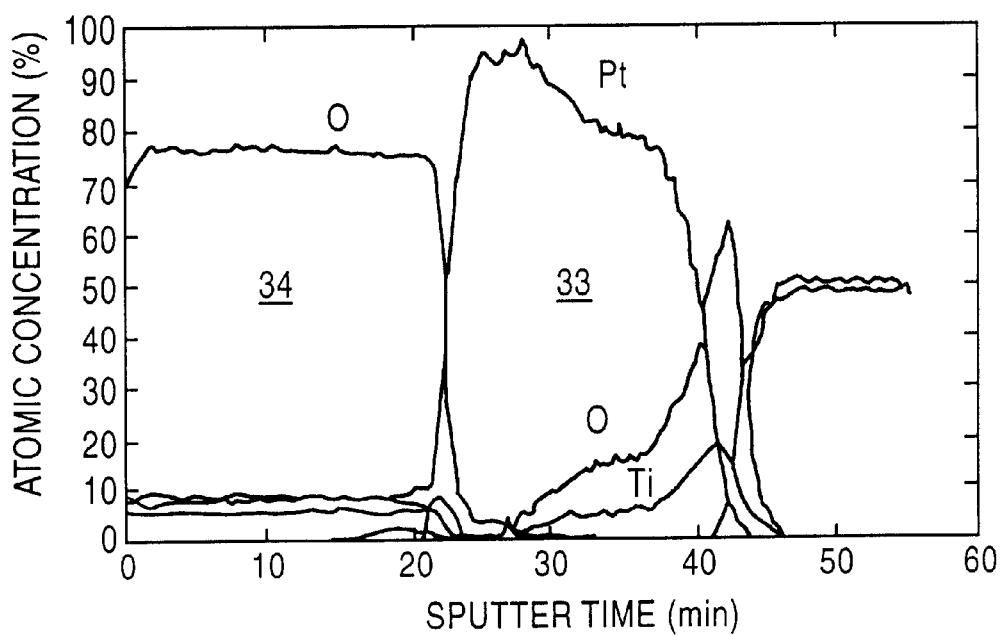
FIGS. 46A and 46B are diagrams respectively showing the distribution of elements in a ferromagnetic capacitor fabricated according to a conventional process and the distribution of elements in the ferromagnetic capacitor fabricated according to the twelfth embodiment.
Figure 46B:
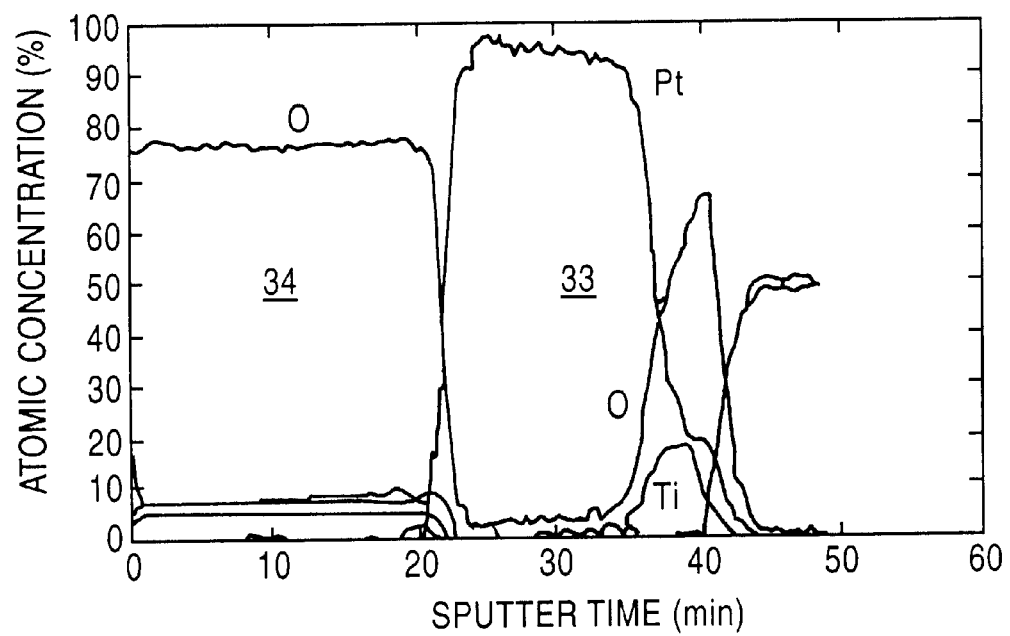

FIGS. 46A and 46B show the distribution of the oxygen atoms in the lower electrode 33 obtained by the Auger spectroscopy for the case in which the inert atmosphere and oxidizing atmosphere are switched. It should be noted that FIG. 46A shows the result in which the entire process of FIG. 45 is conducted in the oxidizing atmosphere, while FIG. 46B shows the result in which the atmosphere is switched from the inert atmosphere to oxidizing atmosphere as represented in FIG. 45.

Referring to FIGS. 46A and 46B, it can be seen that the lower electrode 33 of FIG. 46A contains a substantial amount of oxygen and Ti, while in the lower electrode 33 of FIG. 46B, the amount of oxygen 1 and Ti is reduced substantially. The result of FIGS. 46A and 46B suggests that there occurred a substantial densification in the lower electrode 33 as a result of the first phase thermal annealing of FIG. 45 which is conducted in the inert atmosphere.

Returning back to FIG. 44, the upper Pt electrode 35 is formed, after the step 53 for forming the PLZT film 34, on the PLZT film 34 in the step 54 by conducting a sputtering process conducted in an oxidizing atmosphere under the condition represented in TABLE VIII. Further, the upper electrode 35 of Pt and the PLZT film 34 are patterned by a plasma etching process conducted under the condition of TABLE IX, and the ferroelectric capacitor having the structure of FIG. 3B is obtained.

Figure 47A:
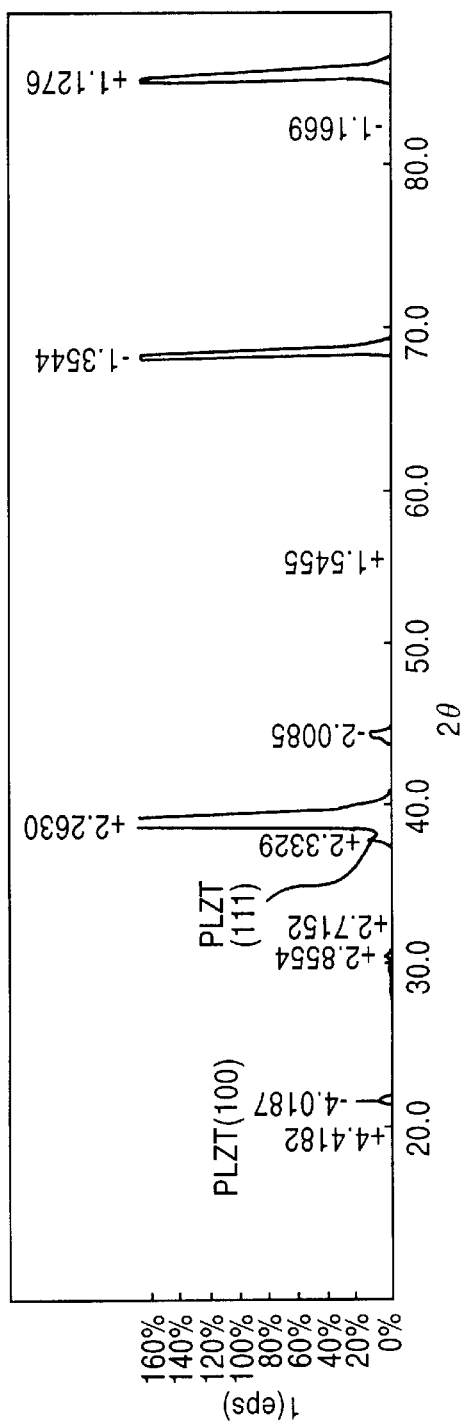
FIGS. 47A and 47B are diagrams respectively showing the X-ray diffraction chart of the ferroelectric film in the ferroelectric capacitor formed according to the conventional process and the X-ray diffraction chart of the ferroelectric film in the ferroelectric capacitor of the present embodiment.
Figure 47B:
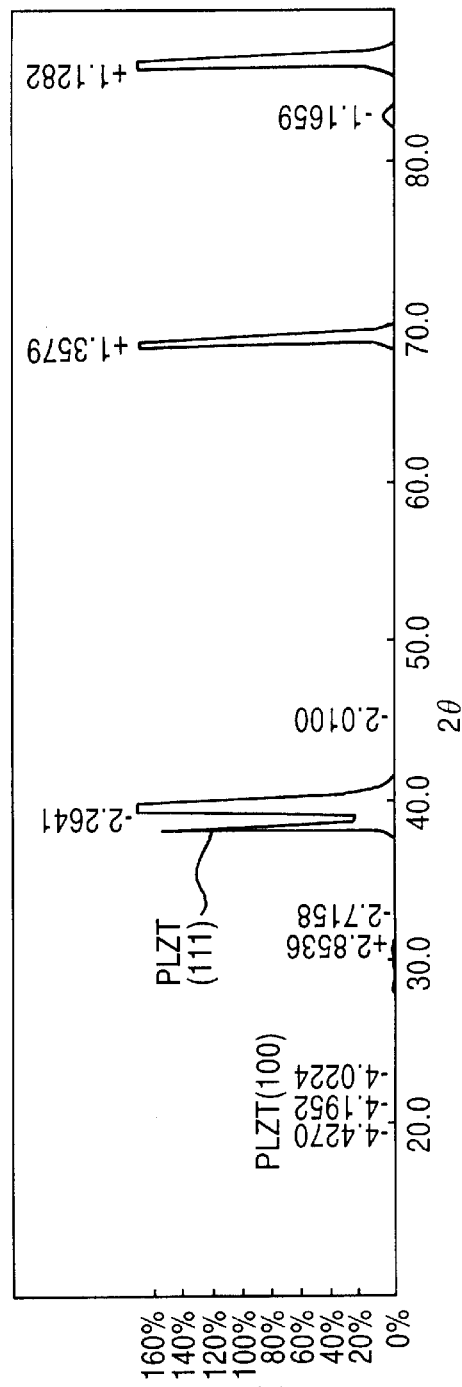

FIGS. 47A and 47B show the X-ray diffraction patterns of the PLZT film respectively for the case in which the phase A and phase B of FIG. 45 are conducted in the oxidizing atmosphere and for the case in which the phase A is conducted in the inert atmosphere and the phase B is conducted in the oxidizing atmosphere.

Referring to FIG. 47A, it will be noted that the peak height of the diffraction from the (111) surface of PLZT is low as compared with the peak height of the diffraction from the (100) surface of PLZT, indicating that the majority of the crystal grains in the PLZT film 34 are aligned in the <100> direction. In the case of FIG. 47B, on the other hand, the height of the (111) peak becomes much larger that the (100) peak, indicating that the majority of the crystal grains in the PLZT film 34 are aligned in the <111> direction. Thereby, the value of the spontaneous polarization 2Pr of the film 34 is maximized.

In the present embodiment, it should be noted that the ferroelectric film 134 is not limited to PLZT but the ferroelectric film 134 may be formed of any ferroelectric or high-dielectric material having the perovskite structure. Further, the lower electrode is by no means limited to the Pt film deposited on the Ti film but may be formed of a refractory metal such as Ru or Ir, or a conductive oxide such as $RuO_2$ or $IrO_2$.

Further, the present invention is not limited to the embodiments described heretofore, but various variations and modifications may be made without departing from the scope of the invention.

What is claimed is:

1. A method of fabricating a semiconductor device having a capacitor, comprising the steps of:

forming a lower electrode;

depositing a high-dielectric film on said lower electrode;

crystallizing said high-dielectric film by applying thereto a thermal annealing process in an inert atmosphere;

applying, after said step of crystallizing, a thermal annealing process to said high-dielectric film in an oxidizing atmosphere; and forming, after said step of applying said thermal annealing process in said oxidizing atmosphere, an upper electrode on said dielectric film, wherein said thermal annealing process in said oxidizing atmosphere is conducted at a temperature set so that no substantial oxidation occurs in said lower electrode;

further including a step, before said step of crystallizing said high-dielectric film, of annealing said high-dielectric film in an oxidizing atmosphere at a temperature set such that no substantial oxidation occurs in said lower electrode.

2. A method as claimed in claim 1, wherein said high-dielectric film is selected from the group consisting of $(Ba,Sr)TiO_3$, $Ta_2O_5$, $SrTiO_3$, $(Pb,Zr)TiO_3$ and $(Pb,Zr)(Ti,La)O_3$.

3. A method as claimed in claim 1, wherein said lower electrode is selected from the group consisting of Pt, Ru, Ir, $IrO_2$, $RuO_2$, $SrRuO_3$ and WN.

4. A method of fabricating a capacitor, comprising the steps of:

forming a lower electrode;

depositing a dielectric film having a perovskite structure on said lower electrode;

raising the temperature of said dielectric film to a thermal annealing temperature while holding said dielectric film in an inert atmosphere;

changing, after said thermal annealing temperature is reached, the atmosphere of said dielectric film from said inert atmosphere to an oxidizing atmosphere while holding said dielectric film at said thermal annealing temperature;

annealing, after said step of changing the atmosphere, said dielectric film in said oxidizing atmosphere while holding said dielectric film at said thermal annealing temperature; and forming, after said annealing step in said oxidizing atmosphere, an upper electrode on said dielectric film.

* * * * *